United States Patent
Ryu et al.

(10) Patent No.: US 9,839,145 B2
(45) Date of Patent: Dec. 5, 2017

(54) DISPLAY DEVICE

(71) Applicant: LG ELECTRONICS INC., Seoul (KR)

(72) Inventors: Hyunjong Ryu, Seoul (KR); Kitae Kang, Seoul (KR); Jaehyun Sung, Seoul (KR); Sangdon Park, Seoul (KR); Jinha Heo, Seoul (KR); Sungjin Eun, Seoul (KR); Inkeun Ryu, Seoul (KR); Donghyok Shin, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 15/037,823

(22) PCT Filed: Jan. 20, 2015

(86) PCT No.: PCT/KR2015/000554
§ 371 (c)(1),
(2) Date: May 19, 2016

(87) PCT Pub. No.: WO2015/111890
PCT Pub. Date: Jul. 30, 2015

(65) Prior Publication Data
US 2016/0295711 A1    Oct. 6, 2016

(30) Foreign Application Priority Data

Jan. 24, 2014  (KR) .................. 10-2014-0009115
Sep. 17, 2014  (KR) .................. 10-2014-0123812
(Continued)

(51) Int. Cl.
*H05K 7/00* (2006.01)
*H05K 5/00* (2006.01)
(Continued)

(52) U.S. Cl.
CPC .......... *H05K 5/0017* (2013.01); *G09F 9/301* (2013.01); *G09F 9/33* (2013.01); *H01L 51/5237* (2013.01);
(Continued)

(58) Field of Classification Search
CPC ...... H05K 5/0017; H05K 5/0217; H05K 5/03; H02K 7/116; H01L 2251/5338; G09F 9/301; G09F 9/33
(Continued)

(56) References Cited

U.S. PATENT DOCUMENTS 9,576,510 B2 *  2/2017  Ren .................. G09F 9/301
2013/0037228 A1  2/2013  Verschoor et al.
(Continued)

FOREIGN PATENT DOCUMENTS

KR   10-2013-0070423 A    6/2013
KR   10-2013-0092868 A    8/2013
KR   10-2013-0138614 A   12/2013

OTHER PUBLICATIONS

International Search Report dated Apr. 7, 2015 issued in Application No. PCT/KR2015/000554.

*Primary Examiner* — Hung S Bui
(74) *Attorney, Agent, or Firm* — KED & Associates, LLP

(57) ABSTRACT

A display device is disclosed. The display device according to the present invention includes a display panel, a module cover coupled to the rear side of the display panel, and a housing coupled to the rear side of the module cover, wherein the housing comprises a driving unit configured to push at least part of the module cover such that the display panel is in at least one of a first state in which the display panel is flat and a second state in which the display panel is curved, wherein the driving unit comprises a motor assembly, at least one link having one side coupled to the motor
(Continued)

assembly and the other side coupled to the module cover, and a guide coming into contact with at least one side of the at least one link to enable the at least one link to be pushed up and pulled down according to direction of a driving force transferred from the motor assembly.

12 Claims, 84 Drawing Sheets

(30) Foreign Application Priority Data

Sep. 26, 2014 (KR) .......................... 10-2014-0128864
Oct. 16, 2014 (KR) .......................... 10-2014-0140053

(51) Int. Cl.
*G09F 9/30* (2006.01)
*G09F 9/33* (2006.01)
*H01L 51/52* (2006.01)
*H02K 7/116* (2006.01)
*H05K 5/02* (2006.01)
*H05K 5/03* (2006.01)

(52) U.S. Cl.
CPC ........... *H02K 7/116* (2013.01); *H05K 5/0217* (2013.01); *H05K 5/03* (2013.01); *H01L 2251/5338* (2013.01)

(58) Field of Classification Search
USPC .......................................................... 361/820
See application file for complete search history.

(56) References Cited

U.S. PATENT DOCUMENTS

| 2013/0114193 | A1 | 5/2013 | Joo et al. |
| 2014/0198465 | A1* | 7/2014 | Park ................. H05K 5/0226 361/749 |
| 2015/0043136 | A1* | 2/2015 | Kim ................. G02F 1/133305 361/679.01 |
| 2015/0092361 | A1* | 4/2015 | Cho ................. H02K 7/00 361/749 |

\* cited by examiner (a)

(b)

(a)

(b)

(a)

(b)

(a)

(b)

(a)

(b)

(a)

(b)

(a)

(b)

(a)

(b)

(a)

(b)

(a)

(b)

DISPLAY DEVICE

CROSS-REFERENCE TO RELATED PATENT APPLICATIONS

This application is a U.S. National Stage Application under 35 U.S.C. §371 of PCT Application No. PCT/KR2015/000554, filed Jan. 20, 2015, which claims priority to Korean Patent Application Nos. 10-2014-0009115, filed Jan. 24, 2014, 10-2014-0123812, filed Sep. 17,2014, 10-2014-0128864 filed Sep. 26, 2014 and 10-2014-0140053, filed Oct. 16, 2014 whose entire disclosures are hereby incorporated by reference.

TECHNICAL FIELD

The present invention relates to a display device and, more particularly, to a display device having a display panel which is flexible to have a predetermined curvature.

BACKGROUND ART

With the development of information-oriented society, demand for display devices is increasing. To meet such demands, various types of display devices such as an LCD (Liquid Crystal Display), PDP (Plasma Display Panel), ELD (Electro luminescent Display) and VFD (Vacuum Fluorescent Display) have recently been researched and used.

From among such display devices, display devices using an organic light emitting diode (OLED) can be implemented as ultra-thin displays since the display devices have excellent luminance and viewing angle characteristics and do not require a backlight unit, compared to LCDs.

SUMMARY OF INVENTION

Technical Problem

An object of the present invention is to solve the aforementioned and other problems. Another object of the present invention is to provide a display device having a driving unit which enables a display panel to have a curved surface.

Technical Solution

In an aspect of the present invention, a display device includes: a display panel; a module cover coupled to the rear side of the display panel; and a housing coupled to the rear side of the module cover, wherein the housing comprises a driving unit configured to push at least part of the module cover such that the display panel is in at least one of a first state in which the display panel is flat and a second state in which the display panel is curved, wherein the driving unit includes: a motor assembly; at least one link having one side coupled with the motor assembly and the other side coupled with the module cover; and a guide coming into contact with at least one side of the at least one link to enable the at least one link to be pushed up and pulled down according to direction of a driving force transferred from the motor assembly.

The driving unit may include a lead screw and a screw nut configured to move in a length direction of the lead screw according to rotation of the lead screw.

The link may be rotatably coupled with the screw nut and pushed up according to movement of the screw nut.

The guide may include first to fourth guides, wherein at least one of the first to fourth guides supports the link and guides movement of the link.

At least one of the second and third guides may be provided with at least one groove supporting the link such that the link slides.

At least one of the second and third guides may be coupled with at least one guide rail coupled with the screw nut such that the screw nut moves rectilinearly.

The link includes a protruding part protruded to the side of the link so as to limit a movement distance of the screw nut.

The second state may include a third state in which the left and right sides of the display panel have different curvatures.

The housing may include a plurality of driving units, wherein a height of the elevated link of one of the plurality of driving units differs from a height of the elevated link of another driving unit of the plurality of driving units in the third state.

The driving unit may include a rack gear and a pinion gear for converting rotational motion of the motor assembly into rectilinear motion.

The display device may further include a plurality of bars connected to a shaft of the motor assembly, wherein the link is pushed up when at least one of the plurality of bars is positioned in a first direction with respect to the link, wherein the link is pulled down when at least one of the plurality of bars is positioned in a second direction with respect to the link.

The housing may include multiple driving units, wherein the multiple driving units are separately positioned at both sides of the housing.

The display panel may be an organic light-emitting diode (OLED) panel.

Advantageous Effects

The display device according to the present invention has the following advantages.

According to at least one embodiment of the present invention, the display device includes a driving unit which enables a display panel to have a curved surface so as to improve the level of immersion of a user who views the display device.

Further scope of applicability of the present invention will become apparent from the detailed description given hereinafter. However, it should be understood that the detailed description and specific examples, while indicating preferred embodiments of the invention, are given by illustration only, since various changes and modifications within the spirit and scope of the invention will become apparent to those skilled in the art from the detailed description.

BEST MODE

A display device according to the present invention includes a display panel, a module cover coupled with the rear side of the display panel and a housing coupled with the rear side of the module cover, wherein the housing includes a driver for pushing at least part of the module cover such that the display panel is in at least one of a first state in which the display panel is flat and a second state in which the display panel is curved, wherein the driver includes a motor assembly, at least one link, one side of which is coupled to the motor assembly and the other side of which is coupled to the module cover, and a guide for pushing up and pulling down the at least one link in the direction of a driving force received from the motor assembly by coming into contact with at least one side of the at least one link.

Mode for Invention

Description will now be given in detail according to exemplary embodiments disclosed herein, with reference to the accompanying drawings. For the sake of brief description with reference to the drawings, the same or equivalent components may be provided with the same reference numbers, and description thereof will not be repeated. In general, suffixes such as "module" and "unit" may be used to refer to elements or components. Use of such a suffix herein is merely intended to facilitate description of the specification, and the suffix itself is not intended to have any special meaning or function. In the present disclosure, that which is well known to one of ordinary skill in the relevant art has generally been omitted for the sake of brevity. The accompanying drawings are used to aid in understanding of various technical features and it should be understood that the embodiments presented herein are not limited by the accompanying drawings. As such, the present disclosure should be construed to extend to any alterations, equivalents and substitutes in addition to those which are particularly set out in the accompanying drawings.

FIGS. 1 to 5 illustrate a configuration of a display device according to the present invention.

Figure 1:
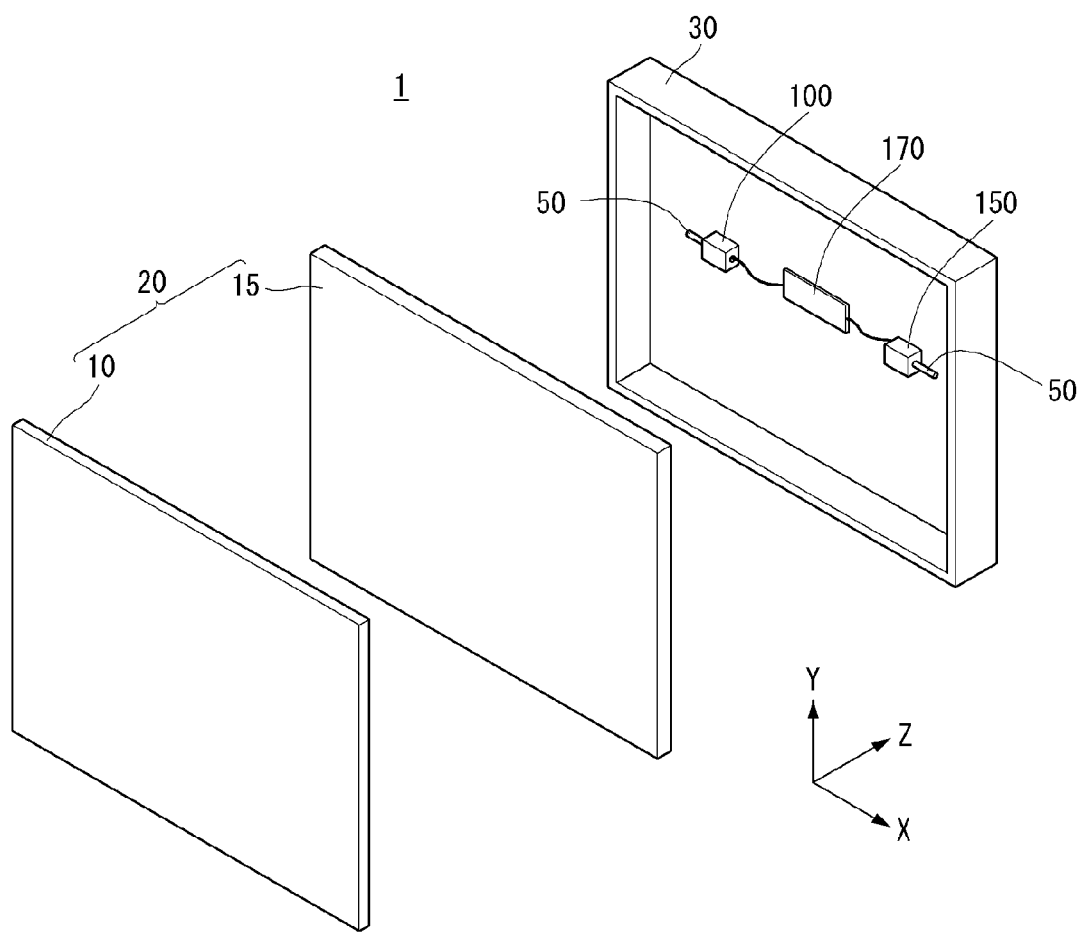
FIGS. 1 to 5 illustrate a configuration of a display device related to the present invention.

Referring to FIG. 1, the display device 1 according to the present invention may include a display unit 20 and a housing 30.

The display unit 20 may include a display panel 10 and a module cover 15. The display panel 10 may be provided to the front side of the display device 1 and display images. The display panel 10 may display an image by dividing the image into a plurality of pixels and controlling each pixel to emit light with color, brightness and saturation controlled per pixel. The display panel 10 may be divided into an active area in which an image is displayed and an inactive area in which no image is displayed.

The display panel 10 may have a rectangular shape. However, the present invention is not limited thereto and the display panel 10 may have corners having a predetermined curvature. The display panel 10 may be an organic light-emitting diode (OLED) panel. However, the present invention is not limited thereto and the display panel 10 may be an LCD panel.

The module cover 15 may be provided to the rear side of the display panel 10. The module cover 15 may be directly attached to the display panel 10 by a bracket 40 (shown in FIG. 21) and a housing fixing part 245 (shown in FIG. 245). The module cover 15 may be equal to or larger than the display panel in size.

The module cover 15 may support the rear side of the display panel 10. Accordingly, the module cover 15 may be made of a light material having high strength.

The housing 30 may be provided to the rear side of the display unit 20. That is, the housing 30 may be provided to the rear side of the module cover 15. The housing 30 may convert external power into power for driving the display panel 10. The housing 30 may generate a video signal for driving the display panel 10. The housing 30 may function as an AV box including a speaker, signal input/output terminals and the like.

The housing 30 may include a driving unit 100 and a PCB 170.

The driving unit 100 may be provided to upper parts of the left and right sides of the housing 30. The driving unit 100 may bend the display unit 20 forward. The driving unit 100 may be set inside of the housing 30.

Links 50 may be provided inside of the driving unit 100. The links 50 may push the display unit 20 to bend the display unit 20 forward. Both sides of the housing 30 may be separated from the display unit 20 when the links 50 are pushed up in the direction of the display unit 20. The links 50 may be exposed to the outside when the housing 30 and the display unit 20 are separated from each other.

The PCB 170 may be provided to the center of the housing 30. The PCB 170 may have a rectangular shape. The PCT 170 may receive a video signal from the outside and transfer the video signal to the display unit 20.

Figure 2:
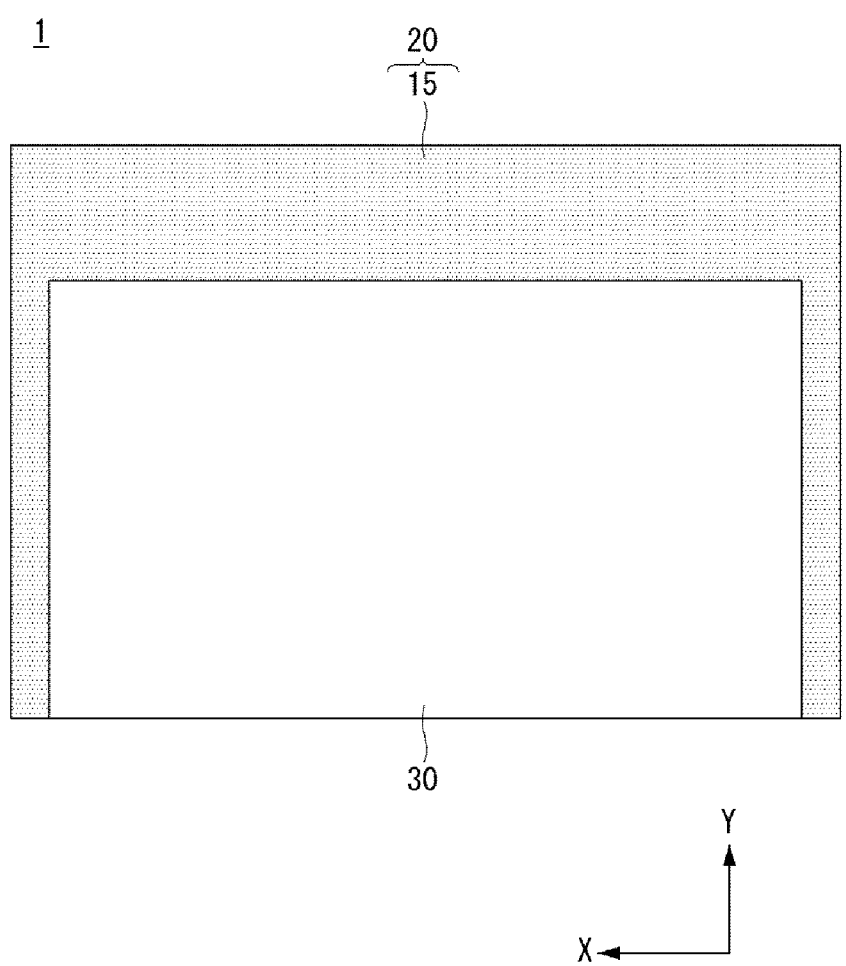

Referring to FIG. 2, the housing 30 may be provided to the rear side of the display unit 20. Specifically, the housing 30 may be provided to the lower part of the rear side of the display unit 20. However, the present invention is not limited thereto and the housing 30 may be provided to the upper part of the rear side of the display unit 20. The housing 30 may be equal to or smaller than the display unit 20 in size.

Figure 3:
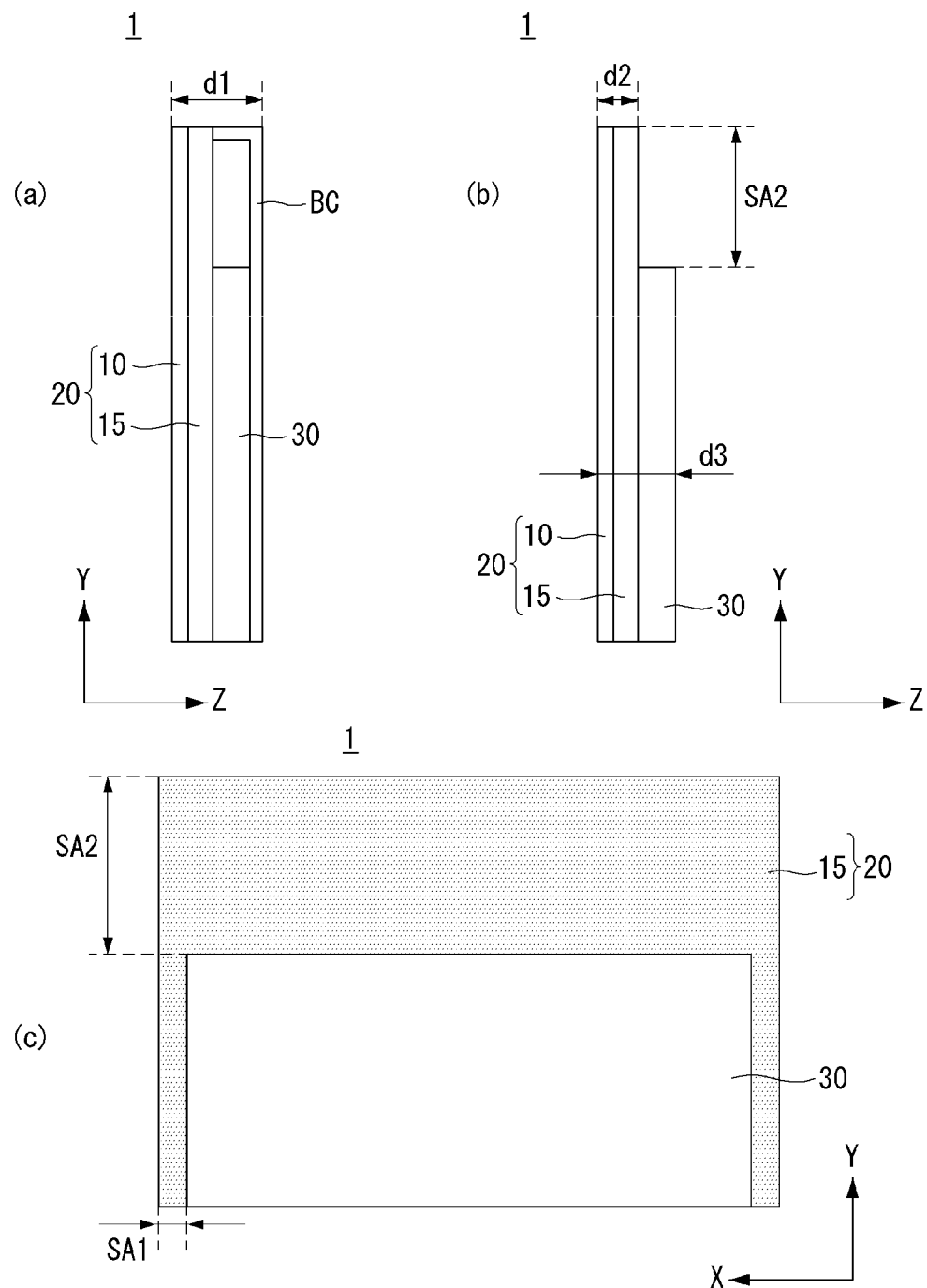

Referring to FIG. 3, a conventional display device 1a may include the housing 30 provided to the lower part of the rear side of the display unit 20 and a back cover BC provided to the rear side of the housing 30 to cover the housing 30. Accordingly, the thickness of the display device 1a may correspond to the sum d1 of the widths of the display unit 20 and the back cover BC in the z-axis direction.

The display device 1 according to the present invention may not include the back cover BC. Accordingly, the thickness of the display device 1 may correspond to the sum d3 of the widths of the display unit 20 and the housing 30 in the z-axis direction. The thickness d3 of the display device 1 may be less than the width dl of the conventional display device 1a.

In the display device 1 according to the present invention, the housing 30 may not cover the entire display unit 20. Specifically, the display unit 20 may be exposed by a first area SA1 in the x-axis direction at both ends and exposed by a second area SA2 in the y-axis direction. Accordingly, users may recognize the width d2 of the display unit 20 in the z-axis direction as the thickness of the display device 1 since the housing 30 is located at the middle of the lower part of the display unit 20. Therefore, the width of the display device 1 according to the present invention can be further reduced.

Figure 4:
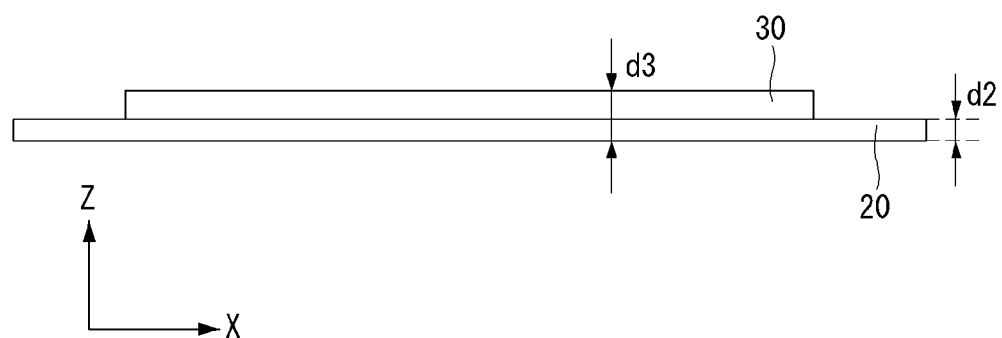
Figure 4:
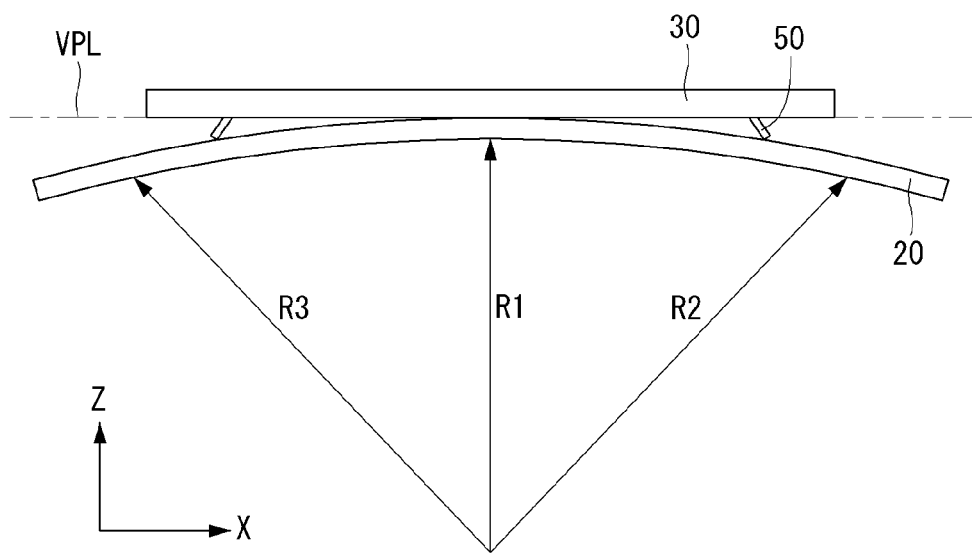

Referring to FIG. 4, the display device 1 according to the present invention may be in a first state in which the display device 1 is flat and in a second state in which the display device 1 is curved.

The display unit 20 may be flat when the display device 1 is in the first state. In other words, the display unit 20 may not have a curvature in the first state. The display unit 20 may come into contact with both sides of the housing 30 in the x-axis direction in the first state. The width d2 of the display unit 20 in the z-axis direction may be remarkably less than the sum d3 of the widths of the display unit 20 and the housing 30 in the z-axis direction. Specifically, the width of the display unit 20 in the z-axis direction may be less than 50% the sum d3 of the widths of the display unit 20 and the housing 30 in the z-axis direction.

The display device 1 may be changed from the first state to the second state as the links 50 are pushed up in the z-axis direction. Specifically, the links 50 of the housing 30 may push both sides of the display unit 20 in the x-axis direction such that both sides of the display unit 20 in the x-axis direction are protruded in the z-axis direction. That is, the display device 1 can be changed from the first state to the second state. The display unit 20 may have a curvature in the second state. The display unit 20 may have a curvature which is not constant according to position. That is, the display unit 20 may have various curvatures R1, R2 and R3 according to positions.

The housing 30 may be aligned with the horizontal line VPL even in the second state. Conversely, the display unit 20 may be curved in reverse of the z-axis direction in the second state. Accordingly, both sides of the housing 30 and the display unit 20 in the x-axis direction can be separated from each other. The links 50 may be exposed to the outside when the housing 30 is separated from the display unit 20.

While the display unit 1 is deformed in the x-axis direction, the display unit 1 may not be deformed or may be slightly deformed in the y-axis direction. Accordingly, the strength of the display unit 1 in the x-axis direction may be lower than the strength in the y-axis direction.

The display device 1 may have various curvatures according to user position P. Therefore, immersion can be enhanced when the user views images displayed on the display device 1.

Figure 5:
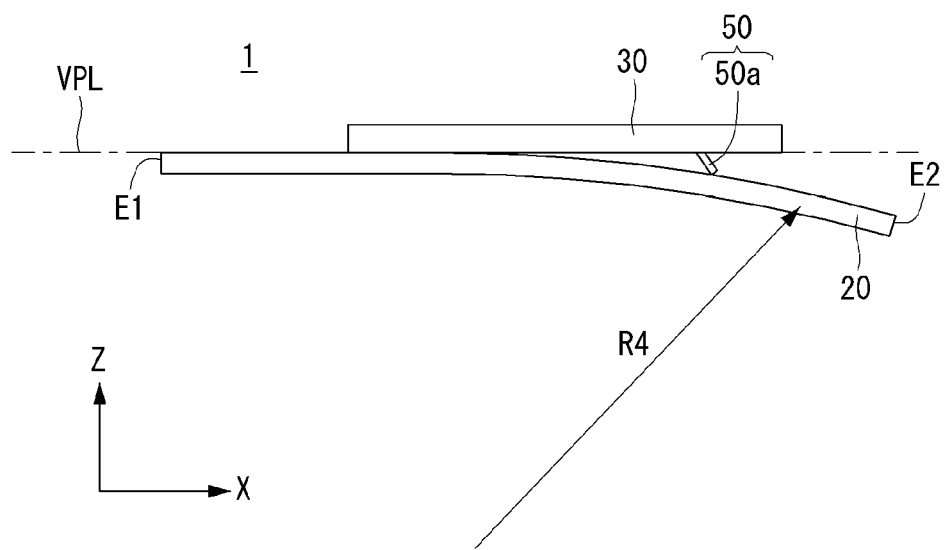
Figure 5:
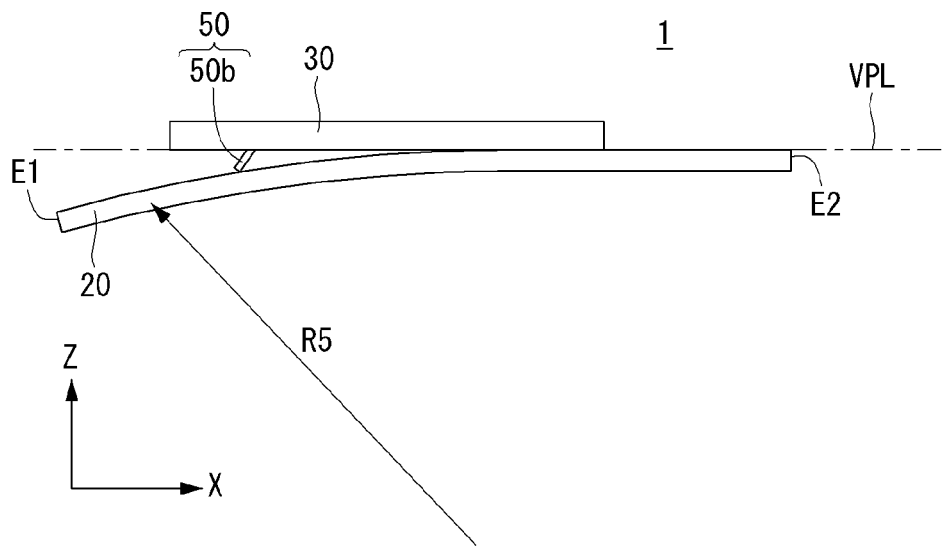

Referring to FIG. 5, in the display device 1 according to the present invention, only a link 50a at one side of the housing 30 may push the display unit 20. That is, the links 50 for pushing the display unit 20 may be pushed up by different heights at both sides of the display unit 20. Accordingly, only one side of the display unit 20 may be curved. The curvature of the display unit 20 may not be constant at both sides of the display unit 20.

In the display device according to the present invention, only a link 50b at the other side of the housing 30 may push the display unit 20. That is, the links 50 for pushing the display unit 20 may be pushed up by different heights at both sides of the display unit 20. Accordingly, only one side of the display unit 20 may be curved. The curvature of the display unit 20 may not be constant at both sides of the display unit 20.

In the display device 1 according to the present invention, curvatures of both sides of the display unit 20 in the x-axis direction may be respectively controlled. Accordingly, the display device 1 can provide a display screen having an optimal curvature per user.

Figure 6:
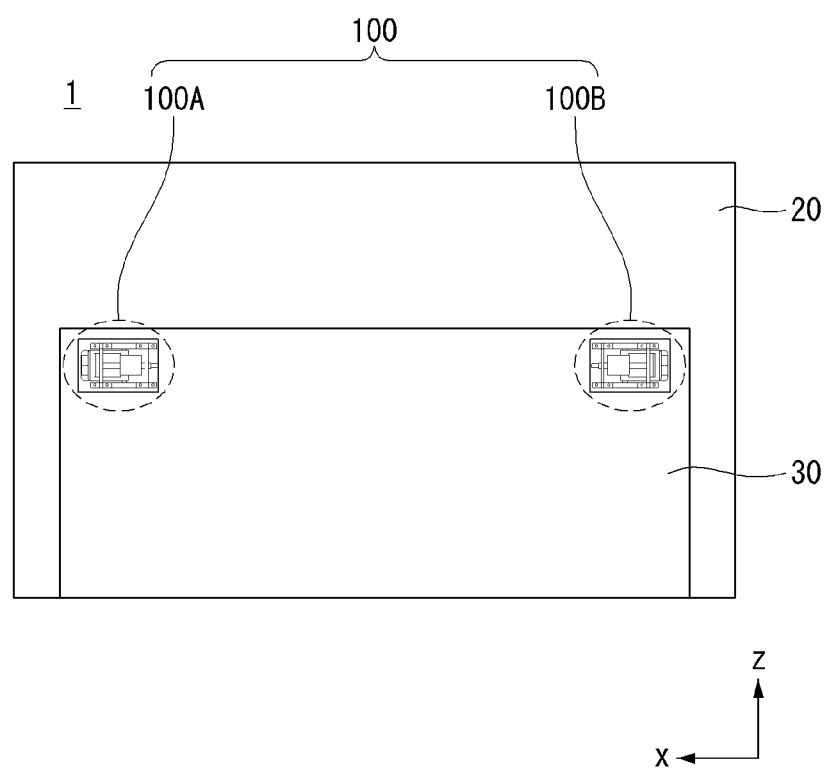
FIGS. 6 and 7 are diagrams for describing a display device according to the present invention in detail.
Figure 7:
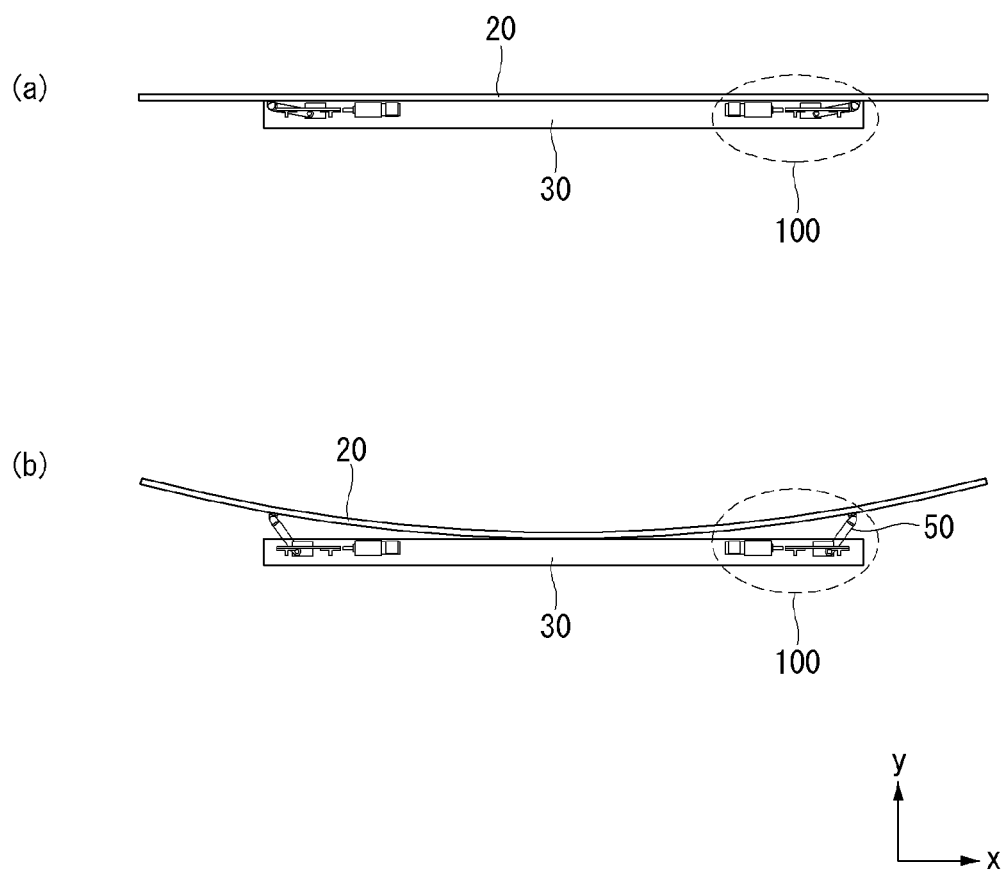

FIGS. 6 and 7 are views for describing the display device according to the present invention in detail.

Referring to FIG. 6, the display device 1 may include the driving unit 100 for bending the display unit 20 forward. The driving unit 100 may be provided to both sides of the upper part of the housing 30. The driving unit 100 may include first and second driving units 100A and 100B. For example, the first and second driving units 100A and 100B can be respectively provided to the left and right sides of the housing 30. The first and second driving units 100A and 100B may be provided to at least one of both sides of the lower part of the housing 30, both sides of the upper part of the housing 30 and the middle part of the housing 30. The driving unit 100 may be arranged inside of the housing 30. The detailed structure of the driving unit 100 will be described later.

Referring to FIG. 7, in the display device 1 according to the present invention, the links 50 provided to the driving unit 100 may be pushed up toward the display unit 20. Accordingly, the links 50 push both sides of the display unit 20 so as to bend the display unit 20. Both sides of the housing may be separated from both sides of the display unit 20 when the links 50 are pushed up toward the display unit 20. The side of the driving unit 100 may be exposed to the outside when both sides of the housing are separated from both sides of the display unit 20. In other words, the links may be exposed to the outside when both sides of the housing 30 and the display unit 20 are separated from each other.

Figure 8:
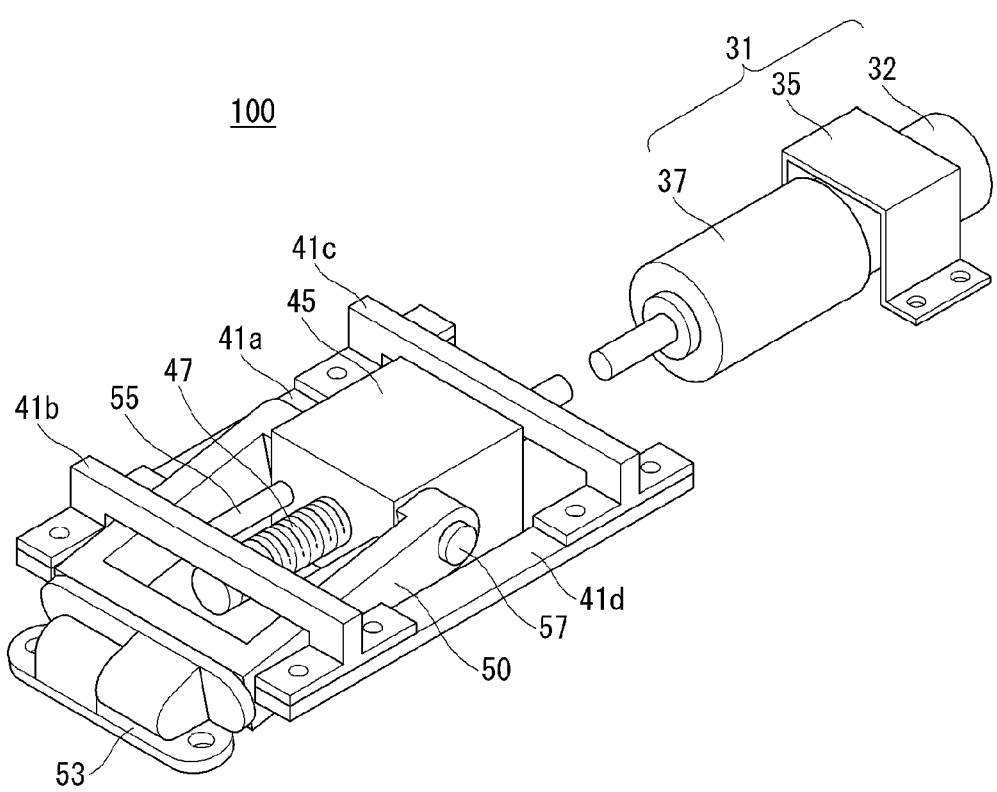
FIGS. 8, 9 and 10 illustrate the display device according to the present invention.
Figure 9:
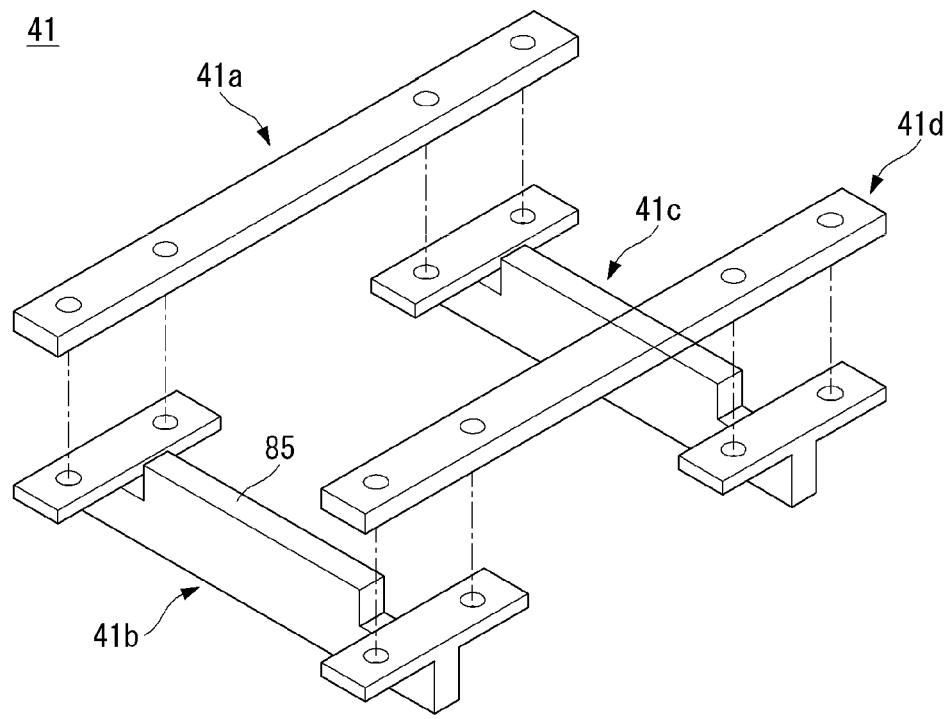
Figure 10:
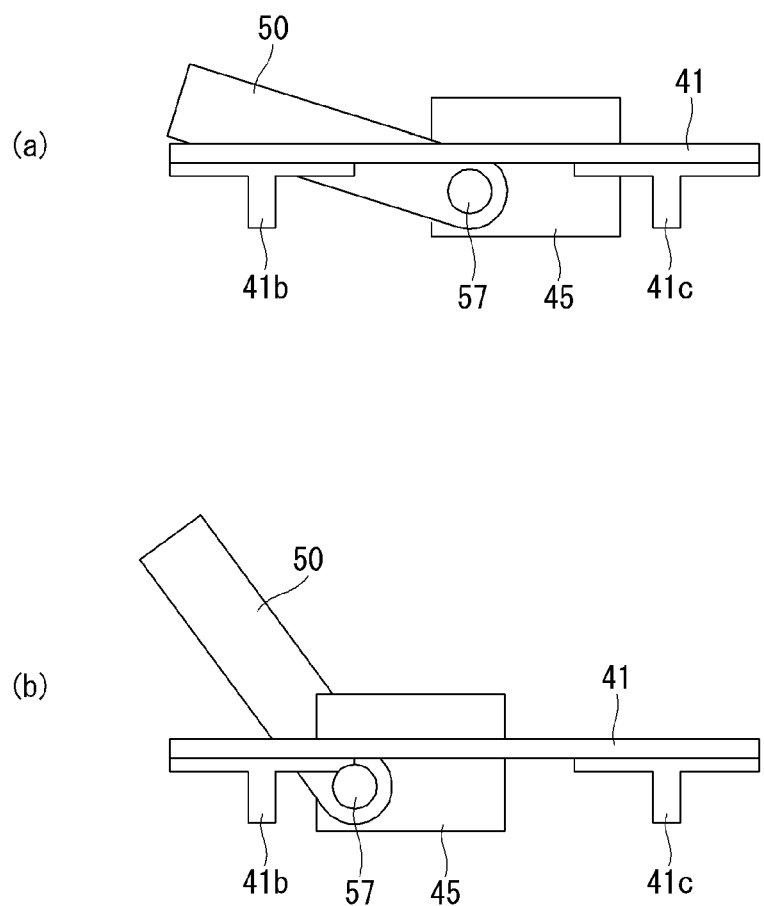

FIGS. 8, 9 and 10 illustrates the display device according to the present invention.

Referring to FIG. 8, the driving unit 100 may include a motor assembly 31, a reducer 37, a lead screw 47, a screw nut 45, the link 50, a guide 41, and a fixing part 53.

The motor assembly 31 may include a first motor 32 and the reducer 37.

The first motor 32 may receive an electrical signal and convert the electrical signal into physical force. The first motor 32 may transfer rotational energy to the reducer 37. The first motor 32 may be fixed to inside of the housing 30 by a supporting part 35. The supporting part 35 may have a shape surrounding the first motor 32.

The reducer 37 may have a shape engaging with the first motor 32. The reducer 37 may transfer rotational energy to the link 50. One end of the reducer 37 may be projected. When the first motor 32 rotates in a first direction, the reducer 37 can rotate with the first motor 32 in the first direction. When the first motor 32 rotates in a second direction, the reducer 37 can rotate with the first motor 32 in the second direction. The reducer 37 can transfer increased rotational energy while reducing rotational speed transferred from the first motor 32.

The lead screw 47 may be connected to the reducer 37. One end of the lead screw 47 may be projected. The projected portion of the lead screw 47 may be coupled with the projected portion of the reducer 37. The lead screw 47 may transfer physical force to the link 50. A guide rail 55 for guiding the orientation of the screw nut 45 may be provided to both sides of the lead screw 47. Both ends of the lead screw 47 may be fixed by the guide 41. Both ends of the guide rail 55 may also be fixed by the guide 41.

The screw nut 45 may have a rectangular shape surrounding the lead screw 47. The screw nut 45 may convert the rotational motion of the lead screw 47 into rectilinear motion. The screw nut 45 may be moved in the x-axis direction according to rotation direction of the lead screw 47. The screw nut 45 may not be moved in directions other than the x-axis direction by the guide rail 55.

The link 50 may have one end coupled with the screw nut 45. The link 50 may be elevated when the first motor 32 rotates in the first direction. Conversely, the link 50 may be pulled down when the first motor 32 rotates in the second direction. The link 50 can be moved in the y-axis direction perpendicular to the x-axis direction as the screw nut 45 is moved in the x-axis direction. The link 50 may have a protruding part 57 at both sides of one end thereof. The other end of the link 50 may be coupled with the fixing part 53. The link 50 may push the display unit 20 through the fixing part 53.

The guide 41 may have a rectangular shape surrounding the screw nut 45, the lead screw 47 and the link 50. The guide 41 may include first to fourth guides 41a to 41d. The first guide 41a and the fourth guide 41d may face each other and the second guide 41b and the third guide 41c may face each other. The first guide 41a and the second guide 41b may be perpendicular to each other.

Referring to FIG. 9, the first and fourth guides 41a and 41d may have a plate shape extended in one direction. The first and fourth guides 41a and 41d may have two holes for coupling with the second and third guides at the extended edges thereof. The second and third guides 41b and 41c may have a plate shape extended in a direction perpendicular to the extended direction of the first and fourth guides 41a and 41d. The second and third guides 41b and 41c may have two holes for coupling with the first and fourth guides 41a and 41d at both sides thereof. The edges of both sides of the second and third guides 41b and 41c may be extended in the direction in which the first and fourth guides 41a and 41d are extended. That is, the direction in which the second and third guides 41b and 41c are extended may be perpendicular to the direction in which the edges of both sides of the second and third guides 41b and 41c are extended.

The second and third guides 41b and 41c may have a groove 85 at the center thereof. The left and right sides of the groove 85 can support the bottom of the link 50. In addition, the groove 85 can fix the link 50 such that the link 50 does not vibrate. Referring to FIG. 10, the groove 85 of the second guide 41b can support the link 50 so as to enable the link 50 to be elevated when the screw nut 45 approaches the second guide 41b in the x-axis direction. The protruding parts 57 at both sides of one end of the link 50 may lie on the first and fourth guides 41a and 41d. The protruding parts 57 may not be moved at portions where the second and third guides 41b and 41c are coupled with the first and fourth guides 41a and 41d. Accordingly, the protruding parts 57 can limit the moving distance of the link 50.

The guide 41 may fasten both ends of the guide rail 55. The guide rail 55 may be coupled to the screw nut 45 such that the screw nut 45 is not moved in directions other than the x-axis direction. Since the second guide 41b supports the bottom of the link 50, the link 50 can be elevated when the screw nut 45 approaches the second guide 41 b. When the screw nut 45 approaches the third guide 41 c, the link 50 can be pulled down.

The fixing part 53 can be coupled to one end of the link 50. The fixing part 53 can be hinge-coupled to the display unit 20. Accordingly, the fixing part 53 can connect the link 50 and the display unit 20.

Figure 11:
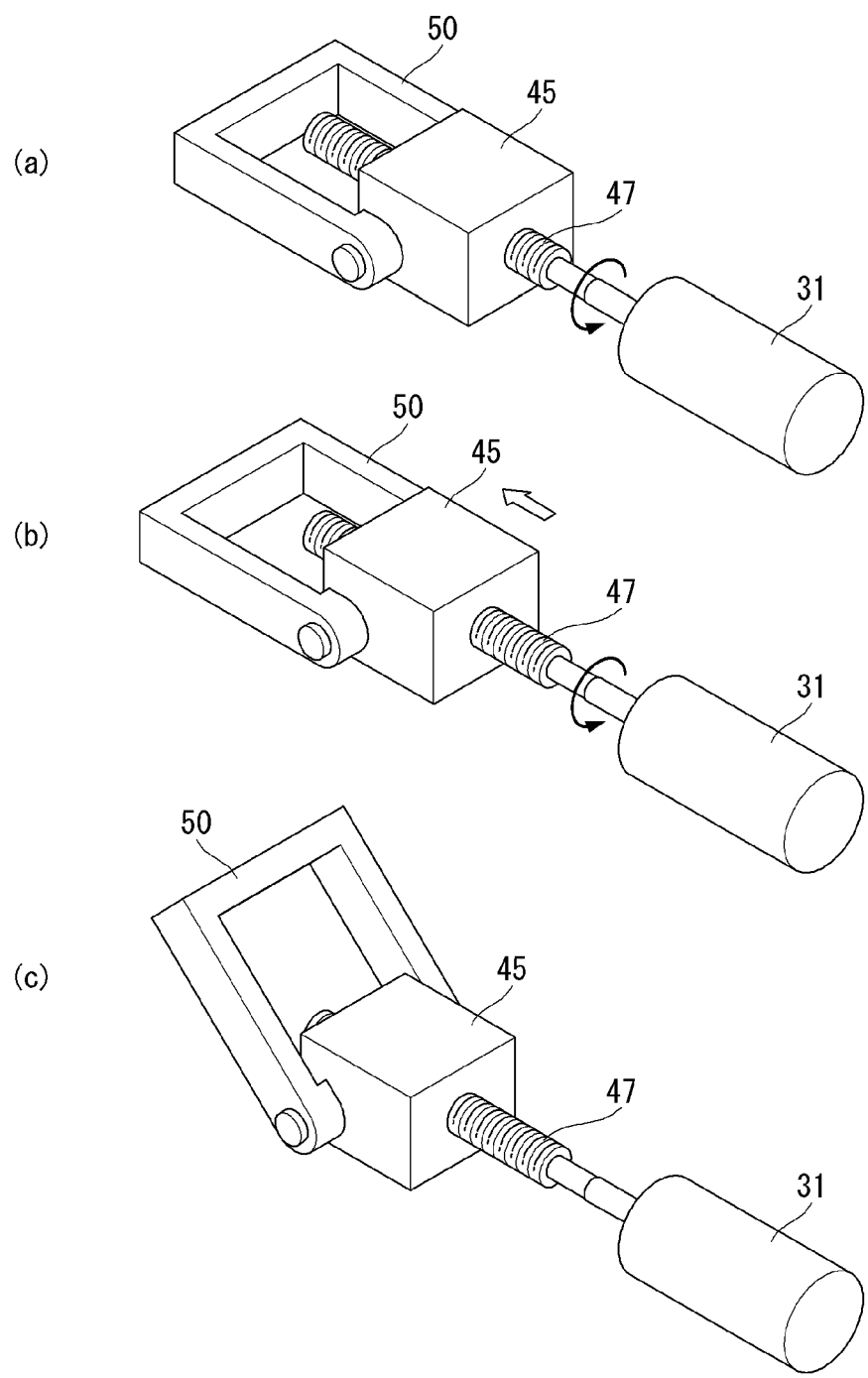
FIGS. 11, 12 and 13 illustrate shape change of the display device according to the present invention.
Figure 12:
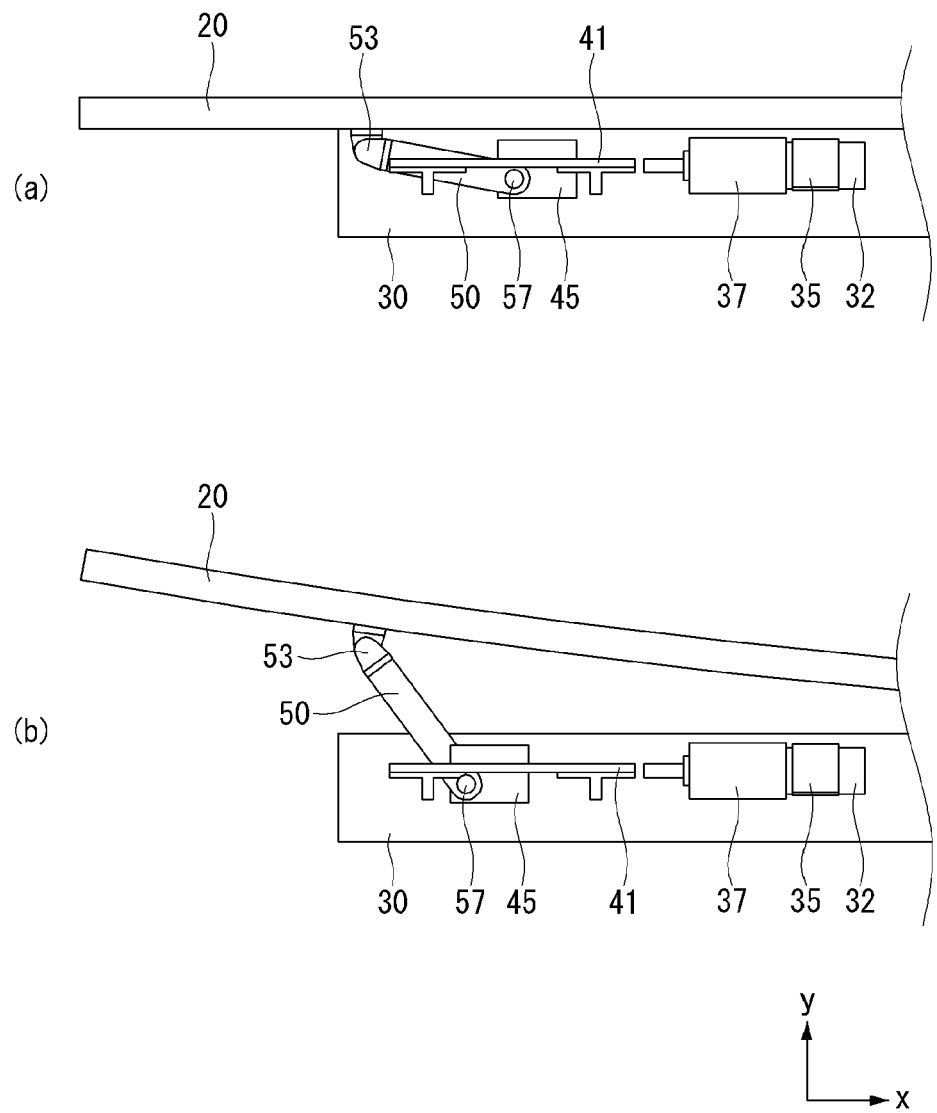
Figure 13:
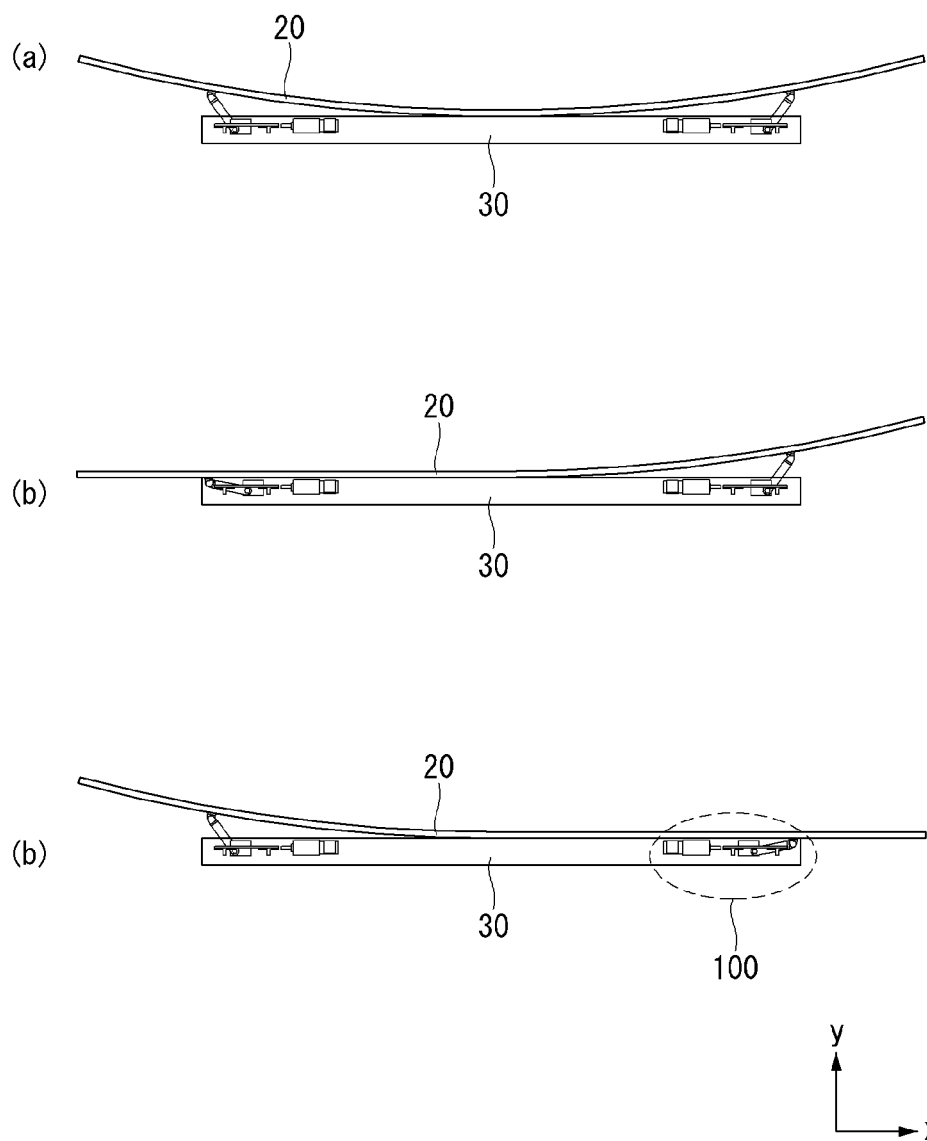

FIGS. 11, 12 and 13 illustrate change of the shape of the display device according to the present invention.

Referring to FIG. 11, in the display device 1 according to the present invention, the motor assembly 31 can be preferentially rotated. The lead screw 47 can be rotated in the same direction in which the motor assembly 31 is rotated when the motor assembly 31 is rotated. The screw nut 45 can be moved along the x-axis in the rotating direction of the lead screw 37 when the lead screw 37 is rotated. The link 50 can be supported by the second guide 41*b* when the screw nut 45 is moved. Accordingly, the link 50 can be pushed up or pulled down when the screw nut 45 is moved.

Referring to FIG. 12, in the display device 1 according to the present invention, the first motor 32 may not be driven when the display unit 20 is flat. The lead screw 47 may not be rotated when the first motor 32 is not driven. The screw nut 45 can approach the third driving guide 41*c* when the lead screw 47 is not rotated. Accordingly, the link 50 may not be pushed up.

When the first motor 32 is rotated in a first direction, the lead screw 47 can also be rotated in the first direction. The screw nut 45 can approach the second driving guide 41*b* when the lead screw 47 is rotated. Accordingly, the link 50 can be pushed up so as to bend the display unit 20.

When the first motor 32 is rotated in a second direction, the lead screw 47 can also be rotated in the second direction. The screw nut 45 can approach the driving guide 41 in the direction of the first motor 32 if the lead screw 47 is rotated. Accordingly, the link 50 can be pulled down such that the display unit 20 becomes flat.

The display device 1 according to the present invention can move the screw nut 45 to the first motor 32 or the link 50 when the first motor 32 is driven. The display unit 20 can be curved or flat as the screw nut 45 is moved to the second guide 41*b* or the third guide 41*c*. Accordingly, the display device 1 can improve immersion of viewers.

Referring to FIG. 13, in the display device 1 according to the present invention, the driving units at both sides of the housing 30 can push the display unit 20. That is, the links 50 for pushing the display unit 20 can be pushed up by the same height at both sides of the housing 30. Accordingly, both sides of the display unit 20 can be curved forward. The curvature of the display unit 20 can be constant at both sides of the display unit 20.

Alternatively, only a driving unit at one side of the housing may push the display unit 20 in the display device 1 according to the present invention. That is, the links 50 for pushing the display unit 20 may be pushed up by different heights at both sides of the housing 30. Accordingly, only one side of the display unit 20 can be curved forward. The curvature of the display unit 20 may not be constant at both sides of the display unit 20.

The display device 1 according to the present invention can independently control curvatures of both sides of the display unit 20. Accordingly, the display device 1 can provide a display screen with curvature optimized per user.

Figure 14:
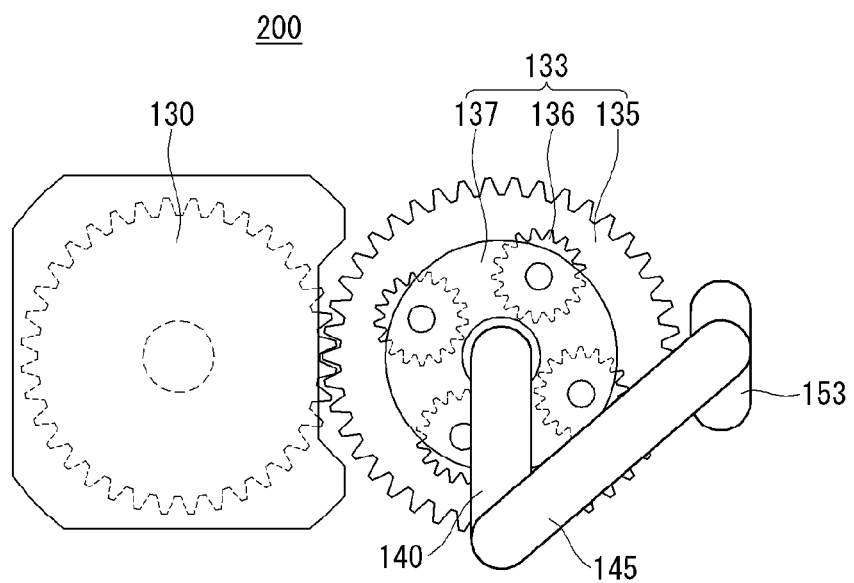
FIG. 14 illustrates a driving unit of a display device according to another embodiment of the present invention.
Figure 14:
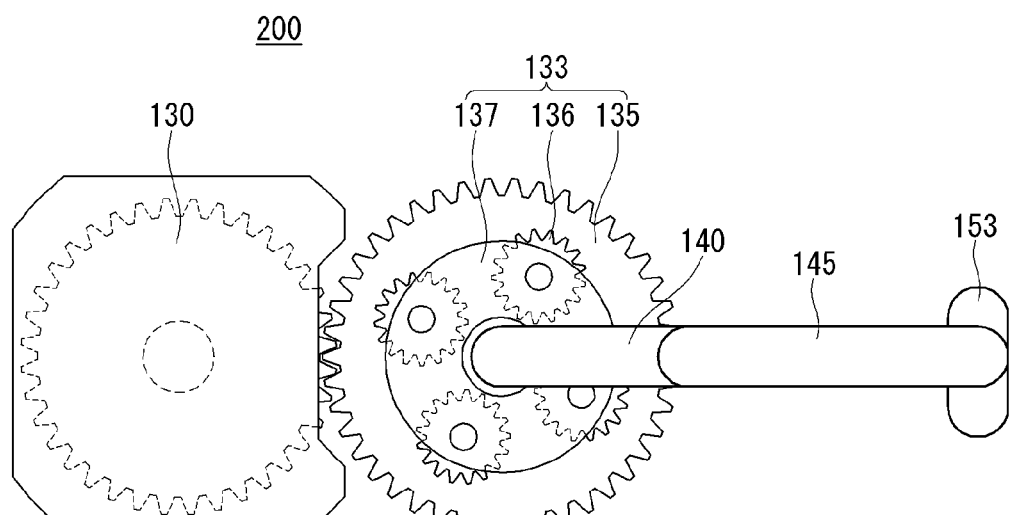

FIG. 14 illustrates a driving unit according to a configuration of a display device according to another embodiment of the present invention.

Referring to FIG. 14, the display device 1 according to another embodiment of the present invention may include a second motor 130, a second reducer 133, first and second bars 140 and 145 and a connector 153.

The second motor 130 may be covered by a cover. At least part of the second motor 130 may not be exposed by the cover. At least one side of the cover may be recessed such that the second motor 130 engages with the second reducer 133.

The second motor 130 may be an ultrasonic motor. The ultrasonic motor can covert frictional force generated between an ultrasonic vibrator and a mover into rotational force. The second motor 130 may not generate noise since the second motor 130 uses ultrasonic waves as a driving frequency. The second motor 130 may not use a magnet and thus may not affect the display unit 20. The second motor 130 may use piezoelectric effect using piezoelectric ceramics.

The second reducer 133 may have a shape engaging with the second motor 130. The second reducer 133 may be covered by a separate cover from the cover of the second motor 130. Unnecessary interference does not occur between the second reducer 133 and the second motor 130 when the second reducer 133 and the second motor 130 are covered by the separate covers. However, the present invention is not limited thereto and the second reducer and the second motor 130 may be covered by the same cover.

The second reducer 133 may increase rotational energy and transfer the increased rotational energy while reducing the rotational speed of the second motor 130. The second reducer 133 may include a ring gear 135, a planetary gear 136 and a sun gear 137. The second reducer 133 may have a high reduction gear ratio by being composed of a plurality of layers.

At least part of the ring gear 135 may come into contact with the second motor 130. The ring gear 135 may engage with the second motor 130. The ring gear 135 may have a circular shape and have protrusions on the circumference thereof. The ring gear 135 may transfer rotational energy from the second motor 130 to the planetary gear 136.

The planetary gear 136 may be provided beneath the ring gear 135. A plurality of planetary gears 136 may be positioned inside of the ring gear 135. Specifically, the planetary gears 136 may be provided to both ends of the ring gear 136 in a first direction and both ends of the ring gear 136 in a second direction perpendicular to the first direction. The planetary gears 136 may transfer rotational energy from the ring gear 135 to the sun gear 137.

The sun gear 137 may be provided beneath the planetary gears 136. At least part of the sun gear 137 may contact the plurality of planetary gears 136. The sun gear 137 may engage with the planetary gears 136. The sun gear 137 may transfer rotational energy from the planetary gears 136 to a shaft.

The first and second bars 140 and 145 may be provided to the shaft positioned at the center of the bottom of the second reducer 133. The first and second bars 140 and 145 may be sequentially connected to the shaft. The first and second bars 140 and 145 may be plates extended in one direction. The first and second bars 140 and 145 may push or pull the connector 153 when the second reducer 133 rotates.

The connector 153 may be provided to the end of the second bar 145. The connector 153 may be connected to a link 160. The connector 153 may have a rectangular shape including protruding parts disposed at both ends thereof.

The link 160 may be coupled to the protruding parts at both ends of the connector 153. The link 160 can be pushed up and pulled down by the guide 141 without shifting horizontally. Since the guide 141 supports the lower end of the link, the link 160 can be pushed up when the connector 153 approaches the guide 141 in the direction of the link 160. Conversely, the link can be pulled down when the connector 153 approaches the driving guide 141 in the direction of the second motor 130.

A fixing part 165 may be coupled to one end of the link 160. The fixing part 165 may be hinge-coupled to the display unit 20. Accordingly, the fixing part 165 can connect the link 160 and the display unit 20.

Figure 15:
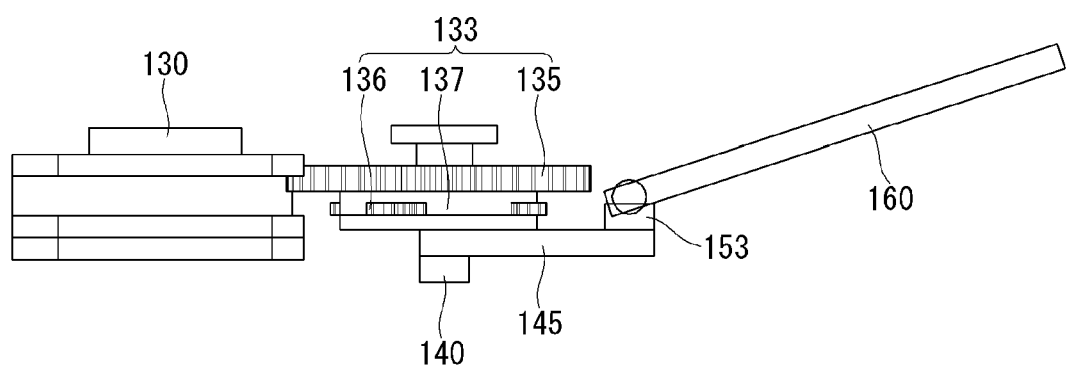
FIGS. 15, 16 and 17 illustrate shape change of the display device according to another embodiment of the present invention.
Figure 15:
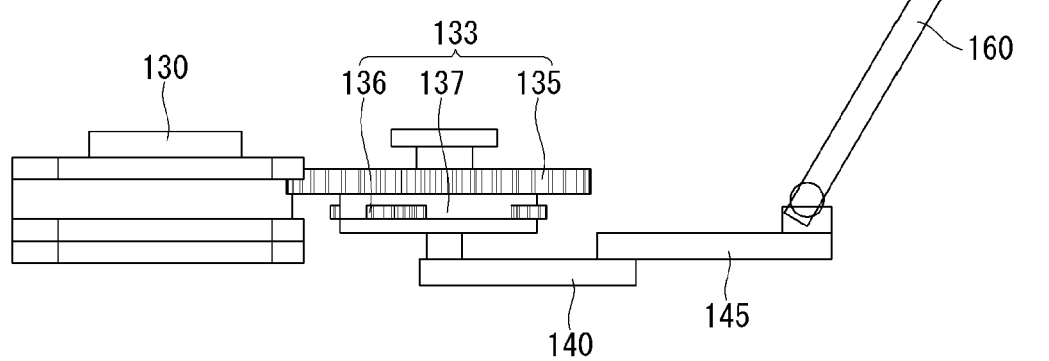
Figure 16:
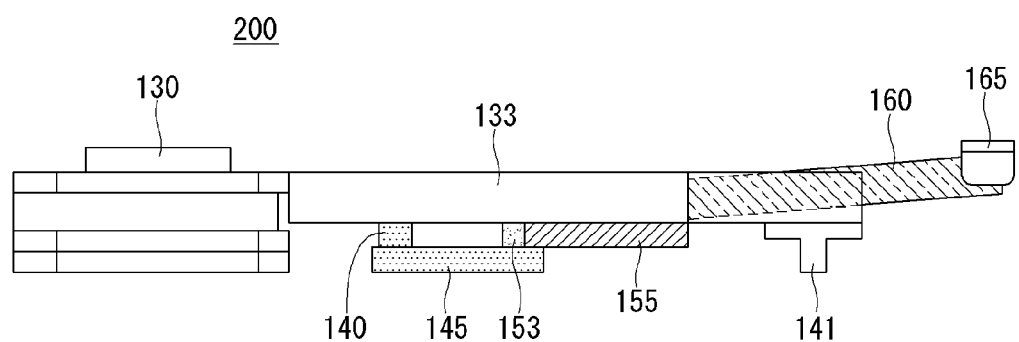
Figure 16:
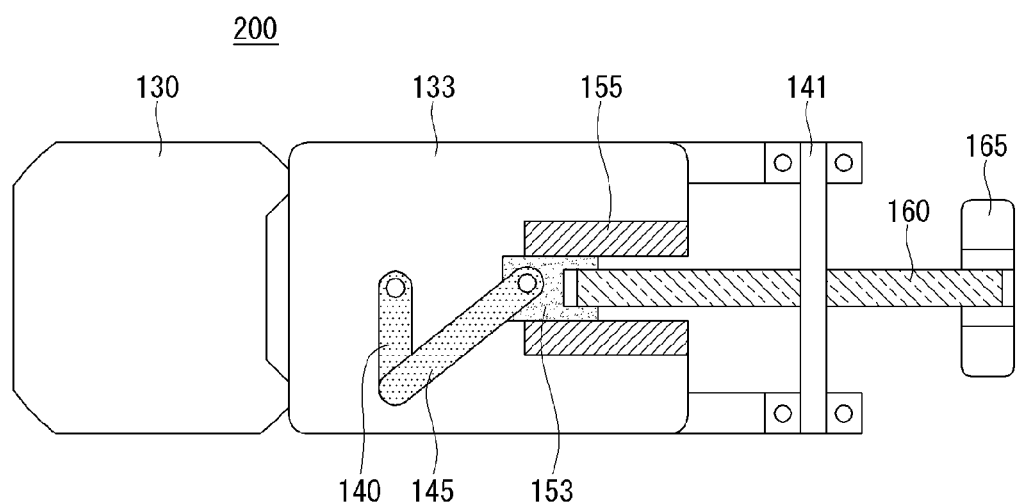
Figure 17:
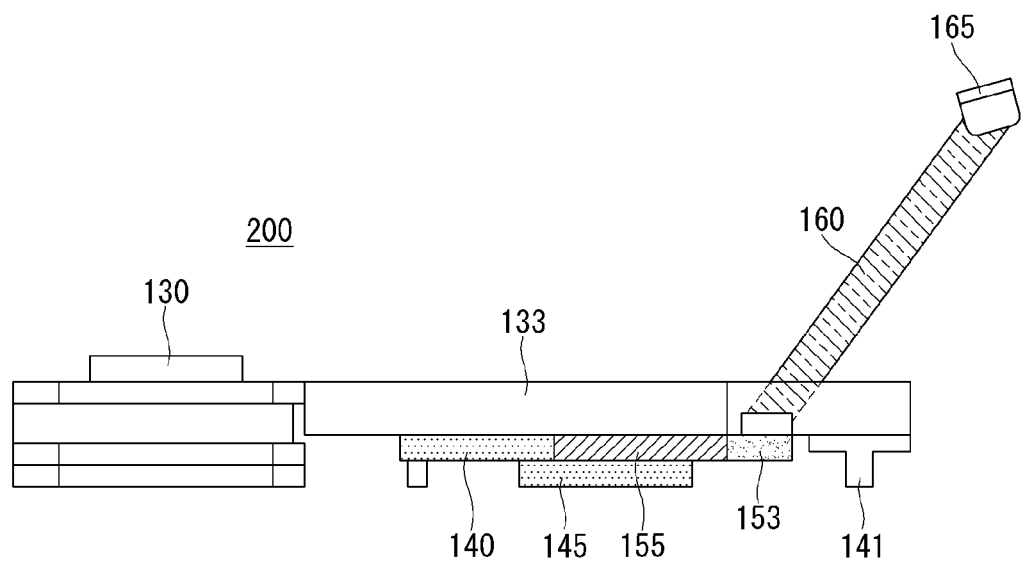
Figure 17:
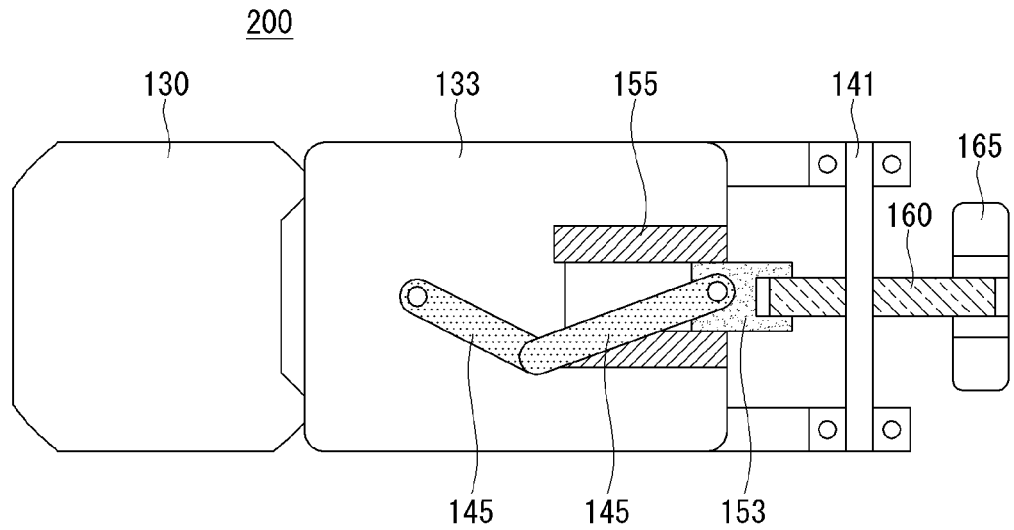

FIGS. 15, 16 and 17 illustrate change of the shape of the display device according to another configuration of the display device according to the present invention.

Referring to FIGS. 15, 16 and 17, the connector 153 can be moved in the direction of the second motor 130 by a driving guide 155 when the first bar 140 is turned in a direction perpendicular to the link 160. The link 160 can be pulled down when the connector 153 is moved in the direction of the second motor 130.

When the first bar 140 is turned in a direction parallel with the link 160, the connector 153 can be moved in the direction of the link 160 by the driving guide 155. The link 160 can be pushed up when the connector 153 is moved in the direction of the link 160.

The display device 1 according to the present invention does not generate operating noise since the ultrasonic motor is used and can be manufactured in a compact structure since the motor structure is simple. In addition, the display device 1 can have an increased reduction gear ratio using the second reducer 133 including the planetary gears 136.

Figure 18:
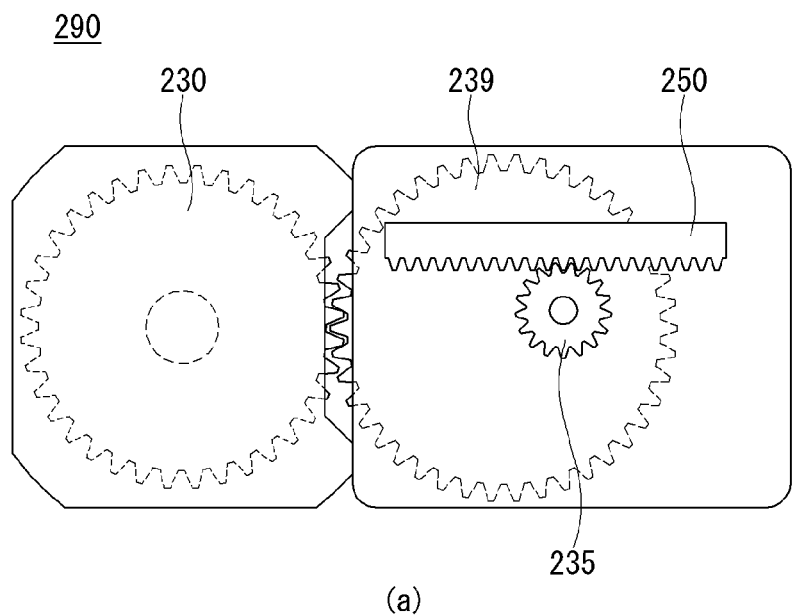
FIG. 18 illustrates a driving unit of a display device according to another embodiment of the present invention.
Figure 18:
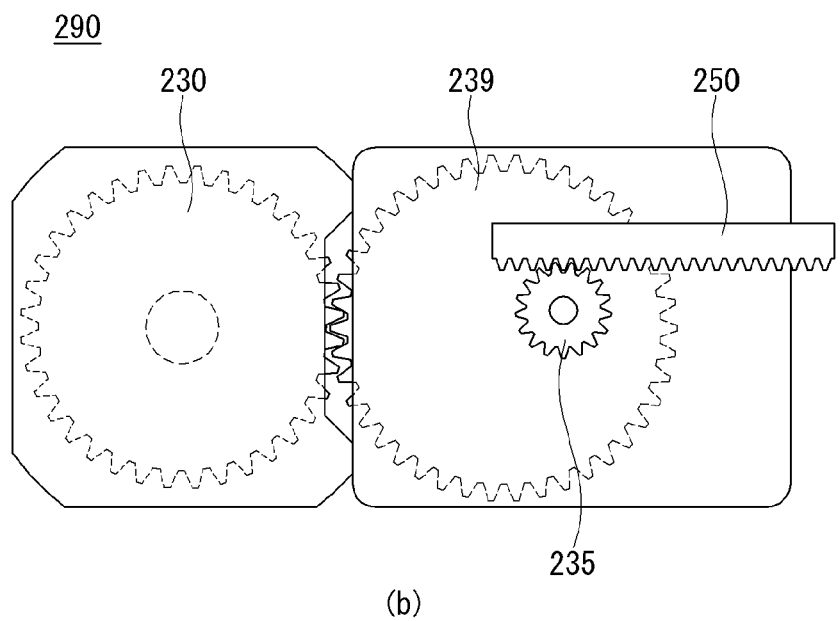

FIG. 18 illustrates a driving unit according to a configuration of a display device according to another embodiment of the present invention.

Referring to FIG. 18, a driving unit 290 of the display device 1 according to another embodiment of the present invention may include a third motor 230, a third reducer 239, a pinion gear 235 and a rack gear 250.

The third motor 230 may be covered by a cover. At least part of the third motor 230 may not be exposed according to the cover. At least one side of the cover may be recessed such that the third motor 230 engages with the third reducer 239.

The third motor 230 may have a structure equal or identical to the second motor 130. In other words, the third motor 230 may be an ultrasonic motor.

The third reducer 239 may have a shape engaging with the third motor 230. The third reducer 239 may be covered by a separate cover from the cover of the third motor 230. However, the present invention is not limited thereto and the third reducer 239 and the third motor 230 may be covered by the same cover.

The third reducer 239 may have a structure identical or similar to the second reducer 133. However, the third reducer 239 may have a shaft, which is provided to the lower side thereof and further protrudes compared to the second reducer, to be combined with the pinion gear 235.

The pinion gear 235 can be combined with the shaft of the third reducer 239. The pinion gear 235 has a circular shape with protrusions formed on the circumference thereof. The pinion gear 235 can transfer rotational energy to the rack gear 250.

At least part of the pinion gear 235 can engage with the rack gear 250. The rack gear 250 may have a plate shape extended in one direction. The rack gear 250 may have protrusions formed on at least one side thereof.

The rack gear 250 can convert rotational energy transferred from the pinion gear 235 into rectilinear energy. The rack gear 250 can be moved rectilinearly in the direction of the third motor 230 or a connector 253 when the pinion gear 235 is rotated in the first or second direction.

The connector 253 can be provided to the end of the rack gear 250. The connector 253 can be connected to a link 260. The connector 253 may have a rectangular form including protruding portions provided to both ends thereof.

The link 260 can be connected to the protruding portions at both ends of the connector 253. The link 260 can be pushed up and pulled down by a driving guide 255 without swerving horizontally. Since the driving guide 255 supports the lower end of the link (which is not shown), the link 260 can be pushed up when the connector 253 approaches the driving guide 255 in the direction of the link 260. Conversely, the link 260 can be pulled down when the connector 253 approaches the driving guide 255 in the direction of the third motor 230.

A fixing part 265 may be connected to one end of the link 260. The fixing part 265 may be hinge-coupled to the display unit 20. Accordingly, the fixing part 265 can connect the link 260 and the display unit 20.

Figure 19:
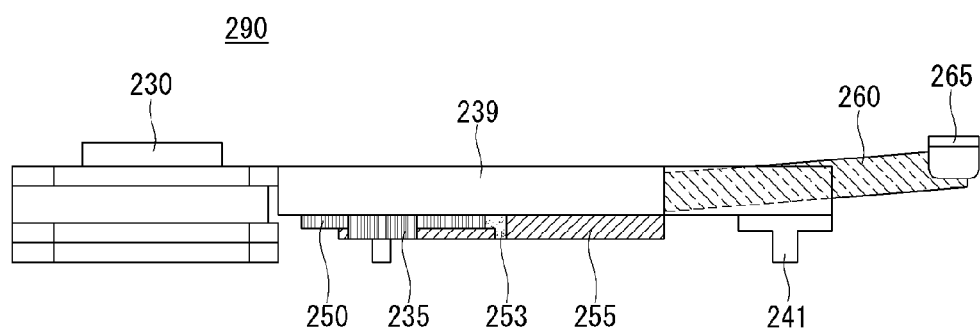
FIGS. 19 and 20 illustrate shape change of the display device according to another embodiment of the present invention.
Figure 19:
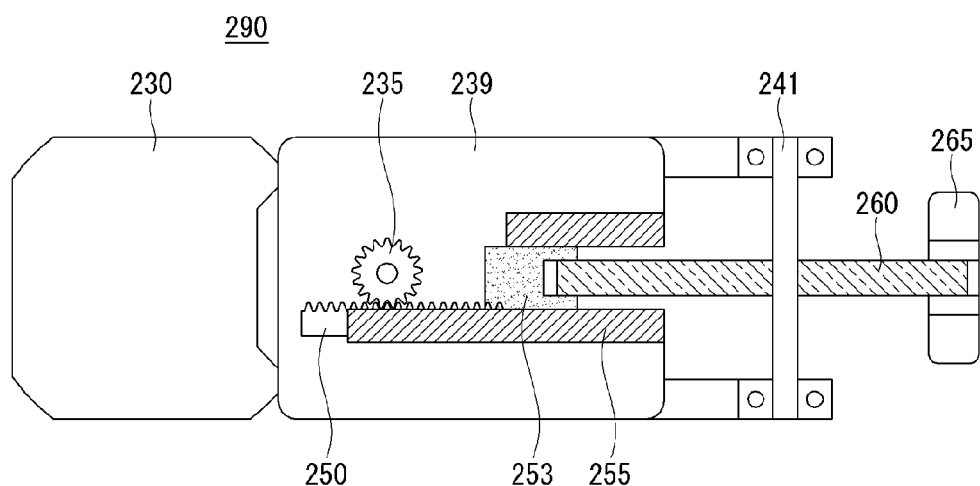
Figure 20:
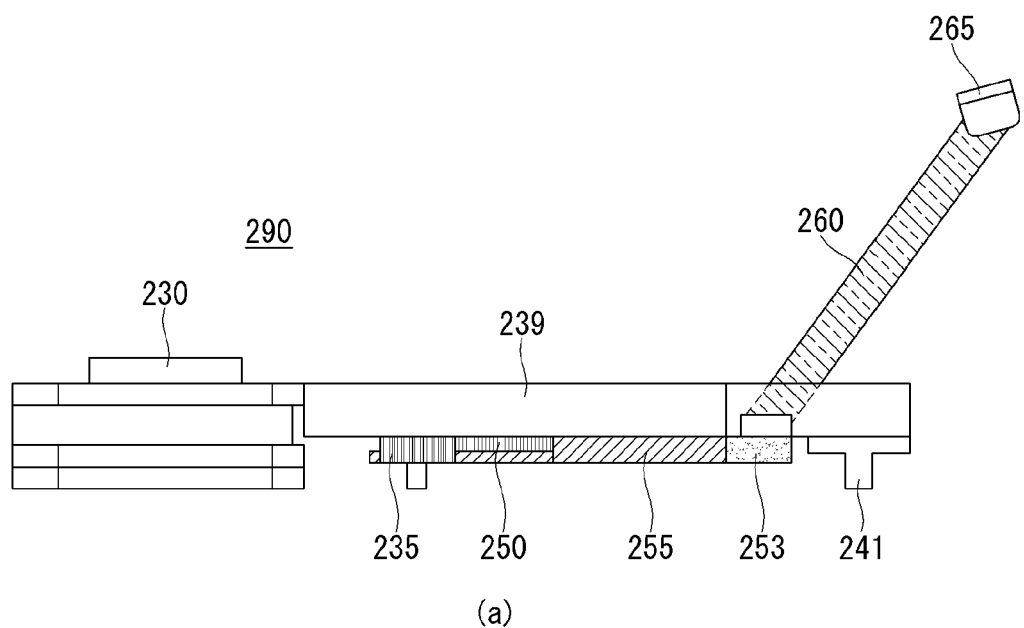
Figure 20:
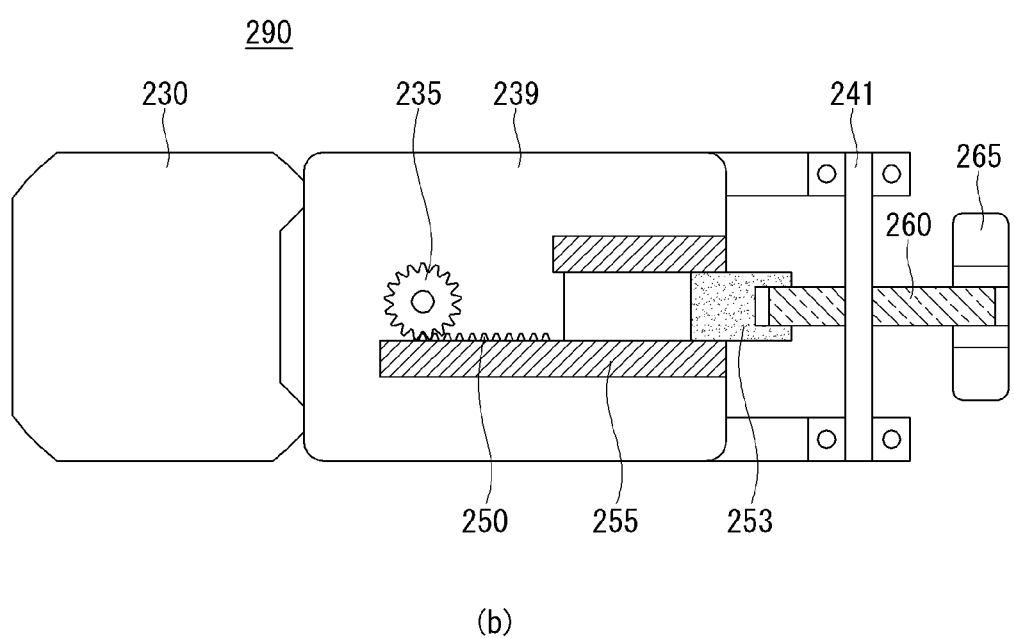

FIGS. 19 and 20 illustrate change of the shape of the display device according to another configuration of the display device of the present invention.

Referring to FIGS. 19 and 20, the connector 253 can be moved in the direction of the link 260 by a guide 241 when the rack gear 250 is moved in the direction of the link 260. The link 260 can be pushed up when the connector 253 is moved in the direction of the link 260.

When the rack gear 250 is moved to the third motor 230, the connector 253 can be moved in the direction of the third motor 230 by the driving guide 255. The link 260 can be pulled down when the connector 253 is moved in the direction of the third motor 230.

The display device 1 according to the present invention generates less operating noise since the ultrasonic motor is used and can be manufactured in a compact structure since the motor structure is simple. In addition, energy consumption efficiency can be improved using the rack gear 250 and the pinion gear 235.

FIGS. 21 to 30 are diagrams illustrating the display device according to the present invention in detail.

Figure 21:
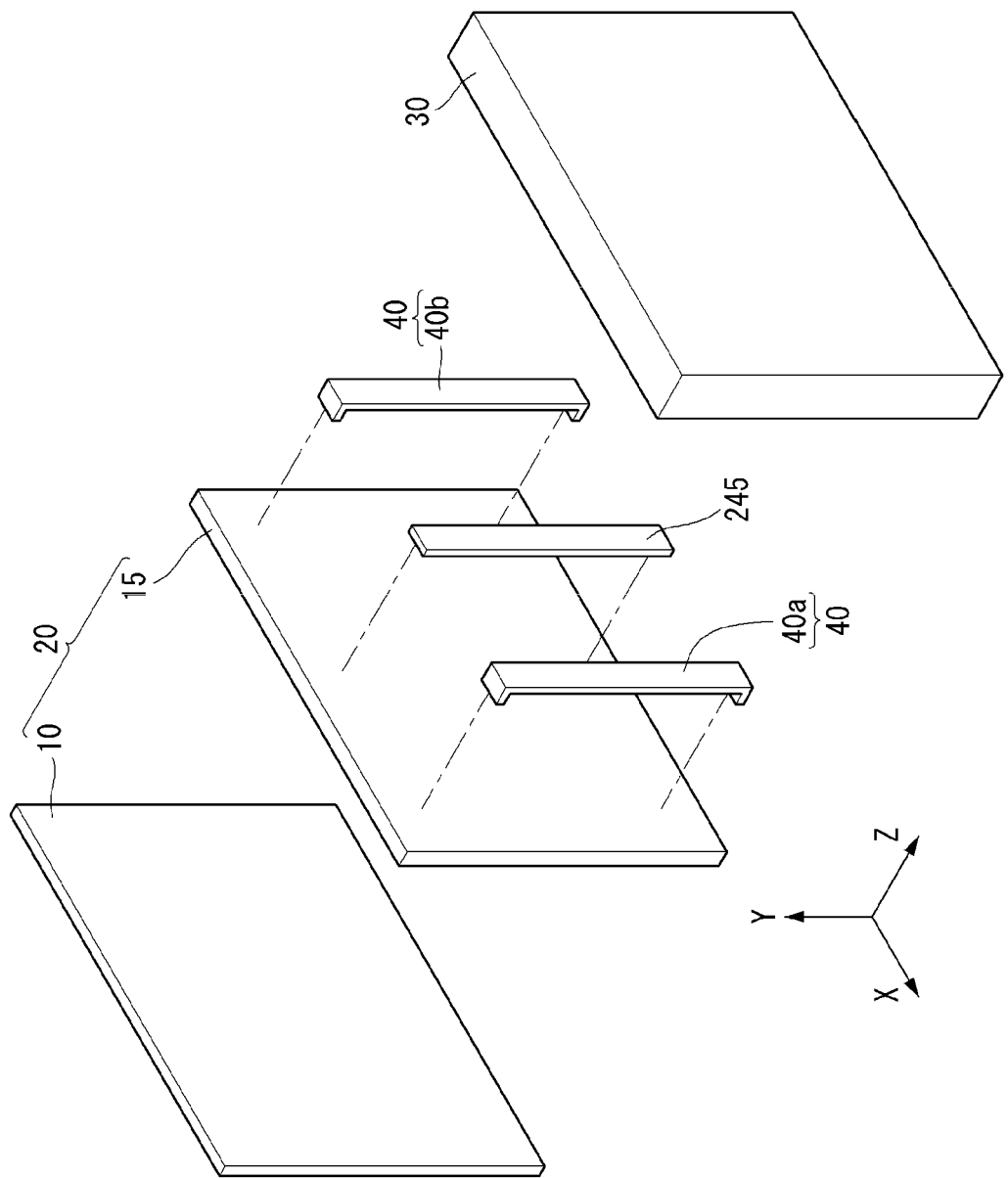
FIGS. 21 to 30 are diagrams for describing the display device according to the present invention in detail.

Referring to FIG. 21, the display device 1 according to the present invention may include a housing fixing part 245 and first and second brackets 40a and 40b provided to the rear side of the display unit 20. Specifically, the housing fixing part 245 is provided to the center of the rear side of the display unit 20 and the first and second brackets 40a and 40b are provided to both ends of the display unit 20 in the x-axis direction.

The housing fixing part 245 and the first and second brackets 40a and 40b may be provided between the display unit 20 and the housing 30. The housing 30 can cover at least part of the housing fixing part 235 and the first and second brackets 40a and 40b. The length of a double-sided tape in the x-axis direction may be equal to or greater than the lengths of the housing fixing part 245 and the first and second brackets 40a and 40b in the x-axis direction.

Figure 22:
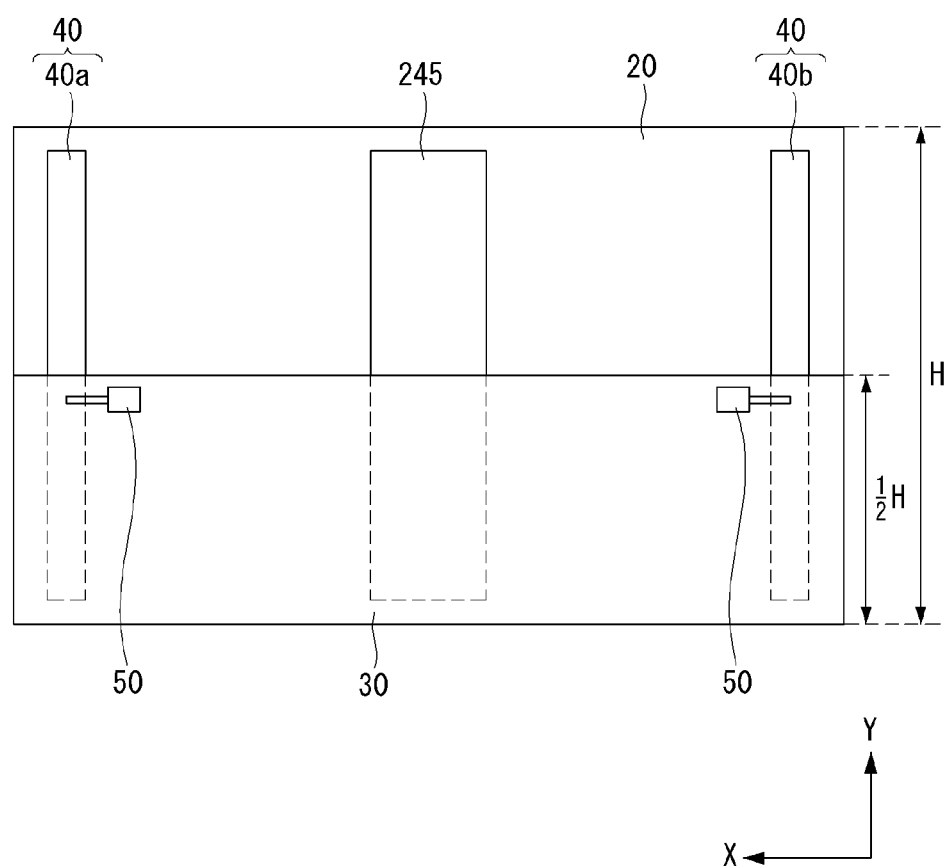

Referring to FIG. 22, the links 50 provided to both sides of the housing 30 in the x-axis direction may be aligned with the center of the display unit 20 in the y-axis direction. Specifically, the links 50 may be provided to a height 0.5H corresponding to half the y-axis height H of the display unit 20. Accordingly, the height of the housing 30 including the links 50 can be greater than half 0.5H the y-axis height of the display unit 20.

The links 50 can push the centers of the housing fixing part 245 and the first and second brackets 40a and 40b. Accordingly, the centers of the housing fixing part 245 and the first and second brackets 40a and 40b correspond to half 0.5H the y-axis height of the display unit 20.

The housing 30 can cover parts of the housing fixing part 45 and the first and second brackets 40a and 40b, which correspond to more than half the y-axis lengths of the housing fixing part 45 and the first and second brackets 40a and 40b. Accordingly, since only parts of the housing fixing part 45 and the first and second brackets 40a and 40b are exposed, the aesthetics of the display device may be improved.

Figure 23:
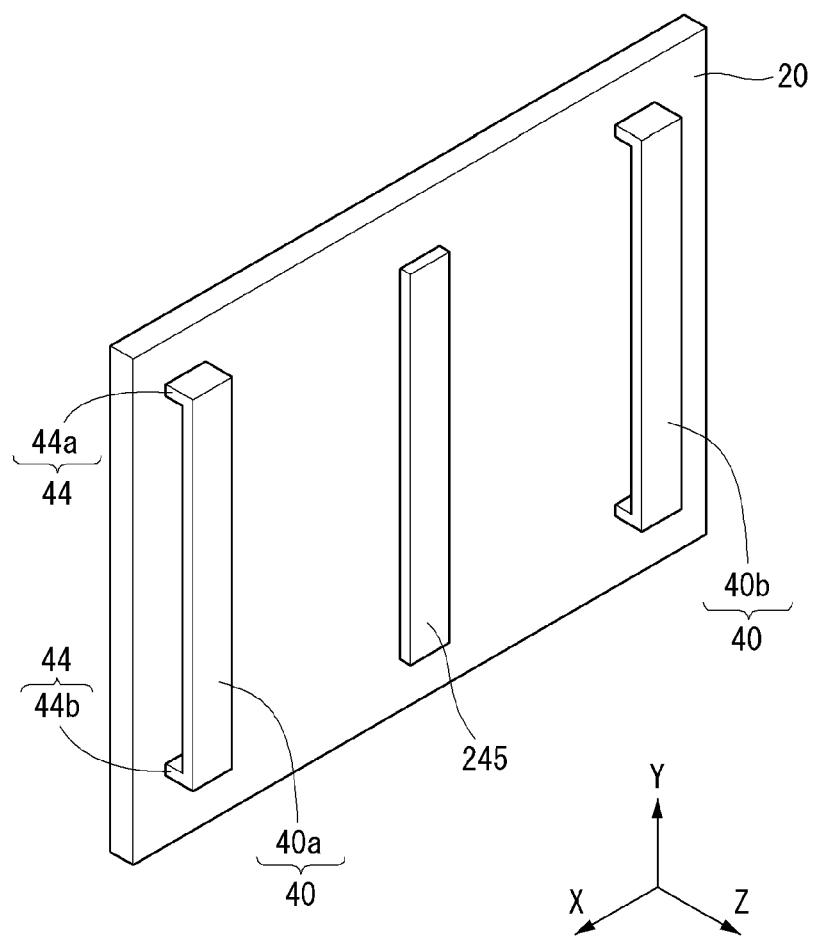

Referring to FIG. 23, the housing fixing part 245 and the first and second brackets 40a and 40b may be extended in the y-axis direction and attached to the display device 20.

The housing fixing part 245 may be extended in the y-axis direction. Specifically, the housing fixing part 245 may be a plate extended in the y-axis direction. The housing fixing part 245 may be attached to the display unit 20 by means of a double-sided tape. However the present invention is not limited thereto and the housing fixing part 245 may be attached to the display unit 20 by means of welding, a screw, a rivet or Torx screw.

The first and second brackets 40a and 40b may be extended in the y-axis direction. The first and second brackets 40a and 40b may have first and second bracket coupling portions 44a and 44b provided to both ends thereof in the y-axis direction. The first and second bracket coupling portions 44a and 44b may be extended in the z-axis direction. In other words, the first and second bracket coupling portions 44a and 44b may be extended in the direction of the display unit 20. The first and second bracket coupling portions 44a and 44b may be extended by 6 mm or less in the direction of the display unit 20. The first and second bracket coupling portions 44a and 44b may be attached to the display unit 20 using a double-sided tape. However the present invention is not limited thereto and the first and second bracket coupling portions 44a and 44b may be attached to the display unit 20 by means of welding, a screw, a rivet and/or Torx screw.

Figure 24:
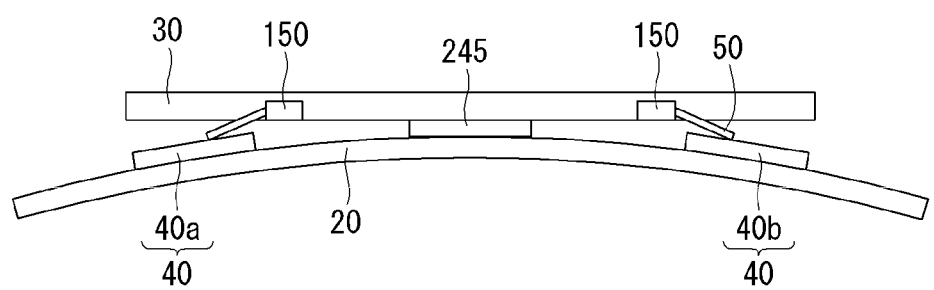
Figure 24:
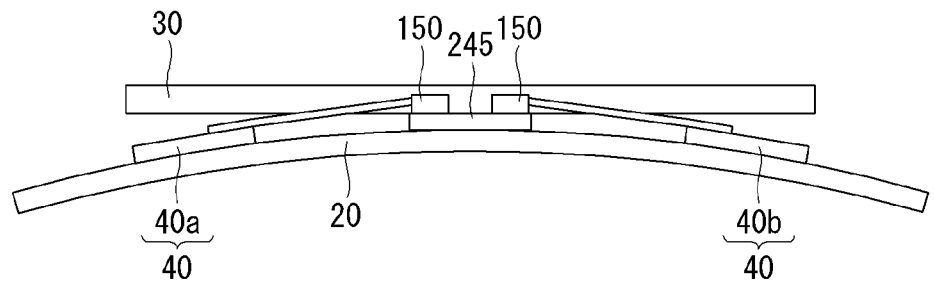

Referring to FIG. 24, in the display device 1 according to the present invention, the housing fixing part 245 may be coupled to the housing 30 when the display unit 20 is in a curved state. That is, the housing fixing part 245 can connect the housing 30 and the display unit 20.

Referring to FIG. 24(a), the driving unit 100 of the display device 1 according to the present invention may be provided to both sides of the housing 30. That is, the driving unit 100 may be separated from the housing fixing part 245.

Since the driving unit 100 of the display device according to the present invention is provided to both sides of the housing 30, distances between the driving unit 100 and the first and second brackets 40a and 40b may be short. Accordingly, the display unit 20 can be easily curved even when a weak force is applied thereto.

Referring to FIG. 24(b), the driving unit 100 of the display device 1 according to the present invention may be provided to the center of the housing 30. That is, the driving unit 100 may be directly coupled to the housing fixing part 245.

Since the driving unit 100 of the display device according to the present invention is directly coupled to the housing 30, the driving unit 100 can connect the housing 30 and the display unit 20 more firmly.

Figure 25:
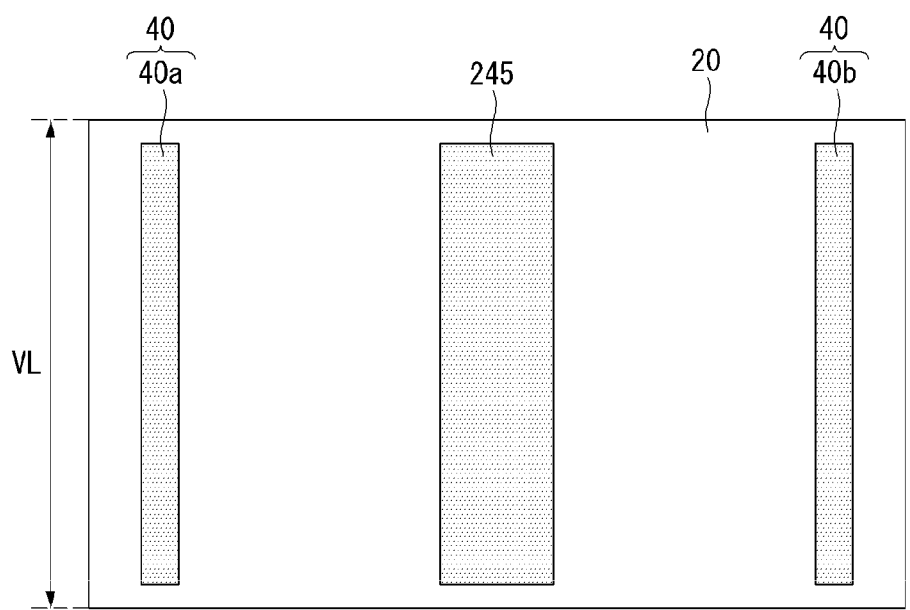
Figure 26:
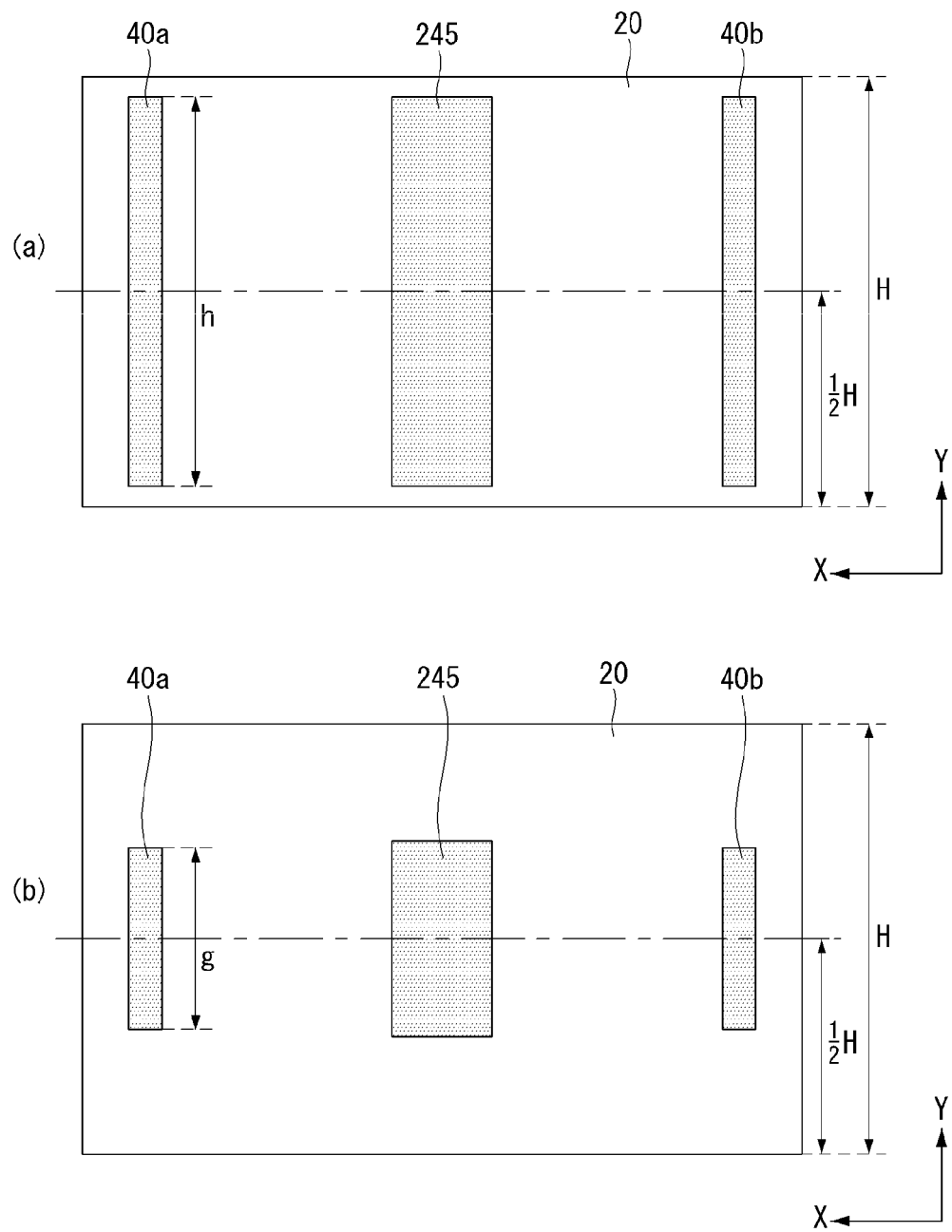

Referring to FIG. 25, in the display device 1 according to the present invention, the y-axis lengths of the housing fixing part 245 and the first and second brackets 40a and 40b may be shorter than the y-axis length VL of the display unit 20. That is, the housing fixing part 245 and the first and second brackets 40a and 40b may not be combined with the upper and lower parts of the display unit 20 in the y-axis direction.

The housing fixing part 245 can be provided to the center of the display unit 20 in the x-axis direction. The first and second brackets 40a and 40b can be respectively provided to both ends of the display unit 20 in the x-axis direction. The housing fixing part 245 can be provided to a position corresponding to half the distance between the first and second brackets 40a and 40b in the x-axis direction. However, the present invention is not limited thereto and the housing fixing part 245 may be provided to a position between the first and second brackets 40a and 40b.

Referring to FIG. 26(a), the y-axis centers of the housing fixing part 245 and the first and second brackets 40a and 40b can correspond to the y-axis center of the display unit 20. The height H of the housing fixing part 245 and the first and second brackets 40a and 40b in the y-axis direction can be greater than half (0.5H) the height of the display unit 20 in the y-axis direction.

Referring to FIG. 26(b), the y-axis centers of the housing fixing part 245 and the first and second brackets 40a and 40b can correspond to the y-axis center of the display unit 20. The height H of the housing fixing part 245 and the first and second brackets 40a and 40b in the y-axis direction can be less than half (0.5H) the height of the display unit 20 in the y-axis direction. In this case, the appearance of the display device 1 can be neat.

Figure 27:
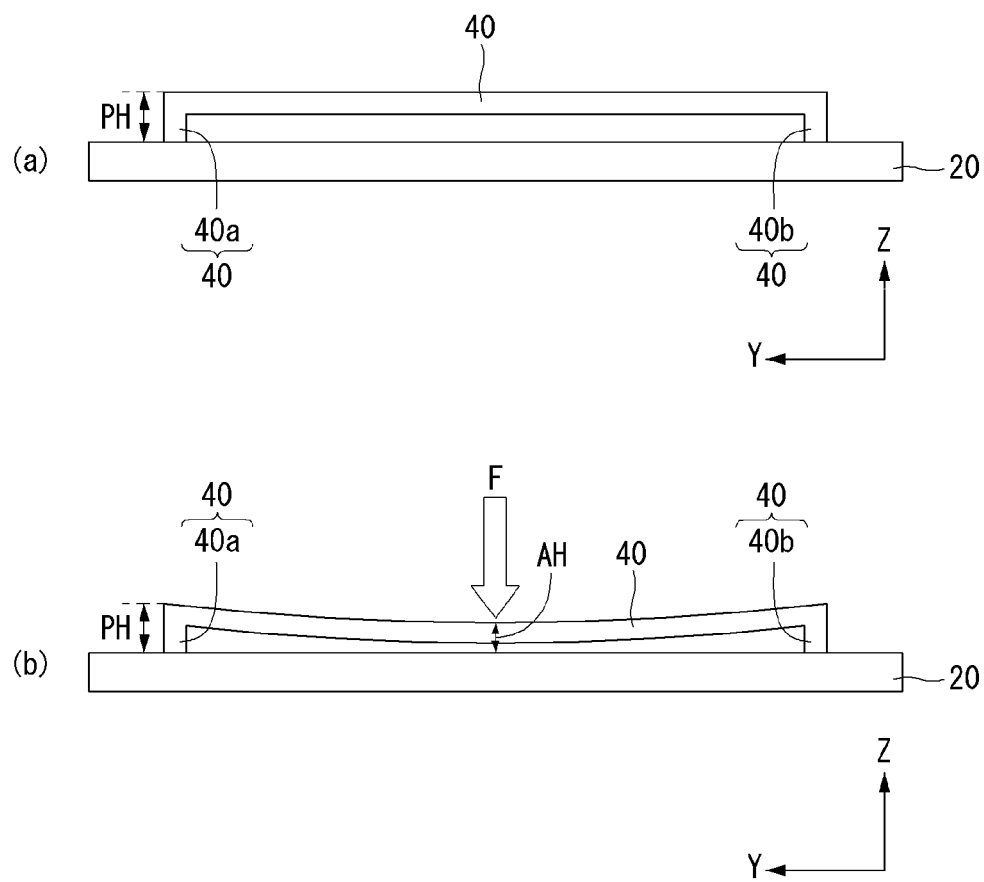

Referring to FIG. 27, the first and second bracket coupling portions 44a and 44b may be coupled to the display unit 20. The height PH of the first and second brackets 40a and 40b in the z-axis direction can be constant before external force F is applied to the first and second brackets 40a and 40b. In other words, the first and second brackets 40 can be separated from the display unit 20 by a predetermined distance except for both ends thereof.

When external force is applied to the first and second brackets 40, the y-axis centers thereof can be recessed toward the display unit 20. In other words, the height AH of the y-axis centers of the first and second brackets 40 can be less than the height PH of both sides thereof in the y-axis direction when external force F is applied thereto.

The first and second brackets 40 can be separated from the display unit 20 by the specific distance AH even when external force F is applied thereto. Accordingly, external force is not concentrated on the y-axis centers of the first and second brackets 40 even if external force F is applied thereto.

Figure 28:
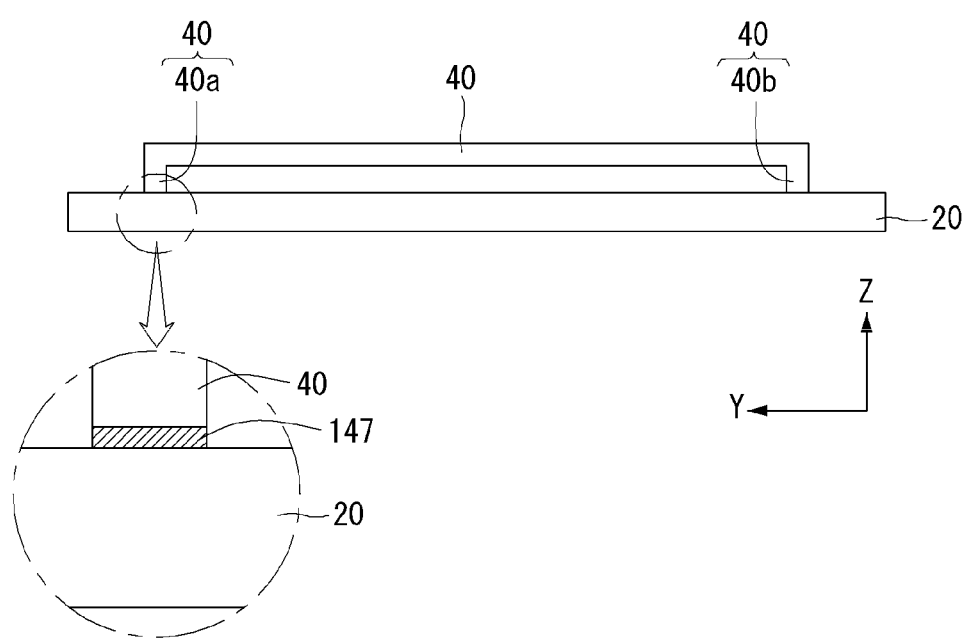

Referring to FIG. 28, the first and second bracket coupling portions 44a and 44b may be coupled to the display unit 20 through a first adhesive part 147. The first adhesive part 147 can attach the first and second bracket coupling portions 44a and 44b to the display unit 20 such that the first and second bracket coupling portions 44a and 44b are not separated from the display unit 20 even when external force is applied to the y-axis centers of the first and second brackets 40. For example, the first adhesive part 147 can be a double-sided tape. However, the present invention is not limited thereto and the first adhesive part 147 may include a welding metal, screw, rivet or Torx screw.

Figure 29:
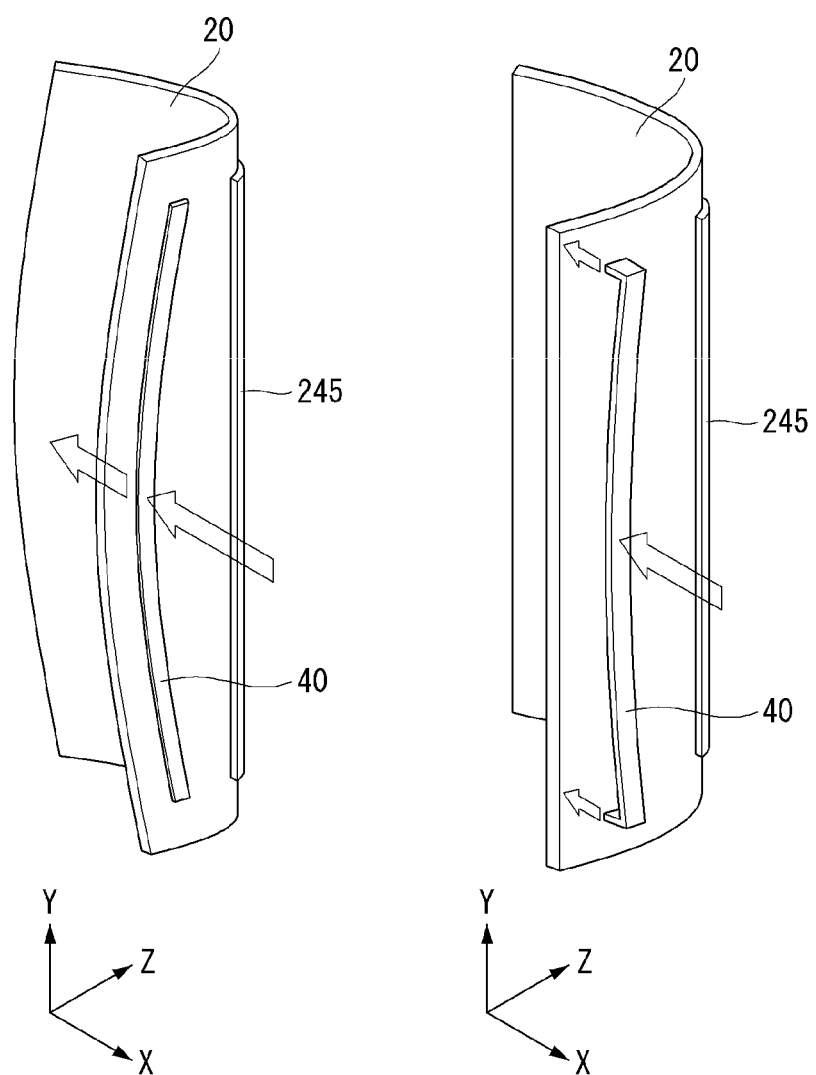

Referring to FIG. 29, since a conventional display device does not have the first and second bracket coupling portions 44a and 44b, external force can be concentrated on the y-axis center of the display unit 20 when the external force is applied to the y-axis centers of the first and second brackets 40. Accordingly, both edges of the display unit 20 in the x-axis direction may be curved.

However, since the display device according to the present invention has the first and second bracket coupling portions 44a and 44b, when external force is applied to the y-axis center of the first and second brackets 40, the force can be dispersed to both sides of the display unit 20 in the y-axis direction. Accordingly, both edges of the display unit 20 in the x-axis direction can be flat.

Since both edges of the display unit 20 in the x-axis direction are maintained flat, durability of the display device according to the present invention can be improved.

Figure 30:
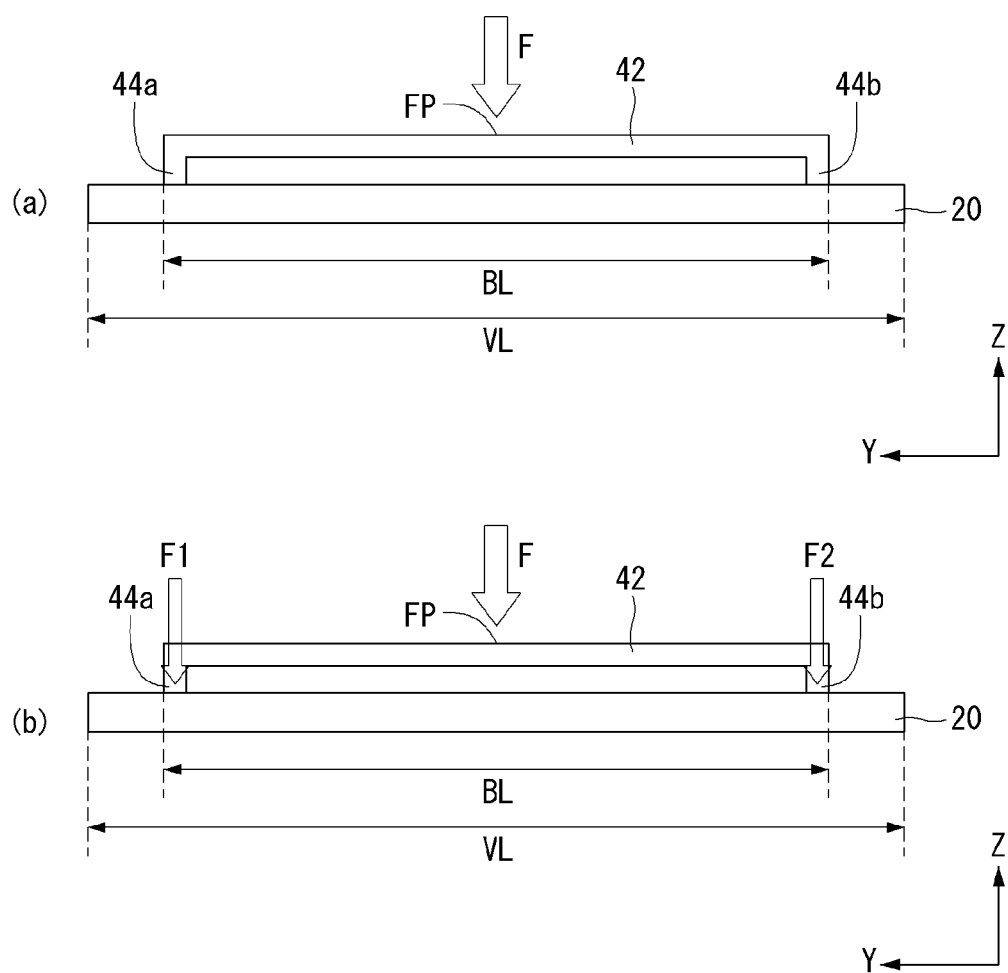

Referring to FIG. 30, external force F may be applied to the y-axis center of a bracket body 42. The portion FP to which the external force is applied may correspond to the y-axis center of the bracket body 42. The portion FP to which the external force is applied may correspond to the center of the y-axis length BL of the first and second brackets 40 and correspond to the y-axis center VL of the display unit 20.

When external force F is applied to the y-axis center of the bracket body 42, external force F can be dispersed to the first and second bracket coupling portions 44a and 44b. The first and second bracket coupling portions 44a and 44b may be portions extended from the bracket body 42 in the z-axis direction. A plurality of first and second bracket coupling portions 44a and 44b can be arranged along the bracket body 42 at predetermined intervals. First external force F1 and second external force F2 can be respectively dispersed to the first and second bracket coupling portions 44a and 44b. The sum of the first external force F1 and the second external force F2 may equal the external force F. The first external force F1 and the second external force F2 may have the same magnitude. However, the present invention is not limited thereto and the first external force F1 and the second external force F2 may have different magnitudes.

Since the external force F is dispersed as the first external force F1 and the second external force F2 to the first and second bracket coupling portions 44a and 44b, the external force can be prevented from concentrating on the y-axis center of the display unit 20. Accordingly, both edges of the display unit 20 in the x-axis direction are not curved.

FIGS. 31 to 40 illustrate a configuration of a display device according to another embodiment of the present invention.

Figure 31:
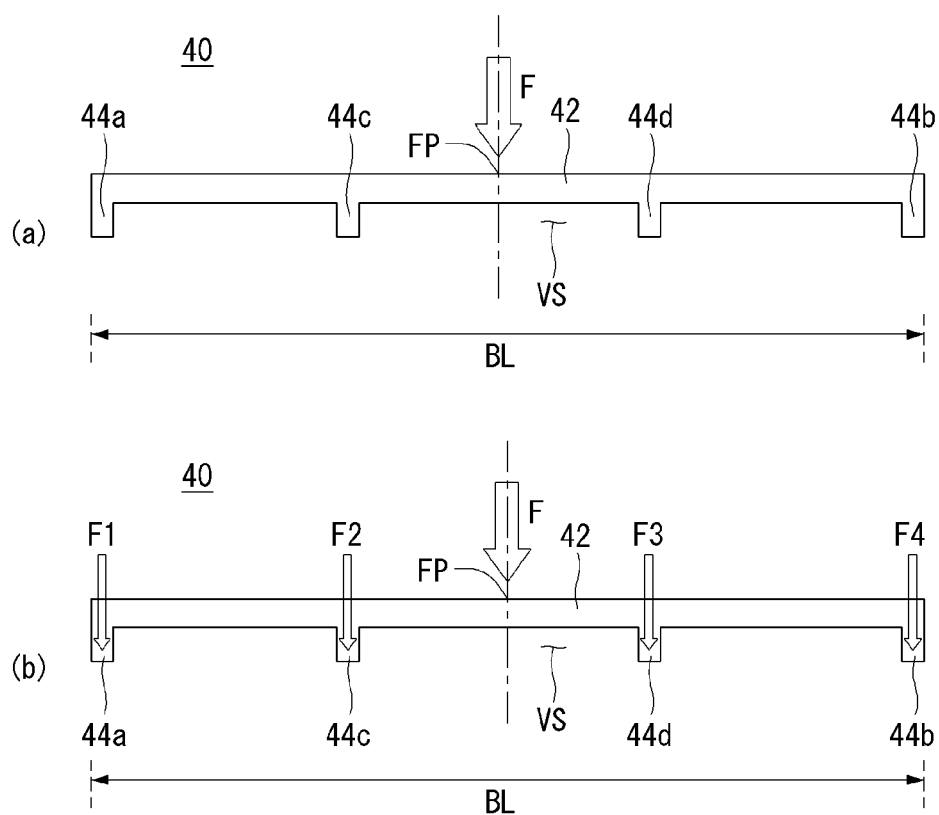
FIGS. 31 to 40 illustrate a configuration of a display device according to another embodiment of the present invention.

Referring to FIG. 31, the first and second brackets 40 may include first to fourth bracket coupling portions 44a, 44b, 44c and 44d. The first and second bracket coupling portions 44a and 44b may be provided to both ends of the first and second brackets 40. The third and fourth bracket coupling portions 44c and 44d may be respectively provided between the first and second bracket coupling portions 44a and 44b and the center of the first and second brackets 40. Specifically, the third and fourth bracket coupling portions 44c and 44d may be respectively provided to points corresponding to a third and two thirds of the first and second brackets 40. However, the present invention is not limited thereto and the third and fourth bracket coupling portions 44c and 44d may be provided to arbitrary places between the first and second bracket coupling portions 44a and 44b and the center of the first and second brackets 40.

When the external force F is applied to the y-axis center of the bracket body 42, the external force F can be dispersed to first and second bracket coupling portions 44a to 44d. First to fourth external forces F1 to F4 may be respectively dispersed to the first to fourth bracket coupling portions 44a to 44d. The sum of the first to fourth external forces F1 to F4 may equal the external force F. The first to fourth external forces F1 to F4 may have the same magnitude. However, the present invention is not limited thereto and the first to fourth external forces F1 to F4 may have different magnitudes.

Since the external force F is dispersed as the first to fourth external forces F1 to F4 to the first to fourth bracket coupling portions 44a to 44d, the external force can be prevented from concentrating on the y-axis center of the display unit 20. Accordingly, both edges of the display unit 20 in the x-axis direction are not curved.

Figure 32:
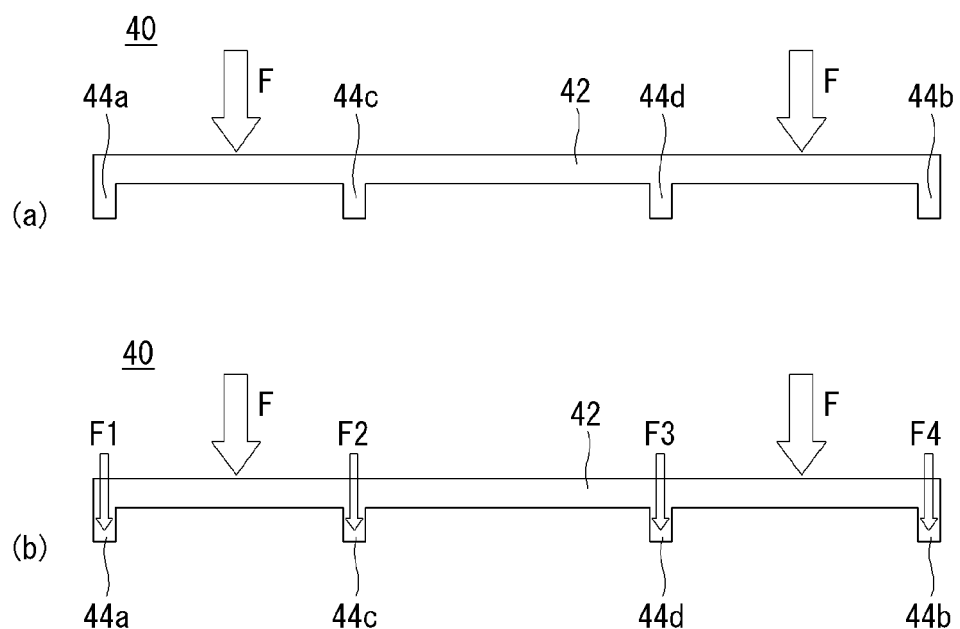

Referring to FIG. 32, in the display device 1 according to the present invention, the external force F may be applied to a point between the first bracket coupling portion 44a and the third bracket coupling portion 44c of the bracket body 42 and to a point between the second bracket coupling portion 44b and the fourth bracket coupling portion 44d of the bracket body 42. The external force F applied to both sides of the bracket body 42 can be dispersed to the first to fourth bracket coupling portions 44a to 44d. The sum of the first to fourth external forces F1 to F4 respectively dispersed to the first to fourth bracket coupling portions 44a to 44d may equal the external force F. The first to fourth external forces F1 to F4 may have the same magnitude. However, the present invention is not limited thereto and the first to fourth external forces F1 to F4 may have different magnitudes.

Since the external force F is applied to both sides of the bracket body 42 instead of one point thereof, the external force F can be easily dispersed to the first to fourth bracket coupling portions 44a to 44d.

Figure 33:
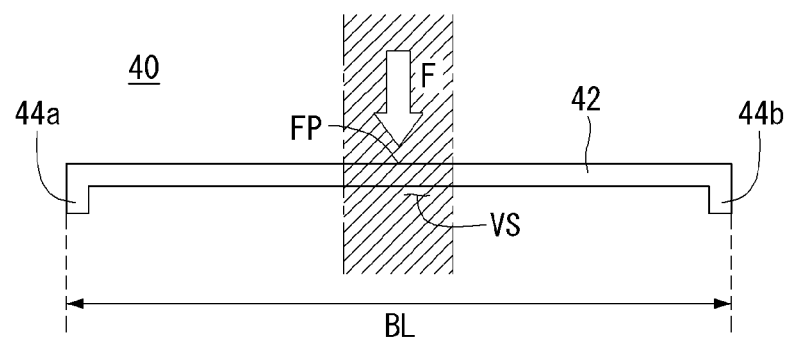
Figure 34:
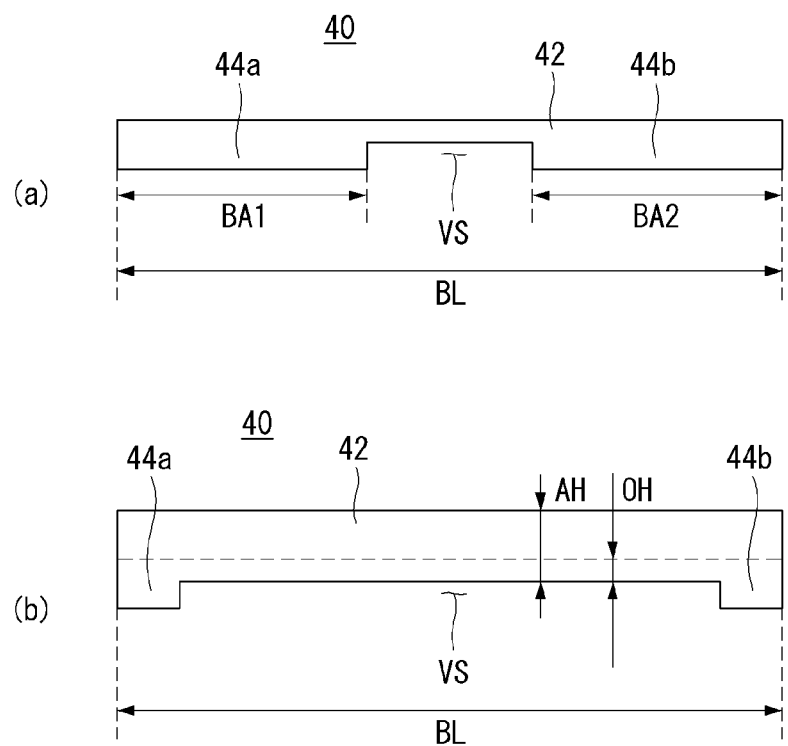

Referring to FIG. 33, when the external force F is applied to the centers of the first and second brackets 40, the external force can reach out to a predetermined region VS around the portion FP to which the external force is applied. The region VS may be symmetrical on the basis of the portion FP to which the external force is applied. The portion of the bracket body 42, which corresponds to the region VS, can be bent in the z-axis direction. The first and second bracket coupling portions 44a and 44b can disperse the force applied to the surface VS.

Referring to FIG. 34(a), first and second bracket areas BA1 and BA2 corresponding to the lower surfaces of the first and second bracket coupling portions 44a and 44b of the first and second brackets 40 may be provided to regions other than the region VS to which the external force reach out. In other words, the first and second bracket areas BA1 and BA2 can be widened.

According to the display device of the present invention, external force applied to the first and second brackets 40 can be dispersed more easily since the first and second bracket areas BA1 and BA2 corresponding to the lower surfaces of the first and second bracket coupling portions 44a and 44b are wide.

Referring to FIG. 34(b), the height AH of the bracket body 32 in the z-axis direction may be increased from the height OH. For example, the height AH of the bracket body 32 in the z-axis direction can be twice the height OH. However, the present invention is not limited thereto.

According to the display device of the present invention, external force applied to the first and second brackets 40 can be dispersed more easily since the height AH of the bracket body 32 in the z-axis direction is increased.

Figure 35:
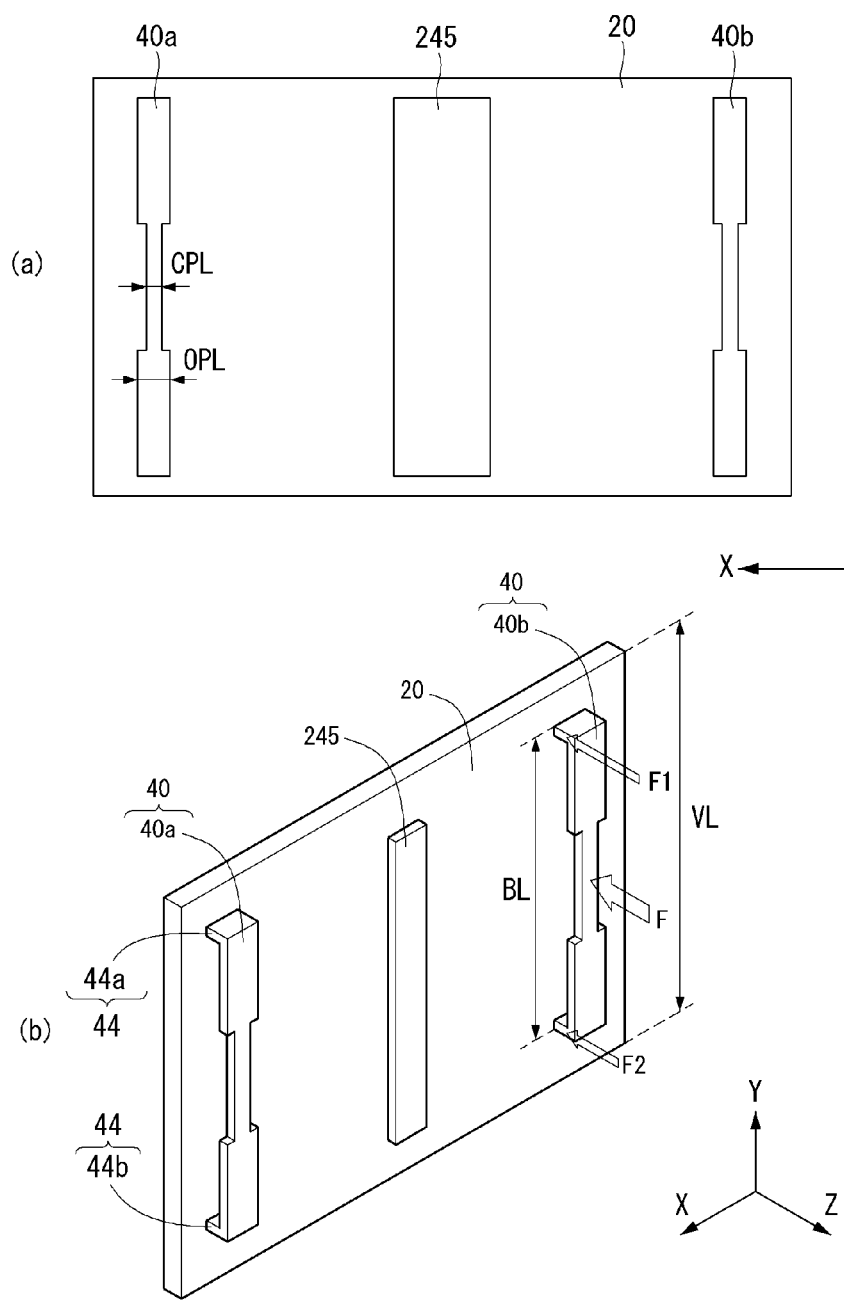

Referring to FIG. 35, the x-axis widths CPL of the portions of the first and second brackets 40, to which external force is applied, may be narrower than the x-axis widths OPL of other portions.

Since the x-axis widths CPL of the portions of the first and second brackets 40, to which external force is applied, are narrower than the x-axis widths OPL of other portions in the display device according to the present invention, the y-axis centers of the first and second brackets 40 can be more bent with the same external force. Accordingly, the display unit 20 can be easily curved even with small force.

Figure 36:
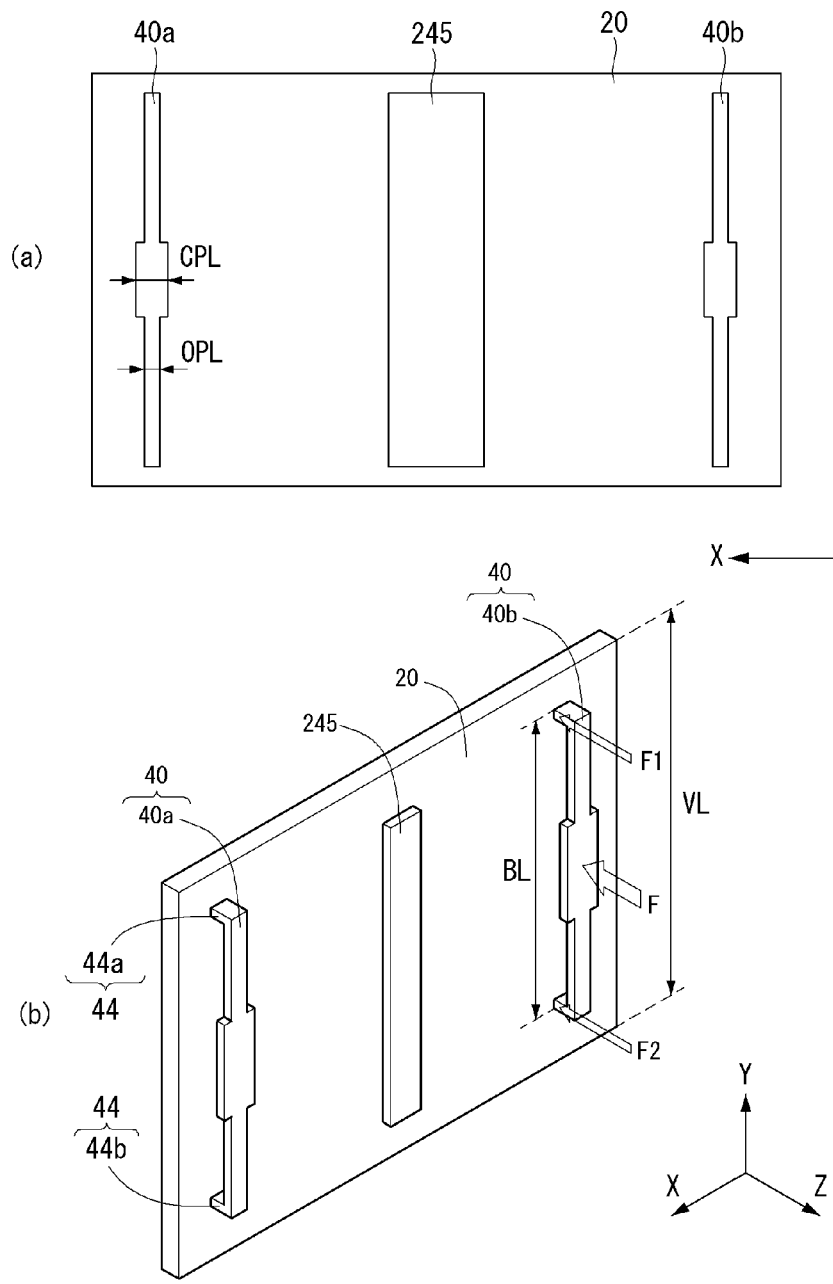

Referring to FIG. 36, the x-axis widths CPL of the portions of the first and second brackets 40, to which the external force is applied, may be greater than the x-axis widths OPL of other portions. Since the x-axis widths CPL of the portions of the first and second brackets 40, to which the external force is applied, are greater than the x-axis widths OPL of other portions in the display device according to the present invention, the first and second brackets 40 can endure a large magnitude of external force. Accordingly, the first and second brackets 40 can support the display unit 20 without being damaged even by strong external force.

Figure 37:
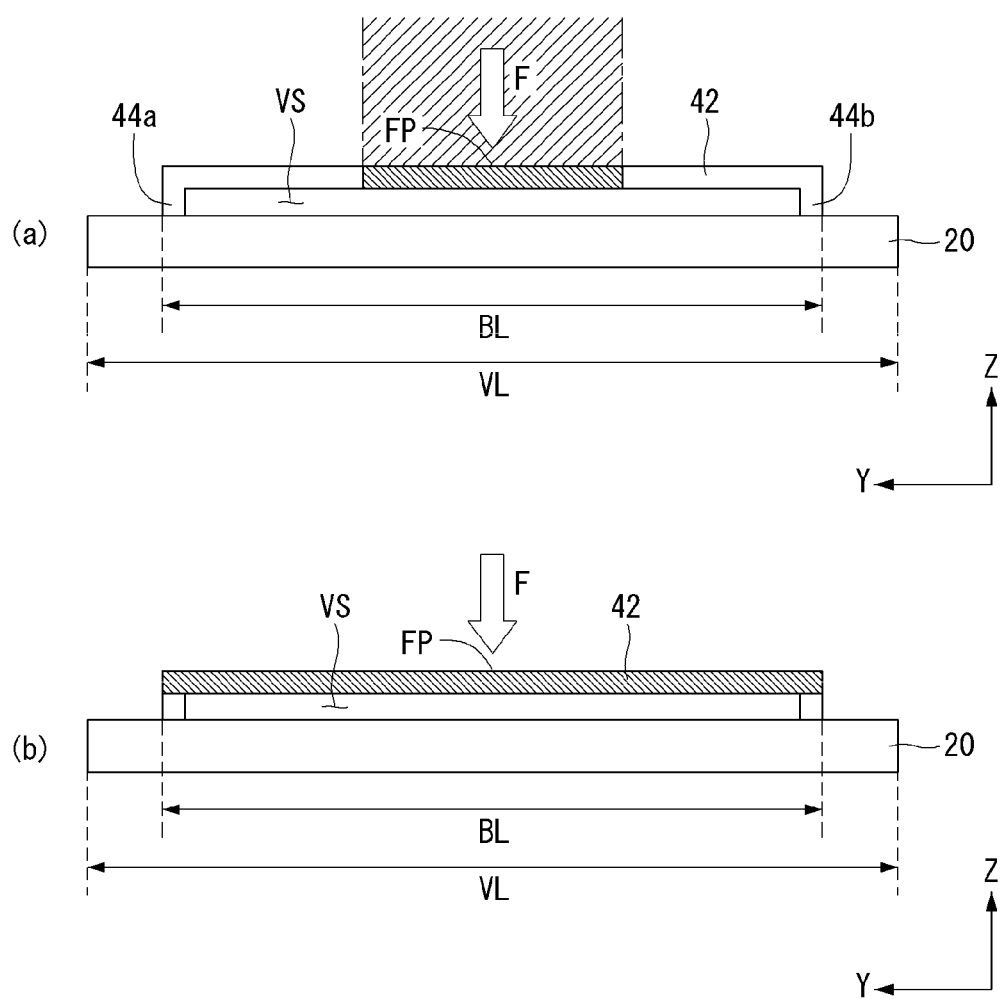

Referring to FIG. 37(*a*), the material of the region VS of the first and second brackets 40, to which external force is applied, may differ from the material of other portions. That is, part of the bracket body 42 can be made of a different material. Specifically, the material of the region VS of the first and second brackets 40, to which external force is applied, may be a material having rigidity.

Since the material of the region VS of the first and second brackets 40, to which external force is applied, has lower rigidity than other portions, the external force applied to the first and second brackets 40 can be well dispersed to both ends thereof.

Referring to FIG. 37(*b*), the material of the protruding portions of the brackets 40 may differ from the material of other portions. That is, the bracket body 42 can be made of a different material from the protruding portions. Specifically, the material of the bracket body 42 may be a material having rigidity.

Since the material of the bracket body 42 is a material having lower rigidity than other portion in the display device according to the present invention, the first and second brackets 40 can endure a high magnitude of external force. Accordingly, the first and second bracket 40 can support the display unit 20 without being damaged even by strong external force.

Figure 38:
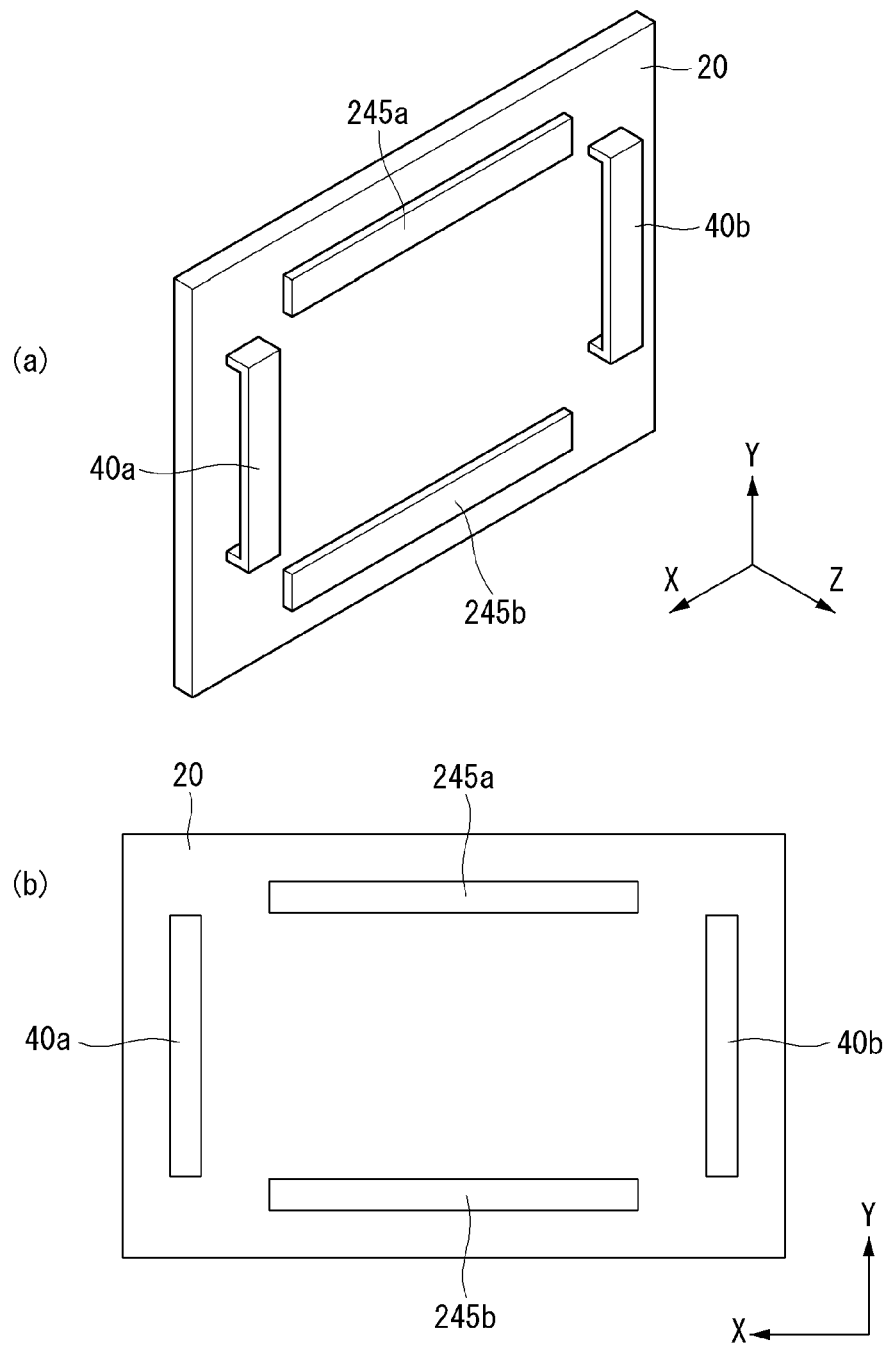

Referring to FIG. 38, housing fixing parts 245*a* and 245*b* may not be provided to the x-axis center of the display unit 20. The housing fixing parts 245*a* and 245*b* may be provided to both sides of the display unit 20 in the y-axis direction and extended in the x-axis direction.

Since the housing fixing parts 245*a* and 245*b* are provided to both sides of the display unit 20 in the y-axis direction and extended in the x-axis direction, the housing fixing parts 245*a* and 245*b* can have higher rigidity compared when provided to the x-axis center of the display unit 20. Accordingly, the display unit 20 can be prevented from being damaged by strong external force.

Figure 39:
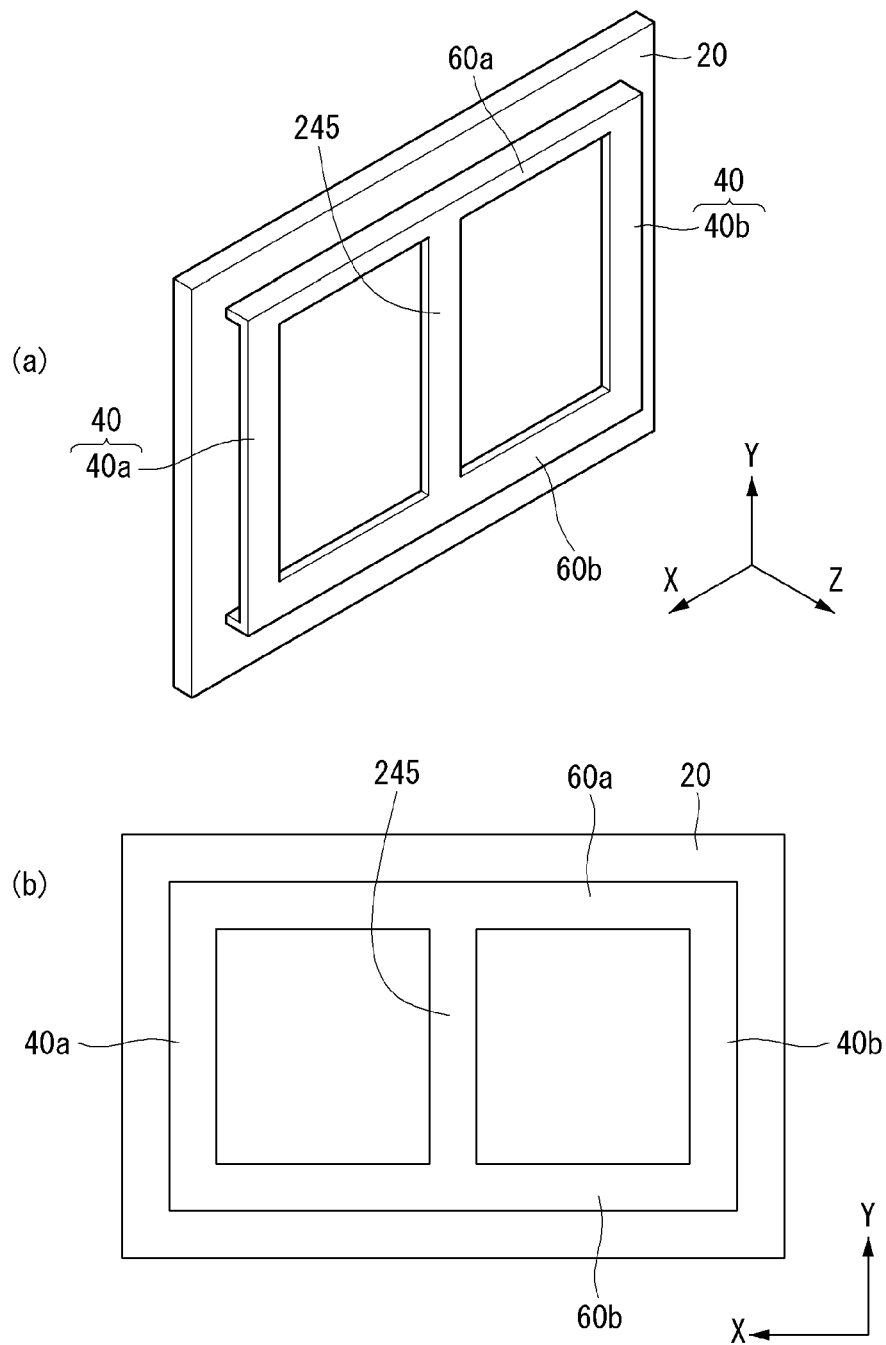

Referring to FIG. 39, the display device according to the present invention may further include third and fourth brackets 60*a* and 60*b* for connecting the housing fixing part 245 to the first and second brackets 40*a* and 40*b*. The third and fourth brackets 60*a* and 60*b* may be provided to both sides of the display unit 20 in the y-axis direction and extended in the x-axis direction.

Since the housing fixing part 245 and the first and second brackets 40*a* and 40*b* are connected by the third and fourth brackets 60*a* and 60*b*, the housing fixing part 245 and the first and second brackets 40*a* and 40*b* can have higher rigidity compared when they are separated from each other. Accordingly, the display unit 20 can be prevented from being damaged by strong external force.

Figure 40:
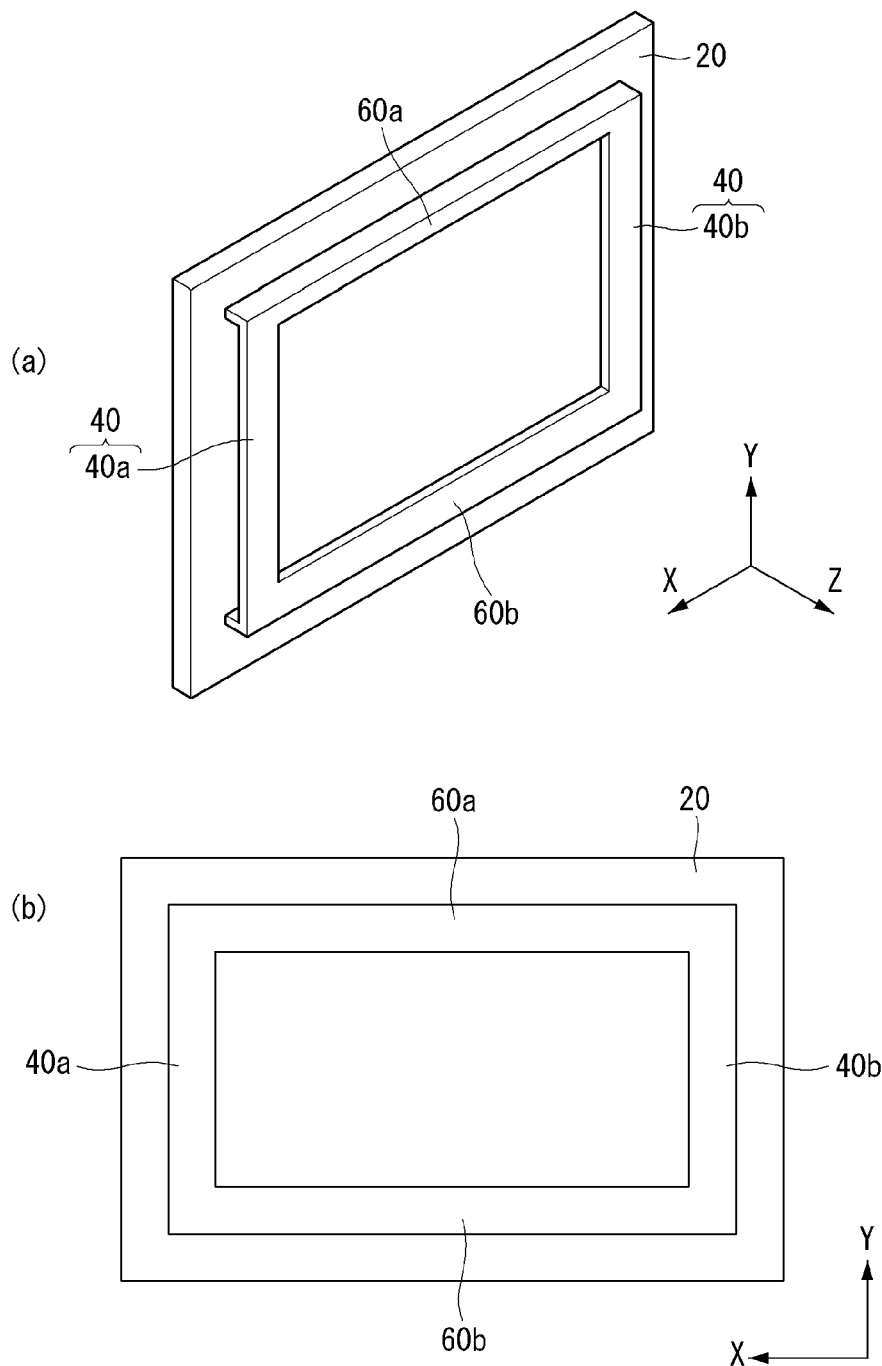

Referring to FIG. 40, the display device according to the present invention may not include the housing fixing part 245. The first and second brackets 40*a* and 40*b* may be connected by the third and fourth brackets 60*a* and 60*b*. The third and fourth brackets 60*a* and 60*b* may be provided to both sides of the display unit 20 in the y-axis direction and extended in the x-axis direction.

Since the first and second brackets 40*a* and 40*b* are connected by the third and fourth brackets 60*a* and 60*b*, the first and second brackets 40*a* and 40*b* can have higher rigidity compared when separated from each other even though the housing fixing part 245 is not provided. Accordingly, the display unit 20 can be prevented from being damaged by strong external force.

Figure 41:
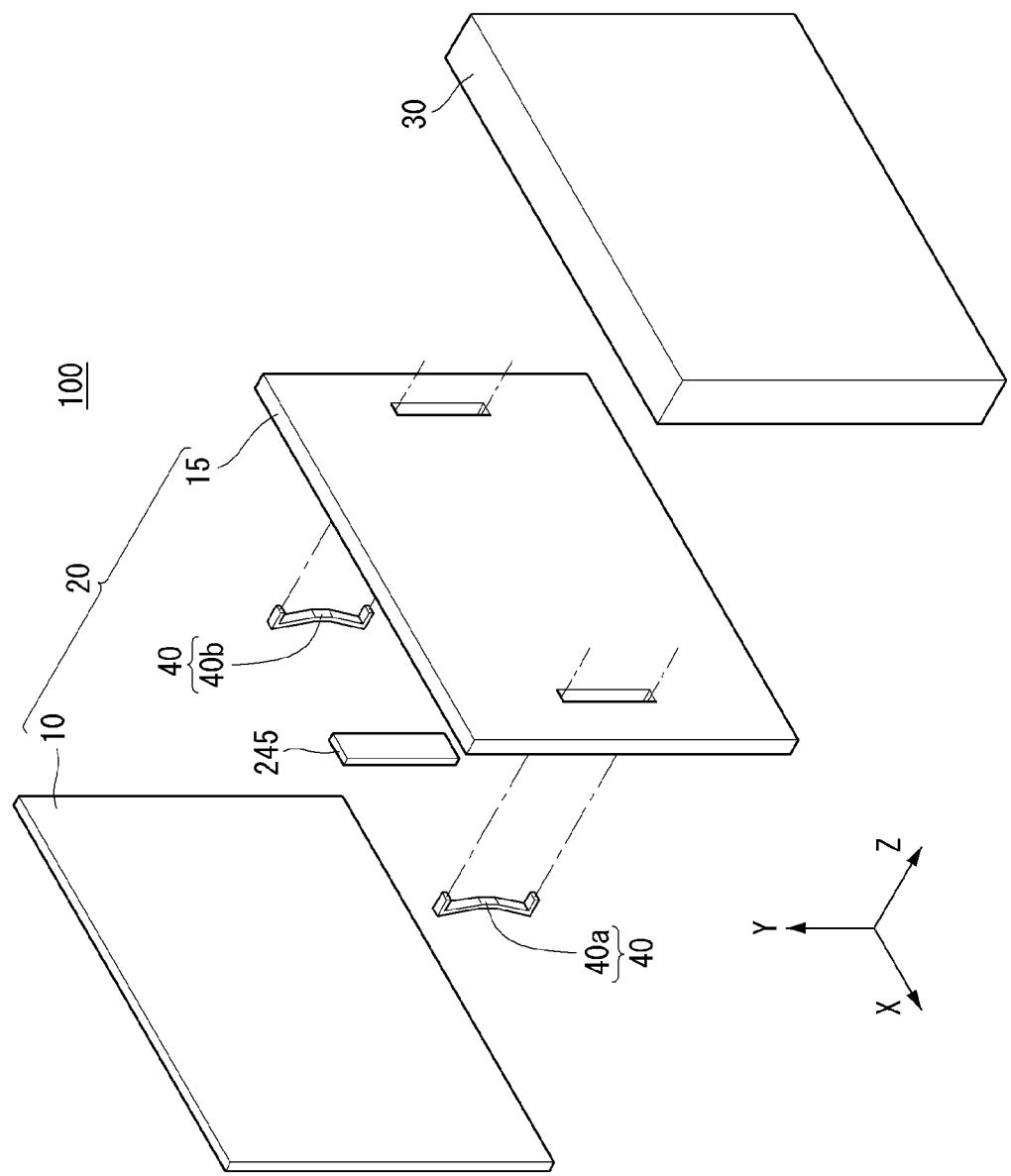
FIGS. 41, 42 and 43 illustrate a configuration of a display device according to another embodiment of the present invention.
Figure 42:
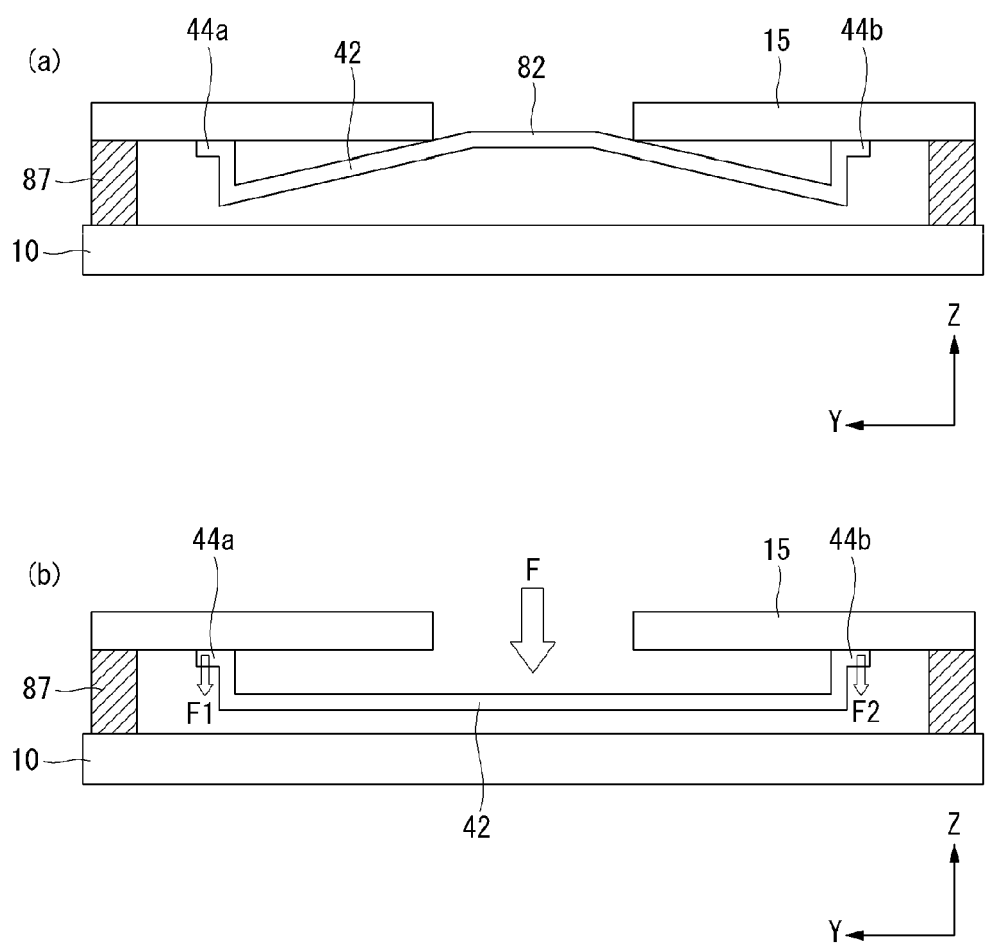
Figure 43:
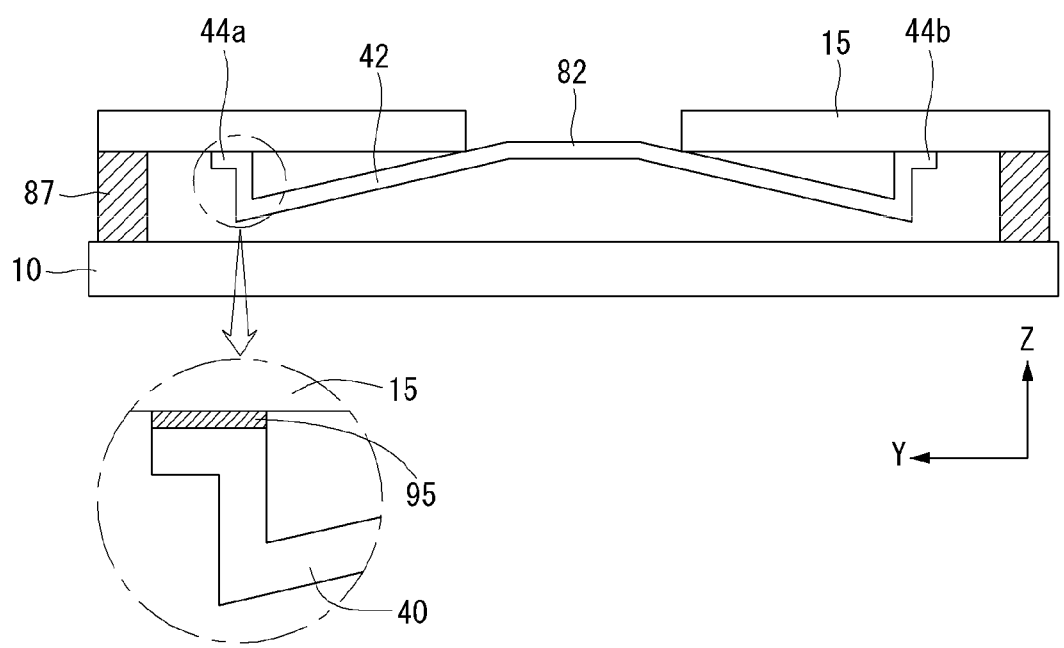

FIGS. 41, 42 and 43 illustrate a display device configuration according to another embodiment of the present invention.

Referring to FIG. 41, the display device 1 according to the present invention may have the housing fixing part 245 and the first and second brackets 40*a* and 40*b* provided to the front side of the module cover 15. Specifically, the housing fixing part 245 may be provided to the center of the front side of the module cover 15 and the first and second brackets 40*a* and 40*b* may be respectively provided to both ends of the module cover 15 in the x-axis direction.

At least one bracket 40 and the housing fixing part 245 may be provided between the display panel 10 and the module cover 15. The at least one bracket 40 and the housing fixing part 245 may be coupled to the module cover 15, which will be described in detail below.

The module cover 15 may have holes formed at centers of both sides thereof in the x-axis direction. The links 50 of the housing 30 can directly push the first and second brackets 40*a* and 40*b* through the holes of the module cover.

Referring to FIG. 42(*a*), the first and second brackets 40 may be provided between the display panel 10 and the module cover 15. The display panel 10 and the module cover 15 can be coupled to each other by a panel adhesive part 87. The panel adhesive part 87 can fix the display panel 10 and the module cover 15 such that the display panel 10 and the module cover 15 are not separated from each other even if external force is applied to the y-axis centers of the first and second brackets 40. However, the present invention is not limited thereto and the panel adhesive part 87 may include a welding metal, screw, rivet or Torx screw. The z-axis length of the panel adhesive part 87 may be less than 6 mm.

The first and second brackets 40 may be coupled to the module cover 15. The first and second brackets 40 may not be coupled to the display panel 10. That is, the first and second brackets 40 may be separated from the display panel 10 by a predetermined distance. The first and second brackets 40 may be inclined in the z-axis direction. The z-axis length of the first and second brackets 40 may be less than that of the panel adhesive part 87.

The first and second brackets 40 may include bracket protruding sections 82. The bracket protruding sections 82 may be portions pushed by the links 50. The positions of the bracket protruding sections 82 may correspond to the positions of the holes of the module cover 15. The links 50 can directly push the bracket protruding sections 82 through the holes of the module cover 15. Since the links 50 directly push the first and second brackets 40, the display panel 10 can be curved with weak force.

Referring to FIG. 42(*b*), when external force F is applied to the bracket protruding sections 82, the external force F can be dispersed to the first and second bracket coupling portions 44*a* and 44*b*. The first and second bracket coupling portions 44*a* and 44*b* may be portions extended from the bracket body 41 in the z-axis direction. Specifically, when the external force F is applied to the bracket protruding sections 82, the bracket body 42 inclined in the z-axis direction can gradually become flat. When the bracket body 42 becomes flat, first and second external forces F1 and F2 can be respectively dispersed to the first and second bracket coupling portions 44a and 44b. The sum of the first and second external forces F1 and F2 may equal the external force F. The first and second external forces F1 and F2 may have the same magnitude. However, the present invention is not limited thereto and the first and second external forces F1 and F2 may have the different magnitudes.

Referring to FIG. 43, the first and second bracket coupling portions 44a and 44b may be coupled to the module cover 15 through a second adhesive part 95. The second adhesive part 95 can fix the module cover 15 and the first and second brackets 40 such that the first and second brackets 40 are not separated from the module cover 15 even if external force is applied to the centers of the first and second brackets 40. For example, the second adhesive part 95 can include a double-sided tape. However, the present invention is not limited thereto and the second adhesive part 95 may include a welding metal, screw, rivet or Torx screw.

The housing fixing part 245 and the first and second brackets 40a and 40b are provided between the display panel 10 and the module cover 15 in the display device according to the present invention, the appearance of the module cover 15 can be neat.

FIGS. 44 to 50 are diagrams illustrating the display device according to the present invention in more detail.

Figure 44:
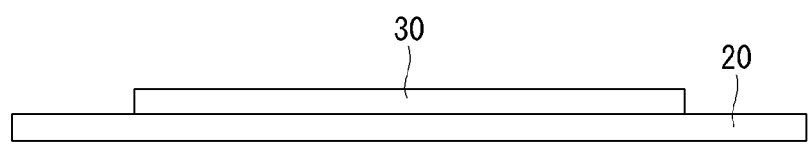
FIGS. 44 to 50 are diagrams for describing the display device according to the present invention in detail.
Figure 44:
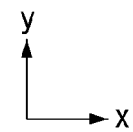
Figure 44:
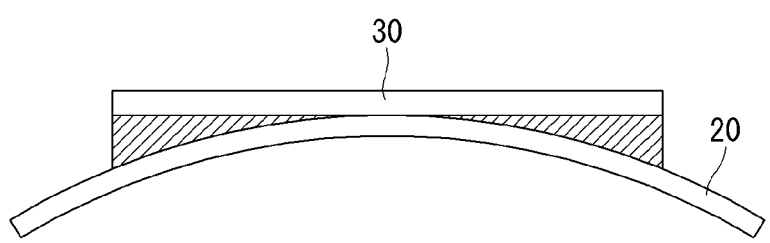

Referring to FIG. 44, the housing 30 of the display device 1 can be maintained in a flat shape even when the display unit 20 is curved. In this case, the left and right sides of the housing 30 are separated from the left and right sides of the display unit 20 so as to form spaces therein. Accordingly, patterns or terminal parts of the housing 30 may be exposed to users when the housing is viewed from the side.

Figure 45:
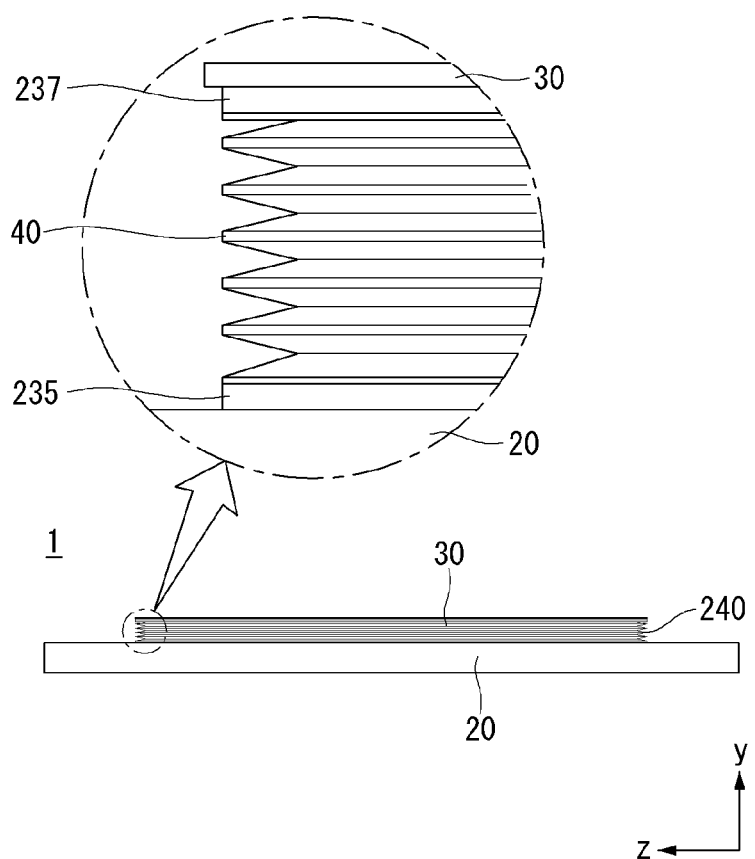
Figure 46:
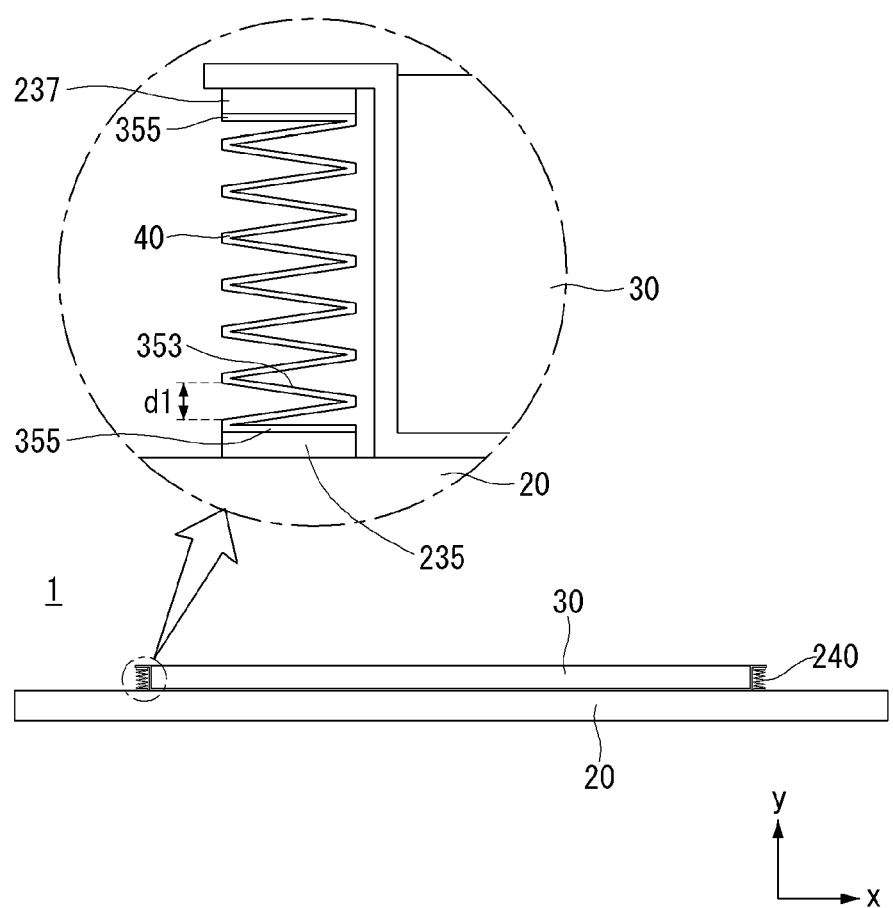

Referring to FIGS. 45 and 46, the display device 1 according to the present invention may include a shielding part 240, a first fixing part 237 and a second fixing part 235 which are provided to the side of the housing 30. The shielding part 240, the first fixing part 237 and the second fixing part 235 may be provided to the left and right edges of the housing 30 except for the upper and lower sides of the housing.

The upper parts of the left and right edges of the housing 30 can protrude. The protruding parts can be coupled to the shielding part 240 through the first fixing part 237.

The shielding part 240 may be folded multiple times in the x-axis direction in an accordion shape. The shielding part 240 may have an accordion shape extended in the first direction (z-axis). The shielding part 240 may have a first distance dl between a first shielding face 353 and a second shielding face 355 when the display unit 20 is flat. The distance between the first shielding face 353 and the second shielding face 355 of the shielding part 240 is variable. The shielding part 240 can connect the display unit 20 and the left and right edges of the housing 30 through the first fixing part 237 and the second fixing part 235. A method of connecting the shielding part 240 and the display unit 20 or the housing 30 will be described below. The shielding part 240 can shield the left and right sides of the housing 30 by being coupled to the protruding upper parts of the left and right edges of the housing 30.

The first fixing part 237 can connect the housing 30 and the shielding part 240. The first fixing part 237 may have a plate shape corresponding to the upper surface of the shielding part 240. The first fixing part 237 may have a plate shape extended in the first direction (z-axis) of FIG. 45.

The second fixing part 235 can connect the display unit 20 and the housing 30. The second fixing part 235 may have a plate shape corresponding to the lower surface of the shielding part 240. The second fixing part 235 may have a plate shape extended in the first direction (z-axis) of FIG. 45.

Figure 47:
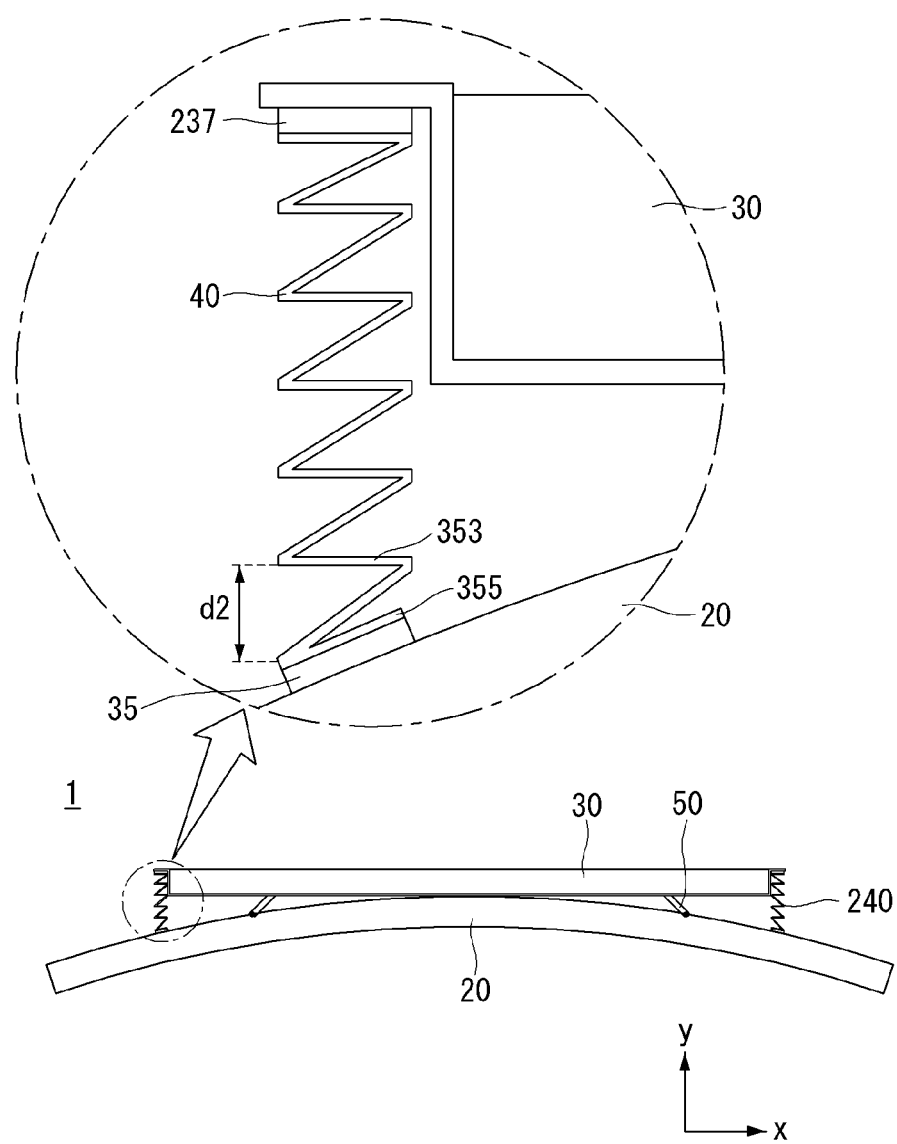

Referring to FIG. 47, the shielding part 240 can have a second distance d2 between the first shielding face 353 and the second shielding face 355 when the display unit 20 is curved. The second distance d2 is greater than the first distance dl when the display unit 20 is flat.

The length of the shielding part 240 in the second direction (y-axis) can be increased by the distance between the left and right sides of the housing 30 and the left and right sides of the display unit 20. Accordingly, the side of the housing 30 can be covered by the shielding part 240 even when the left and right sides of the housing 30 are separated from the left and right sides of the display unit 20.

Figure 48:
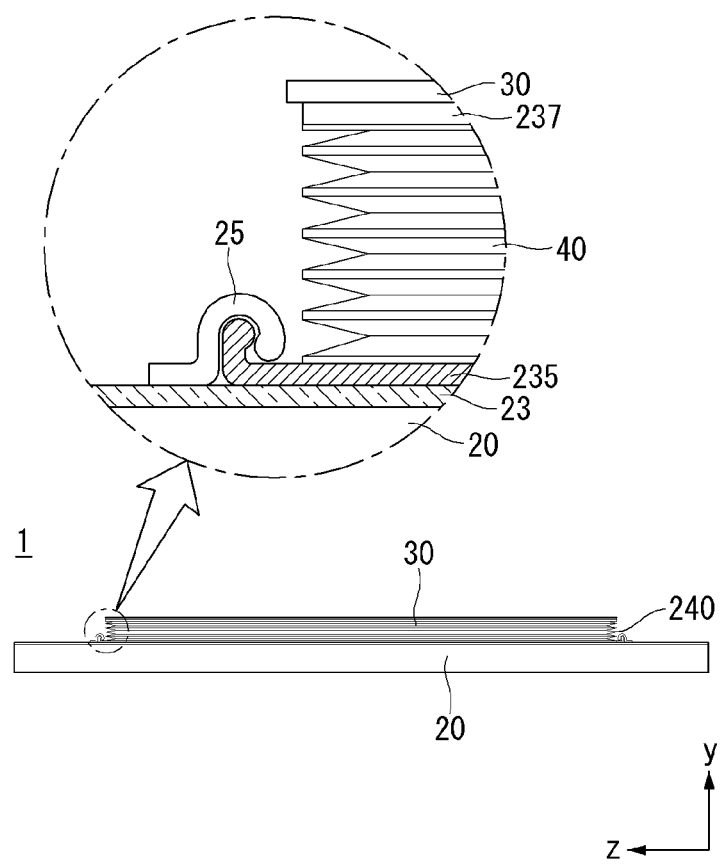

Referring to FIG. 48, the display device 1 according to the present invention may include a coupling part 23 provided to the rear side of the display unit 20. The coupling part 23 may be a thin part provided to the surface of the rear side of the display unit 20.

The coupling part 23 may include a material having a first polarity. In this case, the second fixing part 235 may include a material having a second polarity opposite the first polarity. When materials having opposite polarities come into contact with each other, the materials are not separated from each other according to magnetic force unless a force of greater than a threshold is applied thereto. Accordingly, the coupling part 23 and the second fixing part 235 can be coupled to each other. Since the fixing part 235 is coupled to the shielding part 240, the shielding part 240 and the coupling part 23 can be coupled to each other.

To fix the second fixing part 235, latches 25 may be provided to both ends of the second fixing part 235 in the first direction (z-axis). The latches 25 can be bent toward the second fixing part 235. The bent portions of the latch 25 can engage with both ends of the second fixing part 235 in the first direction (z-axis). Accordingly, the second fixing part 235 is not easily separated even when a force of greater than the threshold is applied thereto.

Figure 49:
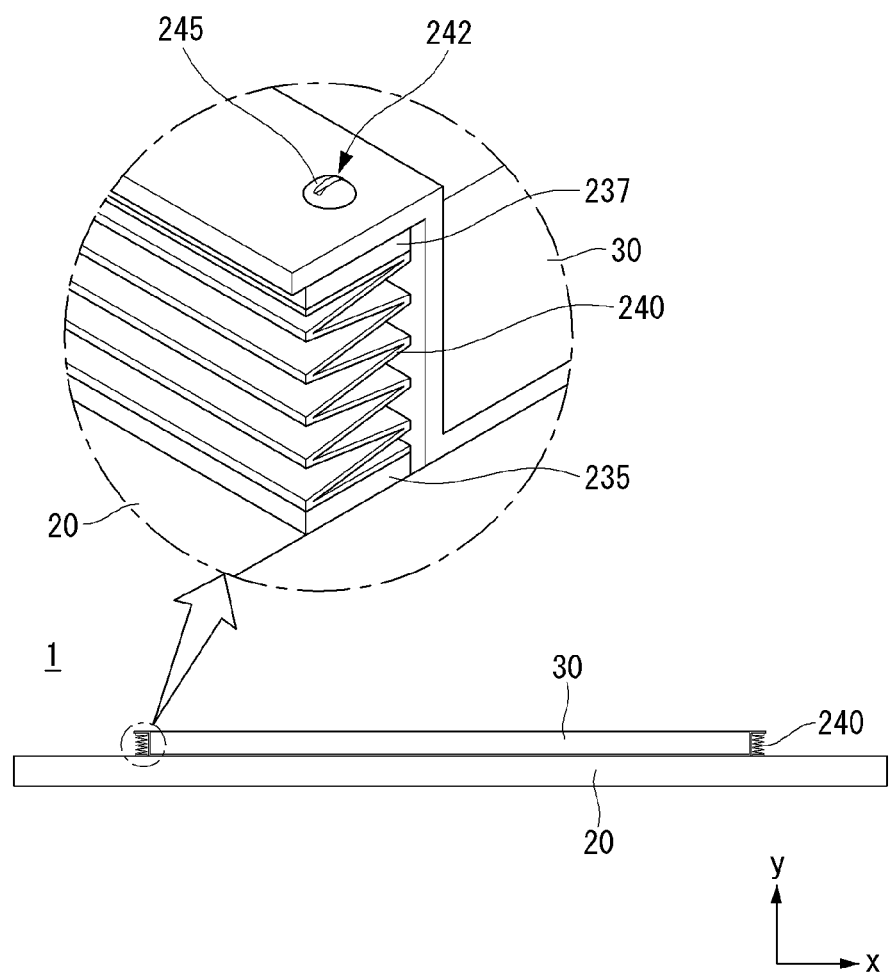
Figure 50:
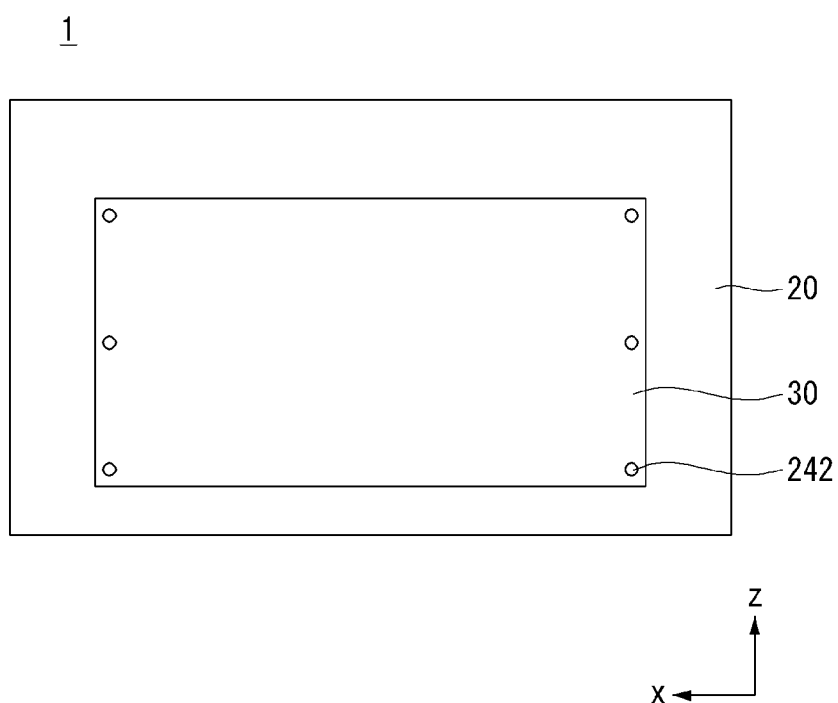

Referring to FIGS. 49 and 50, the display device 1 according to the present invention may include fastening parts 242 provided to the protruding parts of the housing 30. The fastening parts 242 can be provided to both edges of the housing 30 in the third direction (x-axis). Specifically, the fastening parts 242 can be provided to upper, center and lower parts of both edges of the housing 30 in the third direction (x-axis). However, the present invention is not limited thereto and the fastening part 242 may be provided to other portions of both edges of the housing 30 in the third direction (x-axis).

The fastening parts 242 can be coupled to the first fixing part 237 and the shielding part 240 by fastening devices 245. For example, the fastening parts 242 can have a nut shape and the fastening devices 245 can have a bolt shape. The housing 30, the first fixing part 237 and the shielding part 240 are not separated from each other since the housing 30, the first fixing part 237 and the shielding part 240 are coupled by the fastening devices 245.

Figure 51:
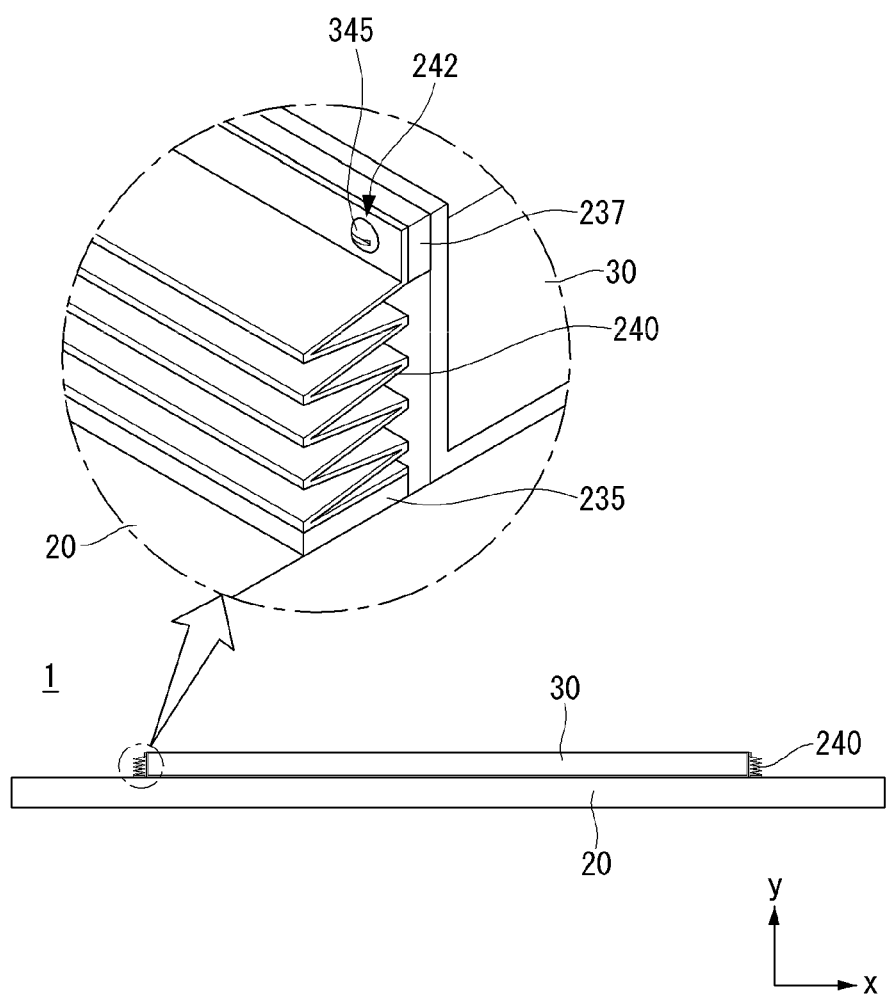
FIG. 51 illustrates a configuration of a display device according to another embodiment of the present invention.

FIG. 51 illustrates a display device configuration according to another embodiment of the present invention.

Referring to FIG. 51, the upper parts of the left and right edges of the housing 30 may not protrude. The shielding part 240 and the first fixing part 237 can be directly fastened to both edges of the housing 30 in the third direction (x-axis).

The upper surface of the shielding part 240 can face the side of the housing 30. In other words, the upper surface of the shielding part 240 can be provided in parallel with the second direction (y-axis). Accordingly, the upper surface of the shielding part 240 may not be completely bent.

The fastening parts 242 may be provided to the shielding part 240 instead of the housing 30. In this case, the fastening devices 245 can be coupled to the fastening parts 242 in the shielding part 240. The shielding part 240, the first fixing part 237 and the housing 30 can be coupled by the fastening devices 245.

Since the upper parts of the left and right edges of the housing 30 do not protrude, the manufacturing process and costs of the display device 1 can be reduced.

Figure 52:
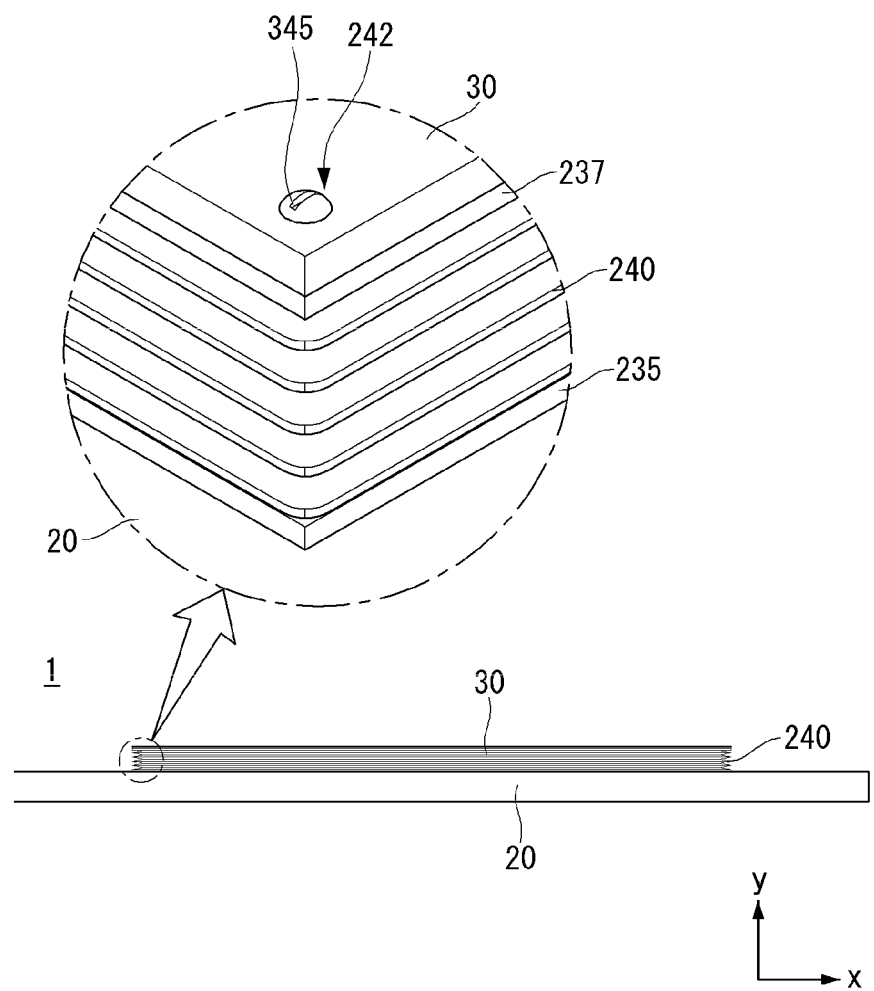
FIGS. 52, 53 and 54 illustrate a configuration of a display device according to another embodiment of the present invention.
Figure 53:
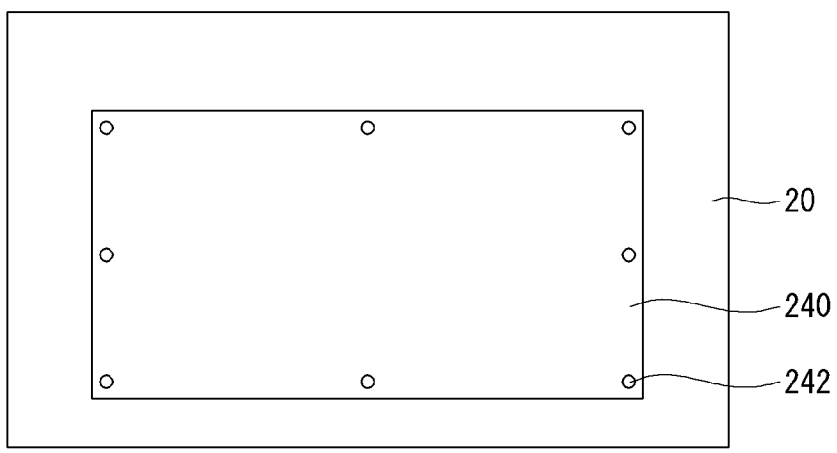
Figure 54:
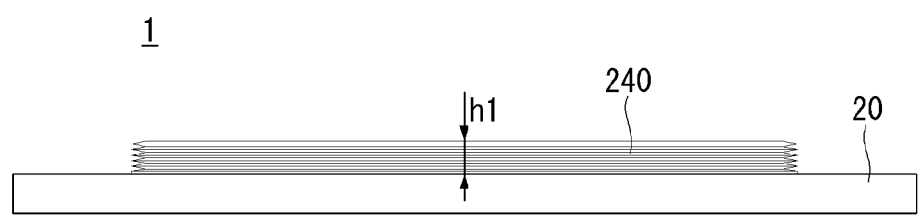
Figure 54:
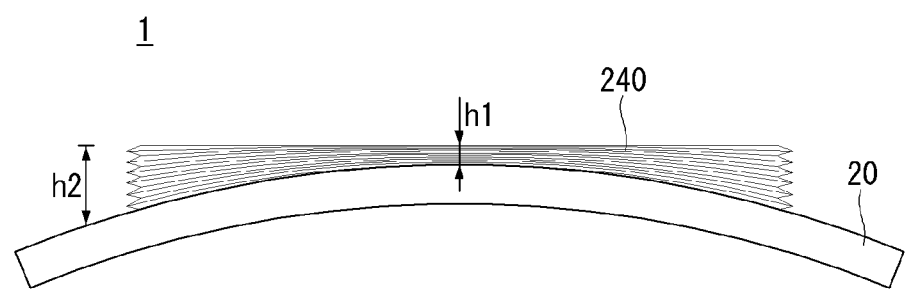
Figure 54:
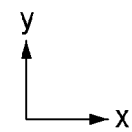

FIGS. 52, 53 and 54 illustrate a display device configuration according to another embodiment of the present invention.

Referring to FIGS. 52 and 53, the shielding part 240 may be provided to not only the left and right sides of the housing 20 but also the upper part of the housing 30. In addition, the housing 30 may protrude from not only both ends thereof in the third direction (x-axis) but also both ends thereof in the first direction (z-axis).

The fastening parts 242 can be provided to not only upper, center and lower parts of both edges of the housing 30 in the third direction (x-axis) but also centers of both edges in the first direction (z-axis), as shown in FIG. 53. However, the present invention is not limited thereto and the fastening parts 242 may be provided to any portions of the edges of the housing 30.

According to the present invention, the upper body and low body of the housing 30 can be shielded.

Referring to FIG. 54, the shielding part 240 can have a first height h1 which is constant in the second direction (y-axis) when the display unit 20 is flat.

When the display unit 20 is curved, while the center of the shielding part 240 can have the first height h1, both ends of the shielding part 240 in the second direction (y-axis) may have a second height h2. The second height h2 may be greater than the first height h1.

Since the shielding part 240 of the display device 1 according to the present invention has an accordion shape, the side of the housing 30 can be completely shielded by adjusting a bending degree of the accordion shape even if the center and both ends of the shielding part 240 have different heights.

Figure 55:
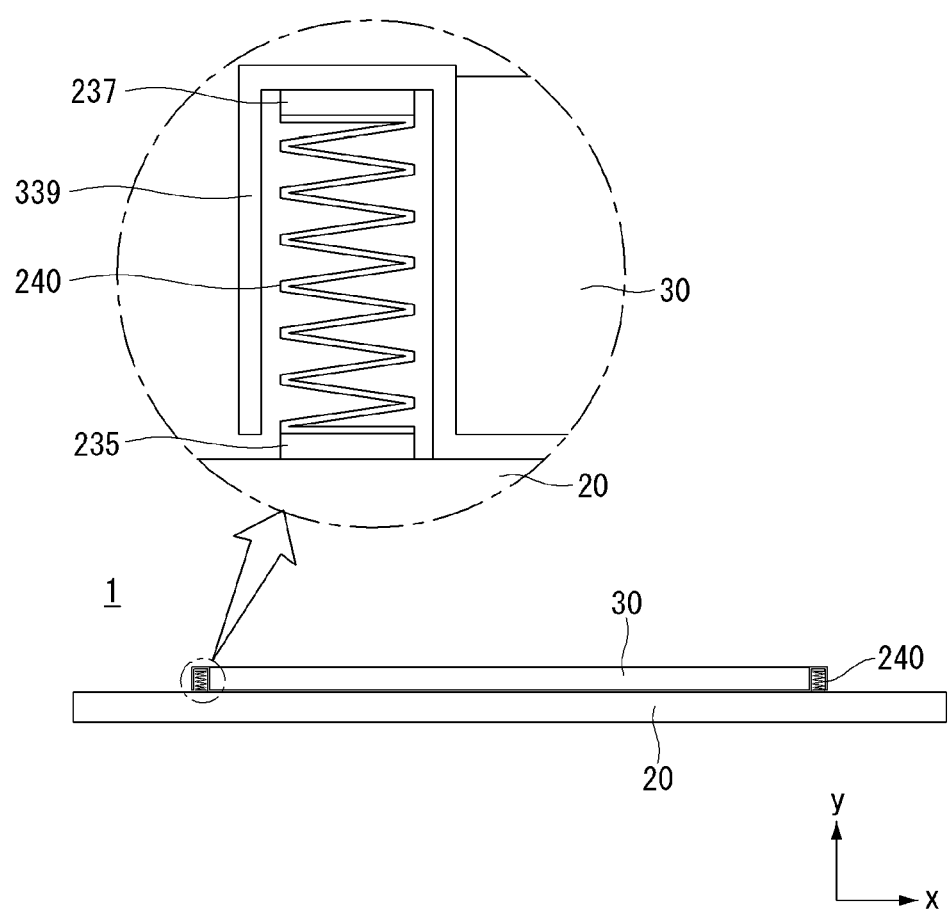
FIGS. 55 and 56 illustrate a configuration of a display device according to another embodiment of the present invention.
Figure 56:
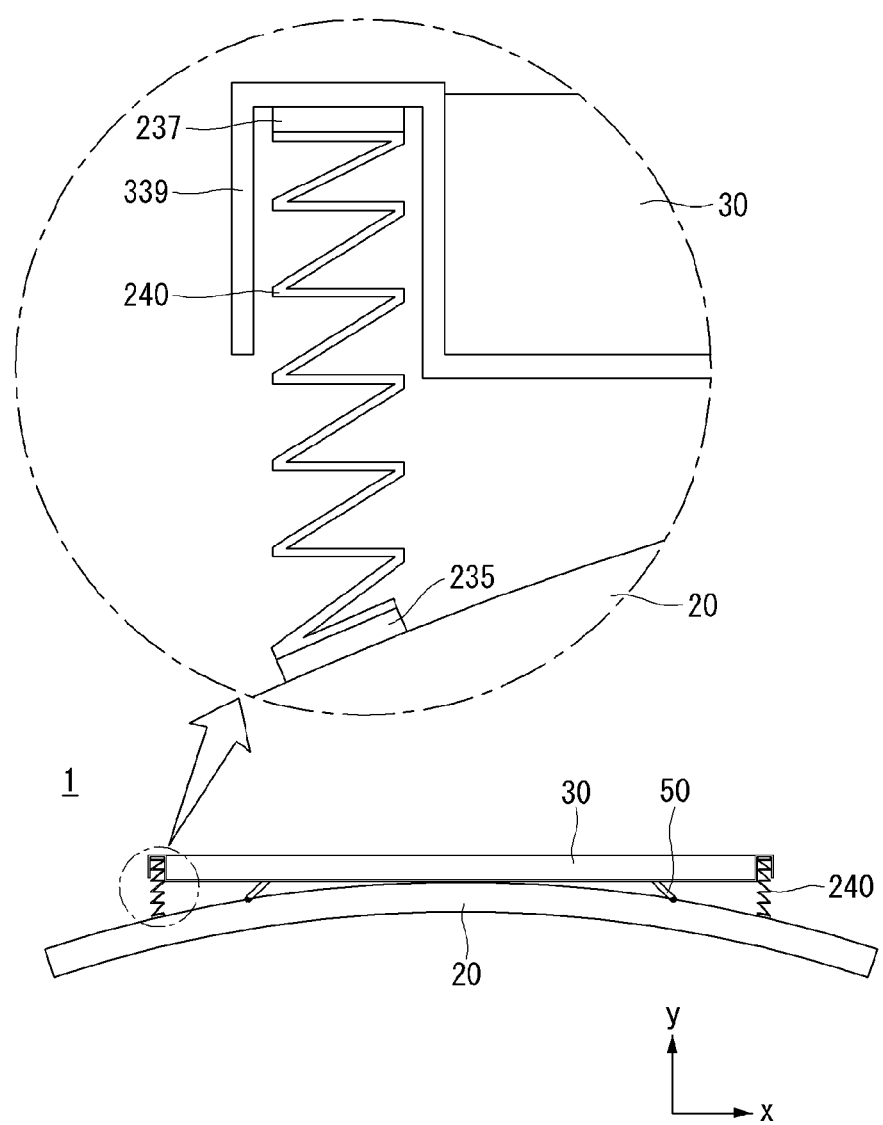

FIGS. 55 and 56 illustrate a display device configuration according to another embodiment of the present invention.

Referring to FIG. 55, the display device 1 according to the present invention may include extended portions 339 at the protruding portions of both ends of the housing 30 in the x-axis direction. The extended portions 339 can be extended from the protruding portions of the housing to the display unit 20. The extended portions 339 may include a first region extended from the housing in parallel with the display unit 20 and a second region extended from the end of the first region in the direction of the display unit 20. The first region and the second region can cover the shielding part.

The extended portions 339 can cover the shielding part 240 at both ends of the housing 30 in the x-axis direction. The y-axis length of the extended portions 339 may correspond to the length of the housing 30 in the first direction (y-axis). Accordingly, the extended portions 339 and the housing 30 can cover both ends of the shielding part 240 in the third direction (x-axis).

Referring to FIG. 56, the height of the shielding part 240 in the second direction (y-axis) may be greater than the height of the extended portions 339 in the second direction (y-axis) when the display unit 20 is curved. In this case, the shielding part 240 may be exposed when the display unit 20 is curved.

In the display device 1 according to the present invention, the shielding part 240 may not be exposed when the display unit 20 is flat. In this case, the flat shape of the extended portions 339 instead of the bent shape of the shielding part 240 is seen to users, and thus the design of the display device becomes simple.

Figure 57:
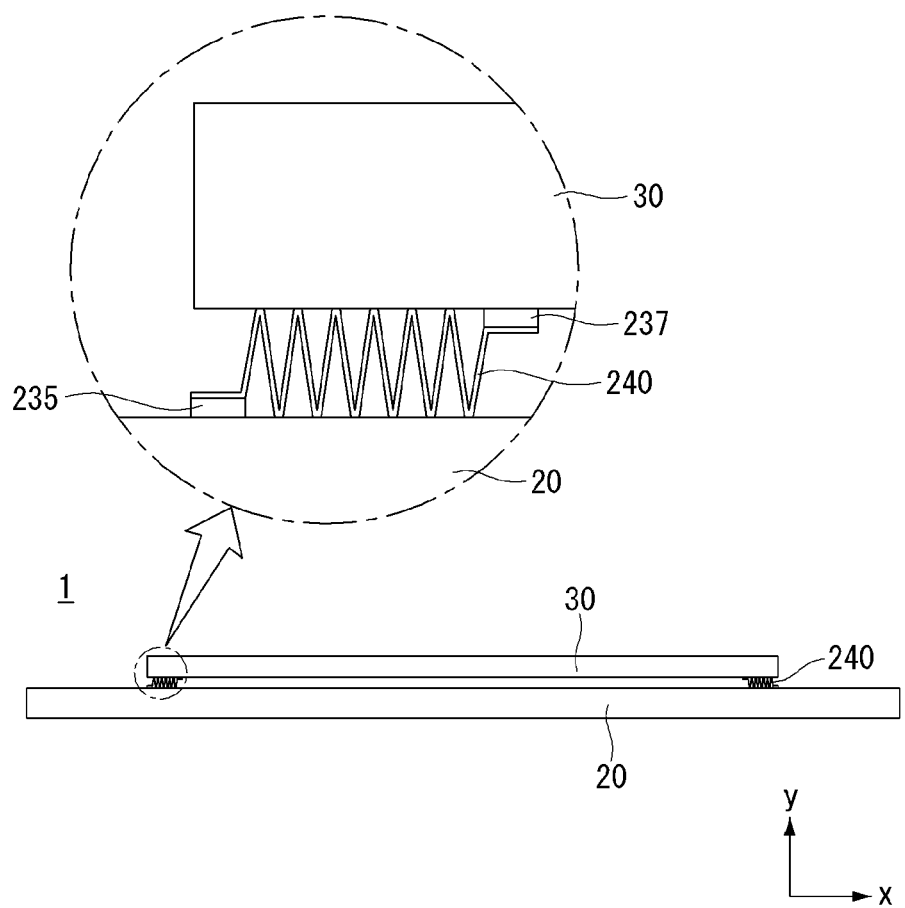
FIGS. 57 and 58 illustrate a configuration of a display device according to another embodiment of the present invention.
Figure 58:
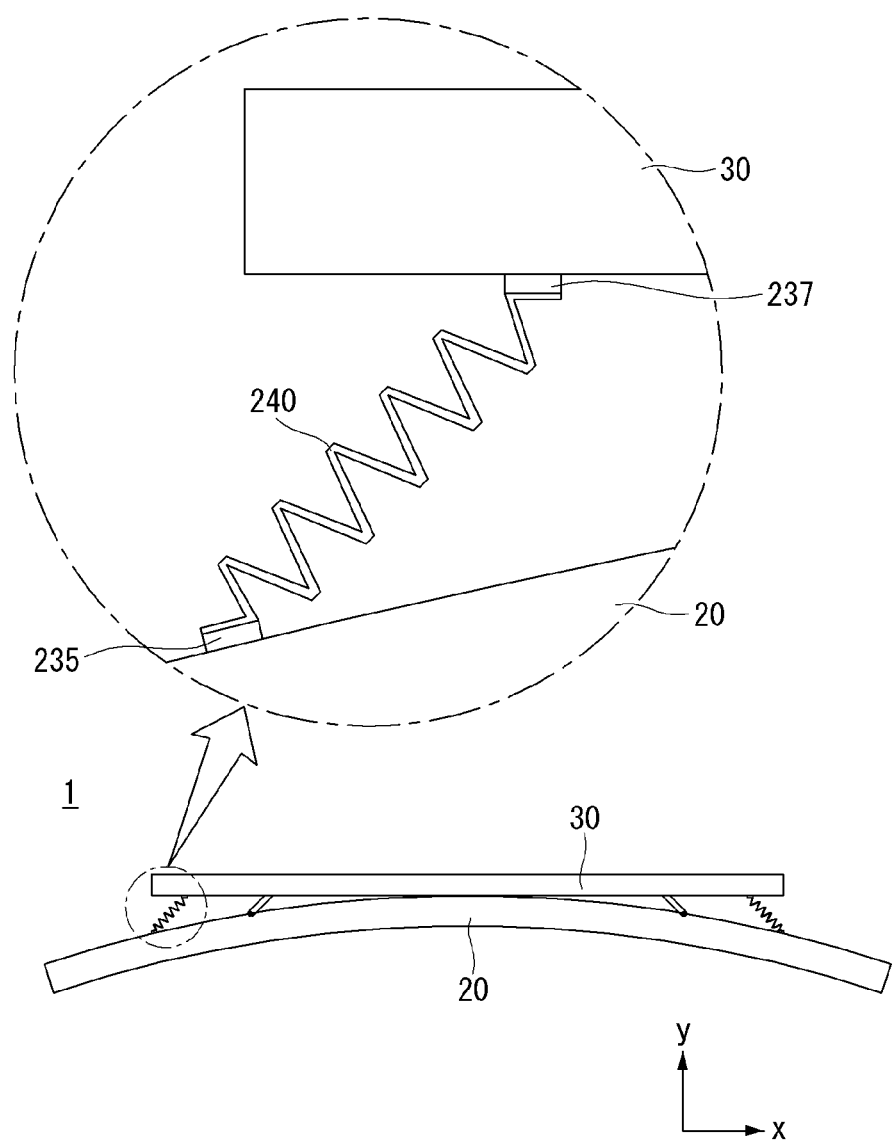

FIGS. 57 and 58 are diagrams illustrating a configuration of a display device according to another embodiment of the present invention.

Referring to FIG. 57, in the display device 1 according to the present invention, the shielding part 240 may be horizontally arranged in the direction of the center of the display unit 20. That is, the shielding part 240 may be folded multiple times in parallel with the direction of the thickness of the display unit 20. The shielding part 240 may be horizontally arranged in the third direction (x-axis). In other words, the shielding part 240 may be bent multiple times in a second direction (y-axis) and positioned between the display unit 20 and the housing 30.

The upper side of the shielding part 240 may face the front side of the housing 30. In other words, the upper side of the shielding part 240 may be provided in parallel with the third direction (x-axis). Accordingly, the upper side of the shielding part 240 may not be completely bent.

The lower side of the shielding part 240 may face the rear side of the housing 30. In other words, the lower side of the shielding part 240 may be provided in parallel with the third direction (x-axis). Accordingly, the lower side of the shielding part 240 may not be completely bent.

When the display unit 20 is flat, the shielding part 240 may be positioned between the display unit 20 and the housing 30. Accordingly, the housing 30 can be separated from the display unit 20 by the width of the shielding part 240 in the second direction (y-axis).

Referring to FIG. 58, the shielding part 240 may be extended in the second direction (y-axis) when the display unit 20 is curved forward. The shielding part 240 may be gradually rotated in the second direction (y-axis) from the state in which the shielding part 240 is disposed in the third direction (x-axis). That is, the shielding part 240 can be unfolded so as to shield the outer circumference of the housing 30 as the display unit 20 is curved forward.

Since the shielding part 240 of the display device 1 according to the present invention is horizontally arranged when the display unit 20 is flat, the shielding part 240 can less affect the height of the housing 30 in the second direction (y-axis). Accordingly, the height of the housing 30 in the second direction (y-axis) can be reduced.

FIGS. 59 to 66 are diagrams illustrating a configuration of a display device according to another embodiment of the present invention.

Figure 59:
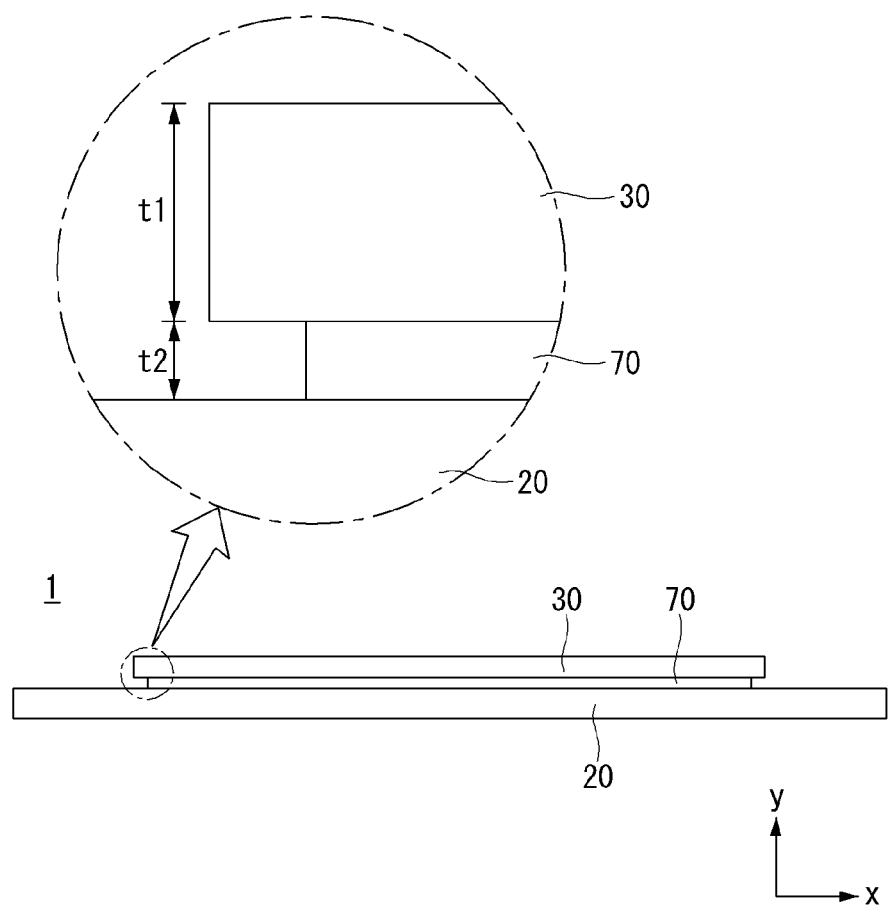
FIGS. 59 to 66 illustrate a configuration of a display device according to another embodiment of the present invention.

Referring to FIG. 59, the display device 1 according to the present invention may have a shielding box 70 provided between the display unit 20 and the housing 30. The shielding box 70 may have a rectangular shape. However, the present invention is not limited thereto and the shielding box 70 may have a cubic, cylindrical or triangular-prism shape.

The height t2 of the shielding box 70 may be considerably lower than the height t1 of the housing 30. The length of one side of the shielding box 70 may be less than that of the housing 30. That is, the shielding box 70 may be provided to a part except for the edge of the housing 30 between the display unit 20 and the housing 30.

Figure 60:
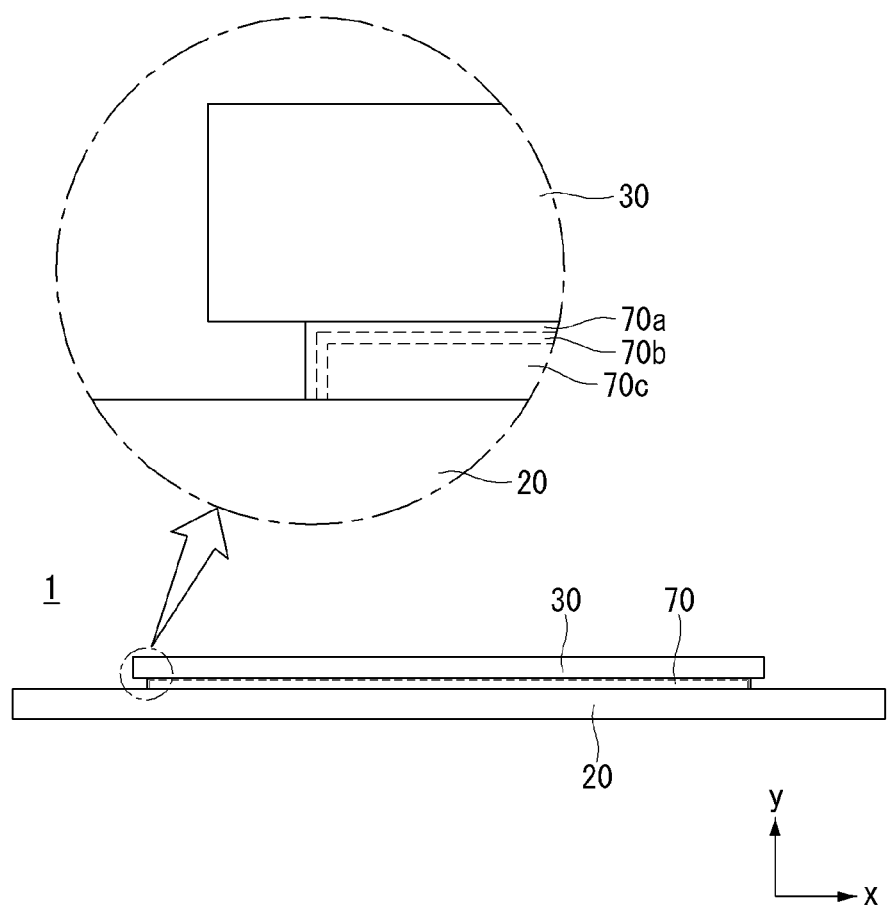
Figure 61:
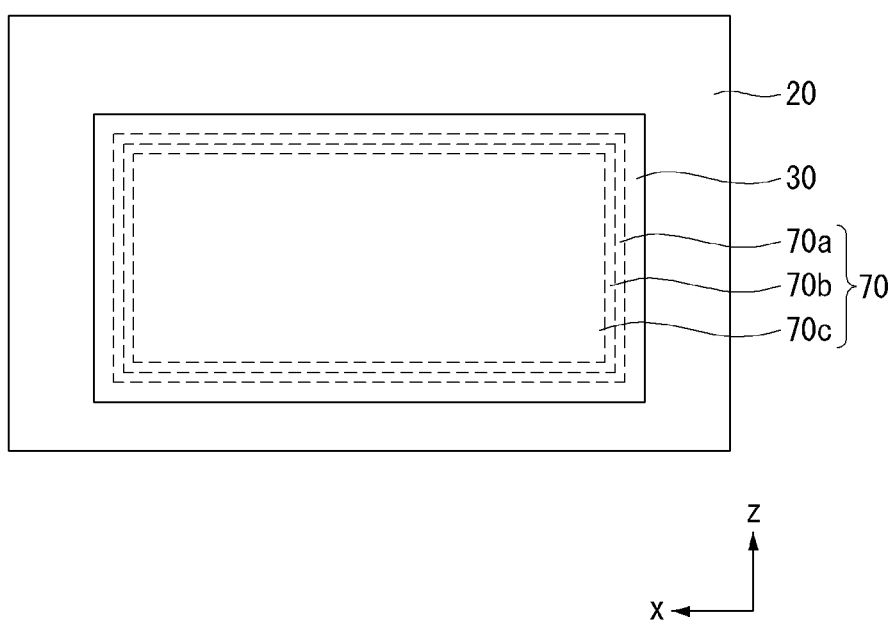

Referring to FIGS. 60 and 61, the shielding box 70 may include a plurality of shielding boxes 70a, 70b and 70c. While three shielding boxes are shown in the figures, the present invention is not limited thereto and the shielding box 70 may include four or more shielding boxes.

The length of one side of the first shielding box 70a may be greater than the second and third shielding boxes 70b and 70c. The height of the first shielding box 70a may be greater than the second and third shielding boxes 70b and 70c. In other words, the first shielding box 70a may cover the second and third shielding boxes 70b and 70c.

The length of one side of the second shielding box 70b may be greater than that of the third shielding box 70c. The height of the second shielding box 70b may be greater than that of the third shielding box 70c. In other words, the second shielding box 70b may cover the third shielding box 70c.

Figure 62:
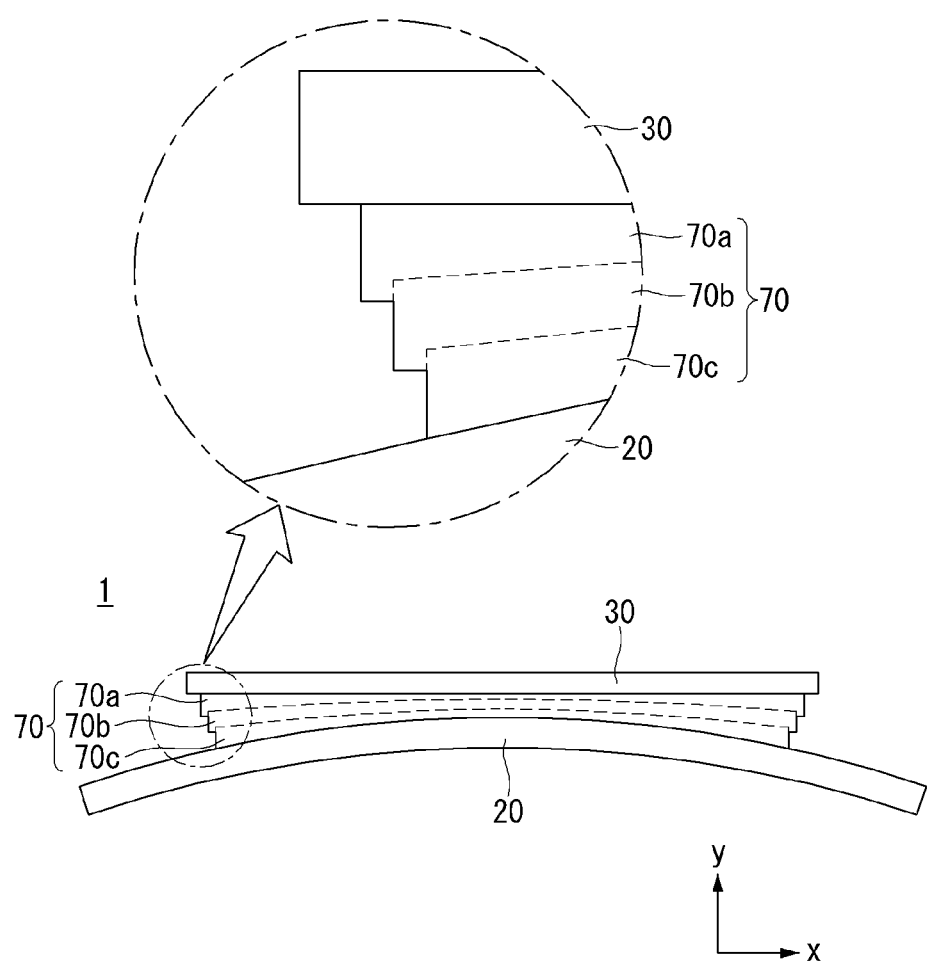

Referring to FIG. 62, the shielding boxes 70 may be elevated one by one in the second direction (y-axis) when the display unit 20 is curved. That is, the first shielding box 70a may be preferentially elevated in the second direction (y-axis) as the display unit 20 is curved. Subsequently, the second and third shielding boxes 70b and 70c may be sequentially elevated in the second direction (y-axis). The first, second and third shielding boxes 70a, 70b and 70c may be combined such that the first, second and third shielding boxes 70a, 70b and 70c are not separated even when elevated in the second direction (y-axis). Combination of the first, second and third shielding boxes 70a, 70b and 70c will be described below.

Figure 63:
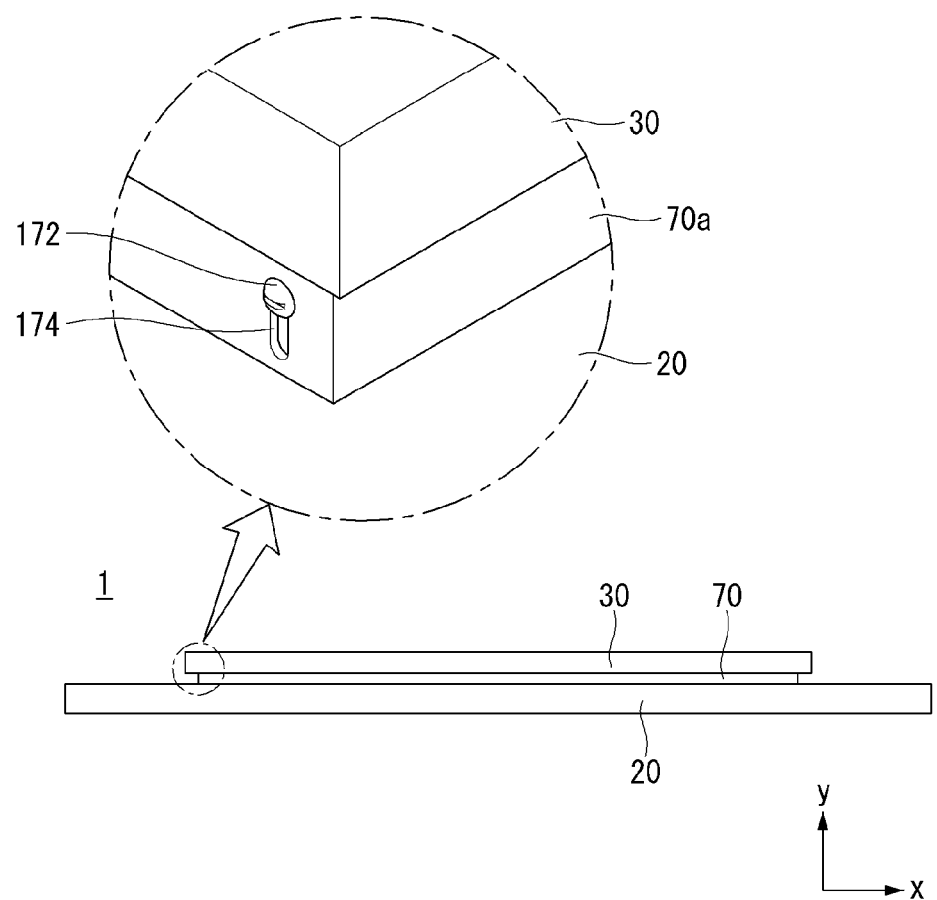
Figure 64:
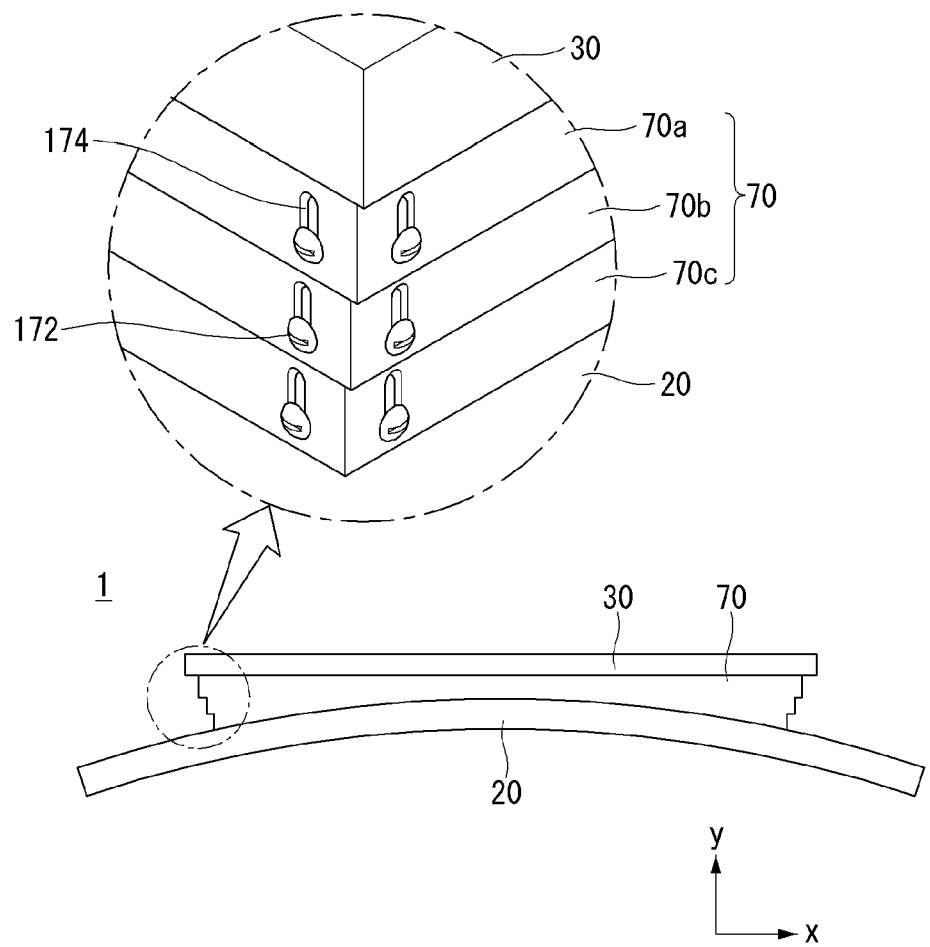

Referring to FIGS. 63 and 64, the first and second shielding boxes 70a and 70b can be combined with each other. The sides of the first and second shielding boxes 70a and 70b may be combined with each other by means of a first coupling pin 172. The first coupling pin 172 may penetrate a first coupling guide 174 so as to combine the first and second shielding boxes 70a and 70b. The second and third shielding boxes 70b and 70c may be combined with each other. The sides of the second and third shielding boxes 70b and 70c may be combined with each other by means of the first coupling pin 172. The first coupling pin 172 may penetrate the first coupling guide 174 so as to combine the second and third shielding boxes 70b and 70c. The first coupling guide 174 may penetrate the shielding box 70 so as to be formed in the thickness direction of the display unit 20. The first coupling pin 172 may be inserted into the first coupling guide 174 so as to combine the first, second and third shielding boxes 70a, 70b and 70c such that at least two thereof can slide with respect to each other.

Referring to FIG. 63, when the display unit 20 of the display device 1 according to the present invention is flat, only the first shielding box 70a can be seen from the outside. The first shielding box 70a may be combined with the second shielding box 70b, which is not visible from the outside, by means of the first coupling pin 172. The first coupling guide 174 may guide the first coupling pin 172 when the shielding box 70 is elevated. The shorter axis of the first coupling guide 174 may be shorter than the diameter of the first coupling pin 172. The first coupling pin 172 may be disposed at the upper part of the first coupling guide 174 when the display unit 20 is flat.

Referring to FIG. 64, when the display unit 20 of the display device 1 according to the present invention is curved, the first and second shielding boxes 70a and 70b can be elevated. Accordingly, the second and third shielding boxes 70b and 70c can be exposed. The first coupling pin 172 may be disposed at the lower part of the first coupling guide 174 when the display unit 20 is curved.

Figure 65:
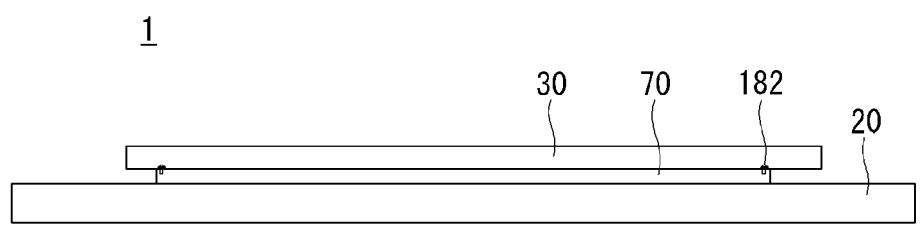
Figure 65:
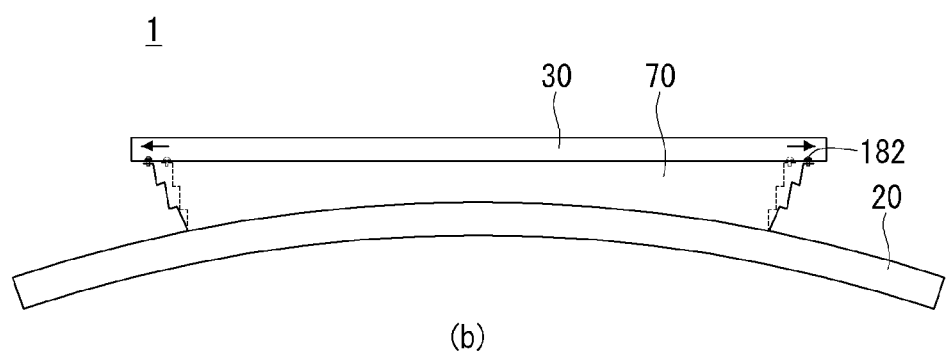
Figure 65:
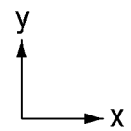

Referring to FIG. 65, when the display unit 20 of the display device 1 according to the present invention is flat, the edges of the shielding box 70 can be perpendicular to the housing 40. Accordingly, a second coupling pin 182 can connect the housing 30 and the shielding box 70 in a straight line.

When the display unit 20 is curved, the shielding box 70 may be curved along with the display unit 20. Here, the edges of the shielding box 70 become non-vertical with respect to the housing 30. Accordingly, the second coupling pin 182 may be moved outside of the housing 30 and thus a portion of the housing 30 around the second coupling pin 182 may be damaged.

Figure 66:
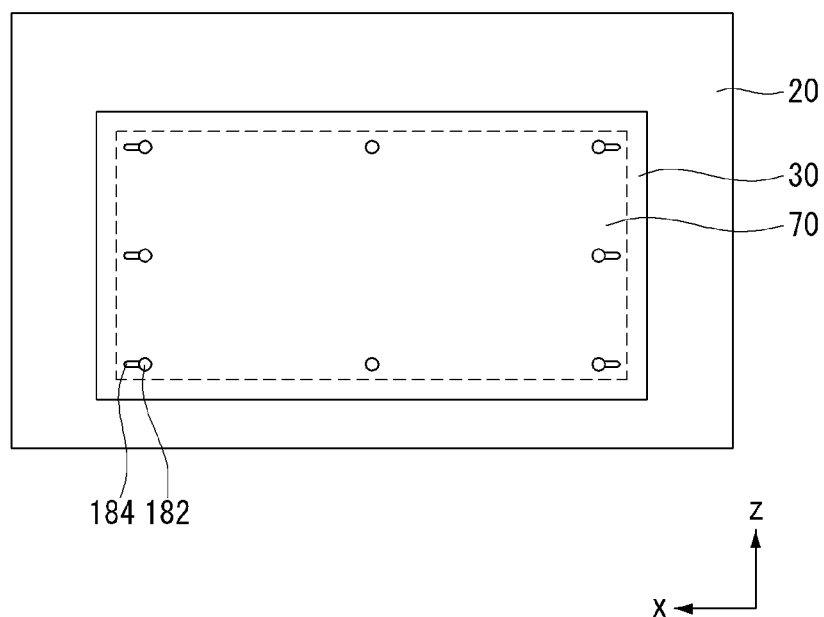

Referring to FIG. 66, the second coupling pin 182 can connect the shielding box 70 and the housing 30 through a second coupling guide 184. The second coupling guide 184 can guide the second coupling pin 182 when the edges of the shielding box 70 become non-vertical with respect to the housing 30. The longer axis of the second coupling guide 184 may be extended in the x-axis direction. That is, the second coupling guide 184 can penetrate the housing 30 so as to be formed in the direction of the longer side of the display unit 20. The shorter axis of the second coupling guide 184 may be shorter than the diameter of the second coupling pin 182. The second coupling guide 184 can allow the shielding box 70 to be parallel with the thickness direction of the display unit 20. The second coupling guide 184 can prevent a portion of the housing 30 around the second coupling pin 182 from being damaged even when the second coupling pin 182 is moved outside of the housing 30.

The second coupling guide 184 may be provided to only the second coupling pin 182 disposed at the side of the housing 30. The second coupling pin 182 disposed at the center of the housing 30 can be maintained perpendicular to the housing 30 even if the display unit 20 is curved. Accordingly, the second coupling pin 182 provided to the center of the housing 30 may not require the second coupling guide 184.

The manufacturing process of the display device 1 according to the present invention can be simplified since the side of the housing 30 is shielded by the shielding box 709 instead of the shielding part 240 and the shielding box 70 need not be folded.

Figure 67:
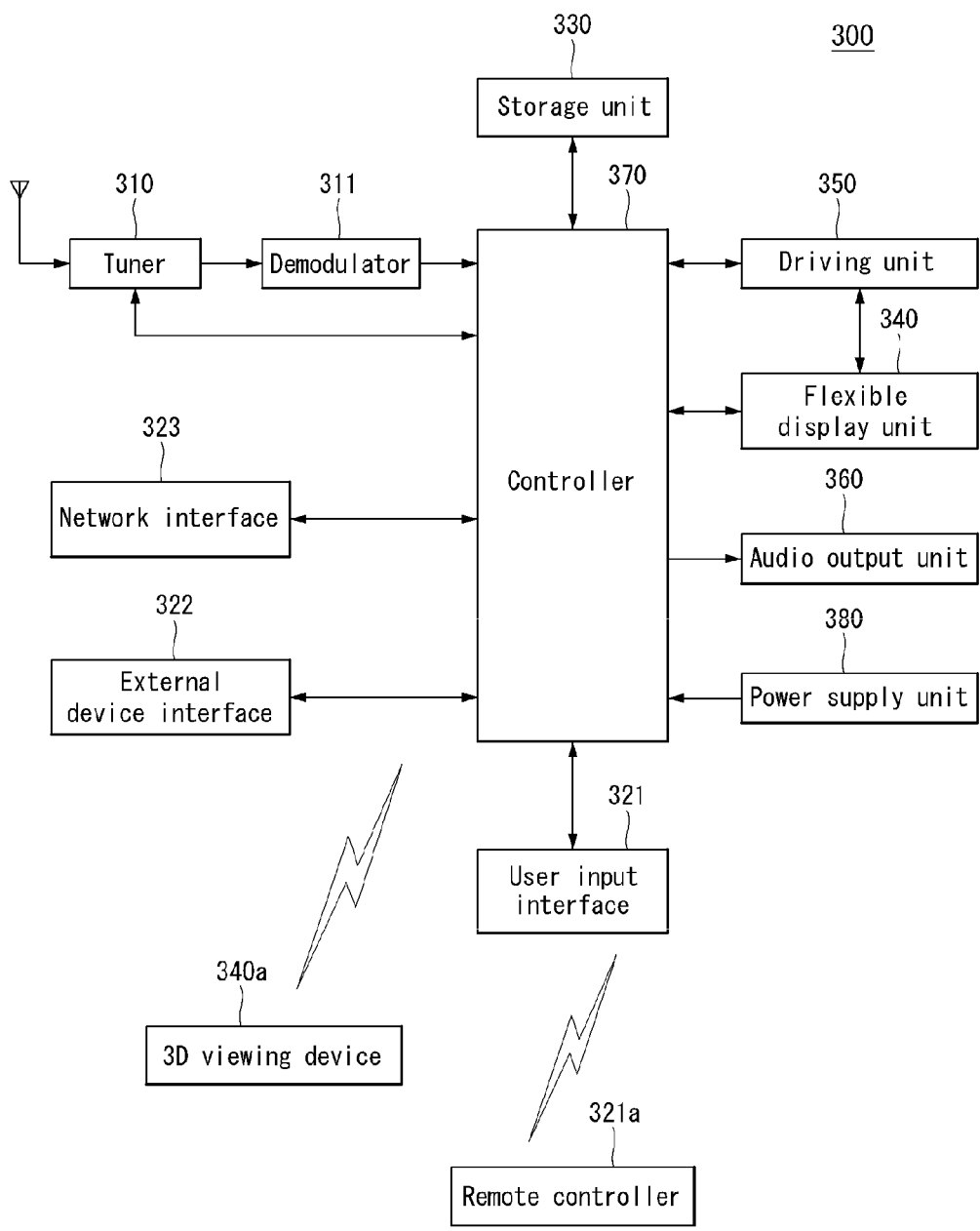
FIG. 67 is a block diagram of an image display device and a remote control unit related to the present invention.

FIG. 67 is a block diagram of an image display device and a remote controller according to the present invention Referring to FIG. 67, an image display device 300 may include a tuner 310, a demodulator 311, an external device interface 322, a network interface 323, a storage unit 330, a user input interface 321, a controller 370, a flexible display unit 340, a driving unit 350, an audio output unit 360, a power supply unit 380 and a 3D viewing device 340a.

The tuner 310 selects RF broadcast signals corresponding to a channel selected by a user or all prestored channels from among RF broadcast signals received through an antenna. The tuner 310 converts the selected RF broadcast signals into intermediate frequency signals or baseband video or audio signals.

For example, the tuner 310 converts the selected RF broadcast signals into digital IF signals (DIF) when the selected RF broadcast signals are digital broadcast signals and converts the selected RF broadcast signals into analog baseband video or audio signals (CVBS/SIF) when the selected RF broadcast signals are analog broadcast signals. That is, the tuner 310 can process digital broadcast signals or analog broadcast signals. The analog baseband video or audio signals CVBS/SIF output from the tuner 310 may be directly input to the controller 370.

In addition, the tuner 310 may receive single-carrier RF broadcast signals according to ATSC (Advanced Television System Committee) or multi-carrier RF broadcast signals according to DVB (Digital Video Broadcasting).

The tuner 310 may sequentially select RF broadcast signals of all broadcast channels stored through a channel memory function, from among RF broadcast signals received through the antenna, and convert the selected RF broadcast signals into IF signals or baseband video or audio signals.

The demodulator 311 receives the digital RF signals DIF converted by the tuner 310 and demodulates the digital RF signals.

For example, the demodulator 311 performs 8-VSB (8-Vestigal Side Band) demodulation when the digital IF signals output from the tuner 310 are ATSC signals. In addition, the demodulator 311 may perform channel decoding. To this end, the demodulator 311 may include a trellis decoder, a deinterleaver and a Reed Solomon decoder to perform trellis decoding, deinterleaving and Reed-Solomon decoding.

For example, the digital IF signals output from the tuner 310 are DVB signals, the demodulator 311 performs COFDMA (Coded Orthogonal Frequency Division Modulation) demodulation. In addition, the demodulator 311 may perform channel decoding. To this end, the demodulator 311 may include a convolution decoder, a deinterleaver and a Reed Solomon decoder to perform convolution decoding, deinterleaving and Reed-Solomon decoding.

The demodulator 311 may output a stream signal after demodulation and channel decoding. The stream signal may be a signal obtained by multiplexing a video signal, an audio signal and a data signal. For example, the stream signal can be an MPEG-2 TS (Transport Stream) obtained by multiplexing an MPEG-2 video signal and a Dolby AC-3 audio signal. Specifically, the MPEG-2 TS can include a 4-byte header and a 184-byte payload.

The demodulator 311 may be implemented as separate demodulators respectively for ATSC and DVB. That is, the image display device may include an ATSC demodulator and a DVB demodulator.

The stream signal output from the demodulator 311 can be input to the controller 370. The controller 370 performs demultiplexing and video/audio signal processing, outputs a video signal to the flexible display unit 340 and outputs an audio signal to the audio output unit 360.

The external device interface 322 can connect an external device to the image display device 300. To this end, the external device interface 322 may include an A/V input/output unit (not shown) and an RF communication unit (not shown).

The external device interface 322 may be connected to an external device such as a digital versatile disk (DVD), Blu-ray, gaming device, camera, camcorder and computer (notebook computer) in a wired/wireless manner. The external device interface 322 transfers a video, audio or data signal, input through the external device connected thereto, to the controller 370 of the image display device 300. In addition, the external device interface 322 may output a video, audio or data signal processed in the controller 370 to the external device connected thereto. To this end, the external device interface 322 may include the A/V input/output unit (not shown) or the RF communication unit (not shown).

The A/V input/output unit may include a USB terminal, CVBS (Composite Video Banking Sync) terminal, component terminal, S-video terminal (analog), DVI (Digital Visual Interface) terminal, HDMI (High Definition Multimedia Interface) terminal, RGB terminal and D-SUB terminal, through which video and audio signals from the external device can be input to the image display device 300.

The RF communication unit may perform short-range RF communication with other electronic devices. The image display device 300 can be linked to other electronic devices through a network according to Bluetooth, RFID (Radio Frequency Identification), IrDA (Infrared Data Association), UWB (Ultra Wideband), ZigBee or the like.

In addition, the external device interface 322 may perform input/output operations with various set-top boxes by being connected to the set-top boxes through at least one of the aforementioned various terminals.

The external device interface 322 can transmit/receive data to/from the 3D viewing device 340a.

The network interface 323 provides an interface for connecting the image display device 300 to wired/wireless networks including the Internet. The network interface 323 may include an Ethernet terminal for connecting the image display device 300 to wired networks and use WLAN (Wireless LAN, Wi-Fi), Wibro (Wireless broadband), Wimax (World Interoperability for Microwave Access), HSDPA (High Speed Downlink Packet Access) or the like for connecting the image display device 300 to wireless networks.

The network interface 323 may receive content or data provided by Internet or content providers or network operators through networks. That is, the network interface 323 can receive content such as movies, advertisement, games, VOD and broadcast signals and information related thereto, provided by content providers, through networks. In addition, the network interface 323 can receive firmware update information and update files provided by network operators. Furthermore, the network interface 323 can transmit data to Internet content providers or network operators.

In addition, the network interface 323 may be connected to an IP (Internet Protocol) TV to receive video, audio or data signals processed in an IPTV set-top box, transmit the received signals to the controller 370 and transfer signals processed in the controller 370 to the IPTV set-top box for enabling two-way communication.

The aforementioned IPTV may refer to ADSL-TV, VDSL-TV and FTTH-TV according to transport networks and may include TV over DSL, video over DSL, TV overIP (TVIP) and broadband TV (BTV). In addition, the IPTV may refer to Internet-accessible Internet TV and full browsing TV.

The storage unit 330 may store programs for signal processing and control in the controller 370 and store processed video, audio or data signals.

In addition, the storage unit 330 may temporarily store video, audio or data signals input to the external device interface 322. Furthermore, the storage unit 330 may store information about predetermined broadcast channels through a channel memory function such as a channel map.

The storage unit 330 may include at least one of storage media such as a flash memory, hard disk, multimedia card micro type memory, card type memory (e.g. SD or XD memory), RAM and ROM (EEPROM). The image display device 300 can reproduce files (video files, image files, music files, text files and the like) stored in the storage unit 330 and provide the files to users.

While FIG. 67 shows an example in which the storage unit 330 is separated from the controller 370, the scope of the present invention is not limited thereto and the storage unit 330 may be included in the controller 370.

The user input interface 321 transfers a signal input by a user to the controller 370 or transfers a signal from the controller 370 to the user.

For example, the user input interface 321 can receive user input signals for power on/off, channel selection and screen setting from the remote controller 321a or transmit signals from the controller 370 to the remote controller 321a according to various communication schemes such as RF (Radio Frequency) and IR communication schemes.

In addition, the user input interface 321 can transfer user input signals input through local keys (now shown) such as a power key, a channel key, a volume key and a setting key to the controller 370.

For example, the user input interface 321 can transfer a user input signal input from a sensing unit (not shown) for sensing a user gesture to the controller 370 or transmit a signal from the controller 370 to the sensing unit (not shown). Here, the sensing unit (not shown) may include a touch sensor, a voice sensor, a position sensor, a motion sensor, etc.

The controller 370 can demultiplex streams input through the tuner 310, the demodulator 311 or the external device interface 322 or generate signals for video or audio output by processing demultiplexed signals.

A video signal processed in the controller 370 can be input to the flexible display unit 340 and the flexible display unit 340 can display an image corresponding to the video signal. In addition, a video signal processed in the controller 370 may be applied to an external output device through the external device interface 322.

An audio signal processed in the controller 370 can be output to the audio output unit 360. An audio signal processed in the controller 370 may be applied to an external output device through the external device interface 322. The controller 370 may include a demultiplexer and an image processor which are not shown in FIG. 67.

In addition, the controller 370 can control the overall operation of the image display device 300. For example, the controller 370 can control the tuner 310 to tune to RF broadcast corresponding to a channel selected by the user or a pre-stored channel.

Furthermore, the controller 370 can control the image display device 300 according to a user command input through the user input interface 321 or an internal program.

For example, the controller 370 controls the tuner 310 to receive a signal corresponding to a channel selected according to a predetermined channel selection command received through the user input interface 321. The controller 370 processes a video, audio or data signal of the selected channel. The controller 370 controls channel information selected by the user to be output along with the processed video or audio signal through the flexible display unit 340 or the audio output unit 360.

Alternatively, the controller 370 controls a video signal or an audio signal from an external device, for example, a camera or a camcorder, input through the external device interface 322, to be output through the flexible display unit 340 or the audio output unit 360 according to an external device image reproduction command received through the user input interface 321.

The controller 370 can control the flexible display unit 340 to display an image. For example, the controller 370 can control the flexible display unit 340 to display a broadcast image input through the tuner 310, an external input image input through the external device interface 322, an image input through the network interface 323 or an image stored in the storage unit 330.

Here, an image displayed through the flexible display unit 340 may be a still image or a moving image and a 2D image or a 3D image.

The controller 370 generates a predetermined object in an image displayed through the flexible display unit 340 as a 3D object and controls the flexible display unit 340 to display the 3D object. For example, the object may be at least one of a linked web image (newspaper, magazine or the like), EPG (Electronic Program Guide), various menus, widgets, icons, still image, moving image and text.

The 3D object may be processed to have a different depth from the image displayed on the flexible display unit 340. The 3D object may be processed to be seen as being projected compared to the image displayed on the flexible display unit 340.

The controller 370 recognizes a position of a user on the basis of an image photographed by a photographing unit (not shown). For example, the controller 370 can detect a distance (z-axis coordinates) between the user and the image display device 300. In addition, the controller 370 can detect an x-coordinate and a y-coordinate in the image display device 300, which correspond to the user position.

The image display device 300 may further include a channel browsing processor for generating a thumbnail image corresponding to a channel signal or an external signal. The channel browsing processor can generate a thumbnail image by receiving a stream signal TS output from the demodulator 311 or a stream signal output from the external device interface 322 and extracting an image from the received stream signal. The generated thumbnail image can be input to the controller 370 or encoded and then input to the controller 370. The generated thumbnail image may be encoded in the form of a stream and input to the controller 370. The controller 370 can display a thumbnail list including a plurality of thumbnail images on the flexible display unit 340 using thumbnail images input thereto. The thumbnail list may be displayed in a region of the flexible display unit 340 while an image is displayed on the flexible display unit 340 or displayed in the entire area of the flexible display unit 340.

The flexible display unit 340 generates driving signals by converting a video signal, a data signal, an OSD signal and a control signal processed in the controller 370 or a video signal, a data signal and a control signal received through the external device interface 322.

The flexible display unit 340 can be deformed to a flat shape or a curved shape in the present invention. When the flexible display unit 340 is curved, realistic images and immersion can be provided to the user. The flexible display unit 340 may be implemented as an OLED panel.

The flexible display unit 340 may be configured to provide 3D images to the user. To allow the user to view 3D images, the flexible display unit 340 can employ an additional display scheme and an independent display scheme.

According to the independent display scheme, the flexible display unit 340 provides 3D images without an additional 3D viewing device 340a, for example, 3D glasses. For example, various scheme such as lenticular and parallax barrier can be used.

According to the additional display scheme, 3D images are generated using the 3D viewing device 340a in addition to the flexible display unit 340. For example, a head mount display (HMD) type and a glass type can be used. The glass type can be classified into a passive type such as a polarized glass type and an active type such as a shutter glass type. The head mount display type can also be classified into a passive type and an active type.

The flexible display unit 340 may be implemented as a touchscreen so as to be used as an input device as well as an output device.

The driving unit 350 is configured to deform the flexible display unit 340 to a flat shape or a curved shape. The driving unit 350 may be configured to deform the flexible display unit 340 by applying a physical force to the flexible display unit 340 directly or indirectly.

The audio output unit 360 receives an audio signal processed in the controller 370, for example, a stereo signal, a 3.1 channel signal or a 5.1 channel signal, and output the audio signal as a sound. The audio output unit 360 may be implemented as a speaker in various forms.

To sense a gesture of the user, the image display device 300 may further include the sensing unit (not shown) including at least one of a touch sensor, a voice sensor, a position sensor and a motion sensor, as described above. A signal sensed by the sensing unit (not shown) is transmitted to the controller 370 through the user input interface 321.

The controller 370 may sense a gesture of the user by using an image photographed by the photographing unit (not shown) or a signal sensed by the sensing unit (not shown) or combining the image and the signal.

The power supply unit 380 supplies power to the image display device 300. Particularly, the power supply unit 380 can supply power to the controller 370 which may be configured in the form of a system on chip (SOC), the flexible display unit 340 for image display and the audio output unit 324 for audio output. The power supply unit 380 may supply power to a heating unit including a hot wire.

The remote controller 321a transmits user input to the user input interface 321. To this end, the remote controller 321a can use IR communication, RF communication, Bluetooth, UWB (Ultra Wideband), ZigBee, etc. In addition, the remote controller 321a can receive a video, audio or data signal output through the unit input interface 321 and display an image corresponding to the video signal or output a sound corresponding to the audio signal.

The image display device 300 is of a fixed type and may be a digital broadcast receiver capable of receiving at least one of ATSC (8-VSB) digital broadcast, DVB-T (COFDM) digital broadcast and ISDB-T (BST-OFDM) digital broadcast. In addition, the image display device 300 is of a mobile type and may be a digital broadcast receiver capable of receiving at least one of terrestrial DMB digital broadcast, satellite DMB digital broadcast, ATSC-M/H digital broadcast, DVB-H (COFDM) digital broadcast and media forward link only digital broadcast. Otherwise, the image display device 300 may be a digital broadcast receiver for cable, satellite or IPTV.

The image display device described in the present invention may include a TV receiver, a cellular phone, a smartphone, a notebook computer, a digital broadcast terminal, a PDA (Personal Digital Assistants) and a PMP (Portable Multimedia Player).

The block diagram of the image display device 300 shown in FIG. 57 is for an embodiment of the present invention. Components of the image display device 300 may be integrated, added or omitted according to specifications of the image display device 300. That is, two or more components may be integrated into one component or one component may be divided into two or more components as necessary. In addition, functions of respective blocks are for the purpose of describing an embodiment of the present invention and detailed operations and devices do not limit the scope of the present invention.

Figure 68A:
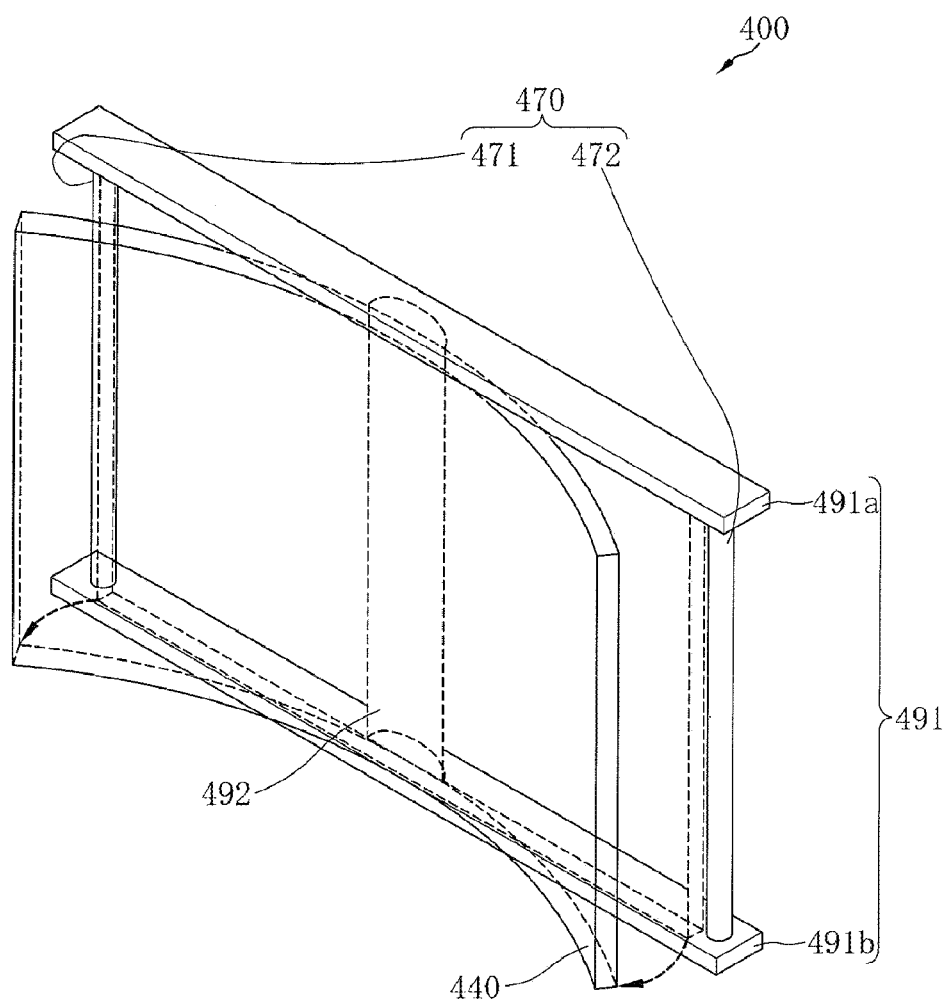
FIG. 68A is a perspective view showing a flexible display unit of an image display device according to an embodiment of the present invention before and after the shape of the flexible display unit is changed.
Figure 68B:
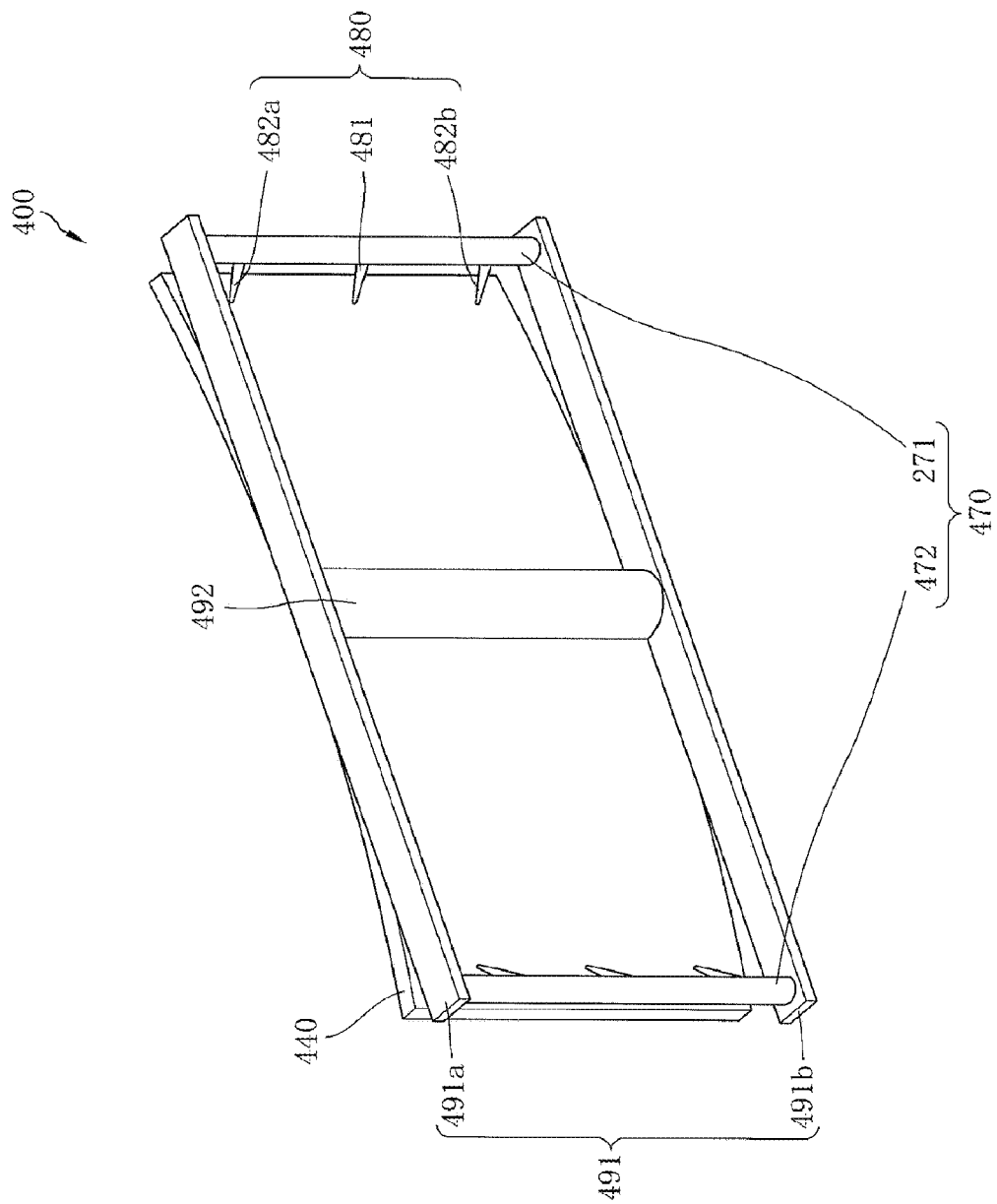
FIG. 68B is a rear perspective view of the image display device shown in FIG. 68A.

FIG. 68A is a front perspective view showing a flexible display unit 440 of an image display device 400 according to an embodiment of the present invention before and after change of the shape of the flexible display unit 440, and FIG. 68B is a rear perspective view of the image display device 400 shown in FIG. 68A.

The flexible display unit 440 is configured to be curved by external force between a first state and a second state in which the flexible display unit 440 is curved by different degrees. For example, the flexible display unit 440 can be flat in the first state and curved in the second state. Alternatively, the flexible display unit 440 may have different radiuses of curvature in the first state and the second state.

FIG. 68A shows both the state in which the flexible display unit 440 is flat and the state in which the flexible display unit 440 is curved. In this case, the state in which the flexible display unit 440 is flat may be regarded as the first state and the state in which the flexible display unit 440 is curved may be regarded as the second state, and vice versa.

When the flexible display unit 440 is curved toward a viewer in front thereof according to external force applied thereto, the flexible display unit 440 can provide realistic images, presence and immersion to the viewer. The curved flexible display unit 440 can be restored to the flat state when the external force is removed or another external force is applied thereto.

Poles 470 are respectively provided behind the left and right sides of the flexible display unit 440. That is, the poles 470 are disposed at the back of the side of the flexible display unit 440 on which images are displayed. In the following description, the pole 470 disposed behind the left side of the flexible display unit 440 is referred to as a left pole 471 and the pole 470 disposed behind the right side of the flexible display unit 440 is referred to as a right pole 472, when the flexible display unit 440 is viewed from the front thereof, for convenience of description. Furthermore, the following description is based on the assumption that the poles 470 include both the left and right poles 171 and 172 unless the left and right poles 471 and 472 are especially discriminated from each other.

The poles 470 are extended in parallel and are rotatable about the axis in the extended direction. Referring to FIGS. 68A and 68B, the poles 470 are extended in the vertical direction and are rotatable about the axis in the vertical direction.

A pressure member 480 is provided to the poles 470 such that the pressure member 480 protrudes from the pressure member 480 to the rear side of the flexible display unit 440. When the poles 470 rotate, the pressure member 480 rotates along with the poles 470 so as to come into contact with the rear side of the flexible display unit 440 and applies external force to the rear side of the flexible display unit 440 as the poles 470 continuously rotate. The pressure member 480 is provided to the left pole 471 and the right pole 472 in such a manner that the pressure member 480 provided to the left pole 471 and the pressure member 480 provided to the right pole 472 face each other. The pressure member 480 provided to the left pole 471 and the pressure member 480 provided to the right pole 472 respectively rotate along with the left pole 471 and the right pole 472 when the left pole 471 and the right pole 472 rotate so as to apply external forces to the left and right sides of the rear side of the flexible display unit 340 to deform the flexible display unit 440. Accordingly, the left and right sides of the flexible display unit 440 are curved in the direction in which the pressure members 480 apply force thereto.

The pressure member 480 includes a first cam 481 and second cams 482a and 482b symmetrically disposed on the basis of the first cam 481. The first cam 481 is provided to the center of each pole 470 so as to pressurize the center of one side of the flexible display unit 440. The second cams 482a and 482b are symmetrically disposed on the basis of the first cam 481 so as to cause the flexible display unit 440 to be uniformly deformed. An even number of second cams are symmetrically disposed at intervals.

A driving unit (not shown) is connected to the poles 470 to provide a driving force for rotating the poles 470. Since the driving unit is not exposed, the driving unit is not shown in FIGS. 68A and 68B. The driving unit will be described in detail later.

A frame 491 is provided to cover at least parts of the upper and lower ends of the flexible display unit 440. As shown in FIGS. 68A and 68B, the frame 491 may include a top frame 491a provided corresponding to the upper end of the flexible display unit 440 and a bottom frame 49ab provided corresponding to the lower end of the flexible display unit 440. The frame 491 protects the flexible display unit 440 by alleviating impact applied to the upper and lower ends of the flexible display unit 440.

The frame 491 is coupled with both ends of the poles 470 so as to support the poles 470. The top frame 491a is coupled with the upper end of each pole 470 and the bottom frame 491b is coupled with the lower end of each pole 470. The poles 470 can rotate about the vertical axes thereof by being supported by the frame 491.

A stand 492 is disposed between the left pole 471 and the right pole 472 and both ends thereof are coupled with the frame 491. The stand 492 is coupled with the rear side of the flexible display unit 440 so as to fix the center of the flexible display unit 440 when the left and right sides of the flexible display unit 440 are curved by the pressure member 480.

As shown in FIGS. 68A and 68B, the stand 492 is preferably coupled with the flexible display device 440 in the direction in which the stand 492 is extended in parallel with the poles 470 from the upper end to the lower end of the flexible display unit 440 so as to prevent the upper and lower ends of the flexible display unit 440 from being curved toward each other.

Both the upper and lower ends of the flexible display unit 440 are covered by the frame 491 in the first state in which the flexible display unit 440 is flat since the pressure member 480 does not apply external force thereto, whereas only parts of the upper and lower ends thereof are covered by the frame 491 and the remaining parts may be separated from the frame 491 in the second state in which the flexible display device 440 is curved by external force applied thereto by the pressure member 480 since the center thereof is fixed by the stand 492.

A description will be given of the shape of the flexible display unit 440 curved by external force.

Figure 69A:
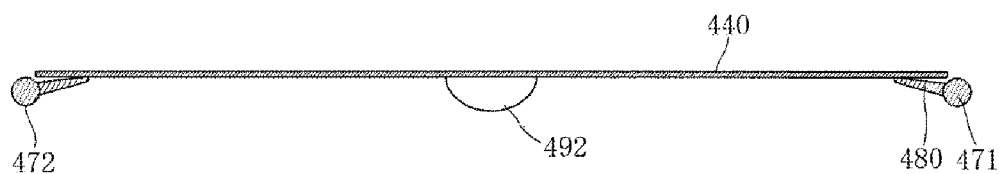
FIGS. 69A and 69B are plan views respectively illustrating the flexible display unit of the image display device shown in FIG. 68A before and after the shape of the flexible display unit is changed.
Figure 69B:
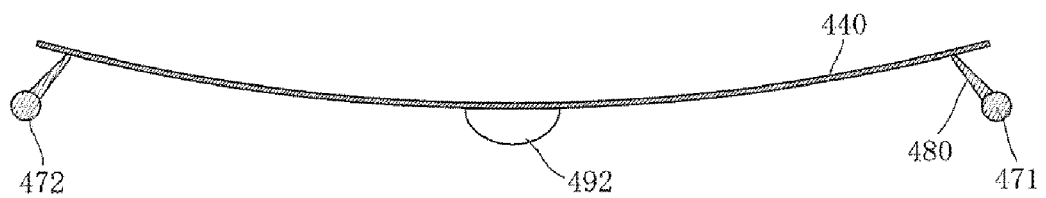

FIGS. 69A and 69B are plan views illustrating the image display device 400 shown in FIG. 68A before and after the flexible display unit 440 is deformed.

Referring to FIG. 68A, the flexible display unit 440 is in the first state in which the flexible display unit 440 is flat since the pressure member 480 does not apply external force thereto. The pressure member may be in contact with the rear side of the flexible display unit 440. However, the present invention is not limited thereto and the pressure member 480 may be separate from the rear side of the flexible display unit 440.

Referring to FIG. 69B, when the left pole 471 and the right pole 472 rotate in opposite directions, the pressure member 480 rotate with the poles 470 so to apply external force to the rear side of the flexible display device 440. (The left and right sides are based on the direction when the flexible display device is viewed in front thereof, and the left pole 471 is shown at the right side and the right pole 472 is shown at the left side since FIG. 69B is a plan view.) The flexible display device 440 is curved in the direction in which the left and right sides thereof are bent toward each other by the external force applied by the pressure member to be switched to the second state while the center of the flexible display unit 440 is fixed by the stand 492.

According to this mechanism, the flexible display unit 440 is configured to be curved by external force between the first state and the second state. The first state and the second state of the flexible display unit 440 do not necessarily refer to a flat state and a curved state and include states having different curvatures. Particularly, when the flexible display unit 440 is curved, as shown in FIG. 69B, the curvature of the center thereof may differ from the curvature of the left and right sides thereof. Since the curvature of the flexible display unit 440 is not constant even in one state, an optimal environment in which immersion is provided to users can be generated.

A description will be given of a detailed structure of a driving unit 450 for rotating the poles 470.

Figure 70A:
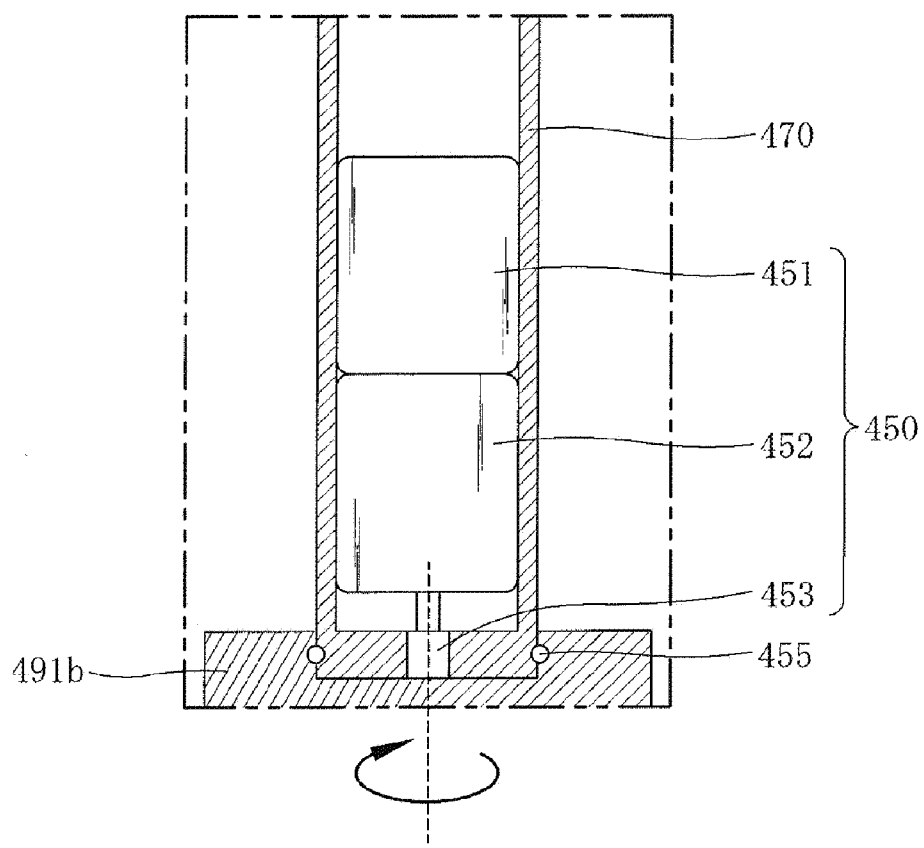
FIG. 70A illustrates an internal structure of a pole shown in FIG. 68B.

FIG. 70A illustrates the internal structure of the pole 470 shown in FIG. 68B.

The driving unit 450 for rotating the pole 470 is installed inside of the pole 470 instead of being exposed to the outside. The driving unit 450 is coupled to the pole 470 so as to provide a driving force for rotating the pole 470 and controls rotation angles of the pole 470 and the pressure member 480 so as to adjust a degree to which the flexible display unit 440 is curved.

The driving unit 450 includes a driving motor 451, a reducer 452 and a motor gear 453.

The driving motor 451 generates a driving force for rotating the pole 470. The reducer 452 is coupled to the driving motor 451 so as to increase the driving force transferred from the driving motor 451 to the pole 470. The driving force generated by the driving motor 451 is transferred to the reducer 452 and the reducer 452 increases the magnitude of the driving force by sacrificing rotating speed of the driving force. As shown in FIG. 70A, the driving motor 451 and the reducer 452 are stacked and installed in the internal space of the pole 470.

The motor gear 453 is coupled to the reducer 452 so as to transfer the driving force, generated by the driving motor 451 and increased by the reducer 452, to the pole 470 and rotates being engaging with at least part of the pole 470. At least part of the pole 470 may correspond to the motor gear 453 while surrounding the circumference of the motor gear 453 such that the pole 470 rotates about the same axis as the motor gear 453 when the motor gear 453 rotates. The structure in which at least part of the pole 470 corresponds to the motor gear 453 includes a structure in which the pole 470 has a hole engaging with a protrusion of the motor gear 453 and rotating with the motor gear 453 or a structure in which the pole 470 has a protrusion engaging with a hole of the motor gear 453 and rotating with the motor gear 453. According to such structures, when the motor gear 453 rotates clockwise by the driving force, the pole 470 engaging with the motor gear 453 can also rotate clockwise.

Rotate balls 455 are provided at the boundary of the pole 470 and the frame 491 to enable smooth rotation of the pole 470. As illustrated in FIGS. 68A and 68B, since the pole 470 is coupled to the frame 481 and supported by the frame 491, a frictional force is generated between the pole 470 and the frame 491 when the pole 470 rotates independently of the frame 491. The rotate balls 455 serve as a bearing between the pole 470 and the frame 491 by being disposed between the pole 470 and the frame 491 so as to rotate with the pole 470 when the pole 470 rotates. Accordingly, the rotate balls 455 reduces the frictional force between the pole 470 and the frame 491 and thus the pole 470 can smoothly rotate according to the rotate balls 455.

The driving unit 450 can be controlled by the controller 370 (shown in FIG. 67). The mechanism of controlling the driving unit 450 by the controller 370 may be set in various manners. For example, the controller 470 can control the driving unit 450 on the basis of input of the user who views the image display device or automatically control the driving unit 450 in a predetermined mode to deform the flexible display unit 440.

A description will be given of a case in which the controller 370 controls the driving unit 450 on the basis of user input. The user can apply input to the image display unit 400 through the user input interface 321 included in the image display unit 400. The user input interface 321 may be provided to the image display device 400 and may include a remote controller through which input is remotely applied.

When the user applies input through the user input interface 321, the controller 370 rotates the pole 470 and the pressure member 480 by driving the driving unit 450. When the state in which the flexible display unit 440 is flat is called a first state and the state in which the flexible display unit 440 is fully curved is called a second state, the controller 370 can deform the flexible display unit 440 continuously or in stages between the first state and the second state.

A description will be given of a case in which the controller 370 automatically controls the driving unit 450 in a predetermined mode. The predetermined mode refers to a mode which can be preset, such as a normal broadcast view mode, a moving view mode, a 2D view mode or a 3D view mode. A degree to which the flexible display unit 440 is curved can be present in the controller 370 in order to provide an optimized viewing environment to the user in a selected mode. According to such setting, the controller 370 operates the driving unit 450 when the mode of the image display device 400 changes even if no input is applied. For example, when the 2D view modes is switched to the 3D view mode, the controller 370 can control the driving unit 450 to deform the flexible display unit 440 to a form having a curvature suitable for 3D view even if additional operation is not applied to the flexible display unit 440.

A degree to which the flexible display unit 440 is curved is determined by the magnitude of external force applied to the flexible display unit 440 by the pressure member 480. The magnitude of external force applied to the flexible display unit 440 by the pressure member 480 is determined by the rotation angle of the pole 470. That is, the controller 370 can control the rotation angle of the pole 470 by driving the driving unit 450 so as to accurately control a degree to which the flexible display unit 440 is curved. Accordingly, the user can curve the flexible display unit 440 to a desired curvature.

Figure 70B:
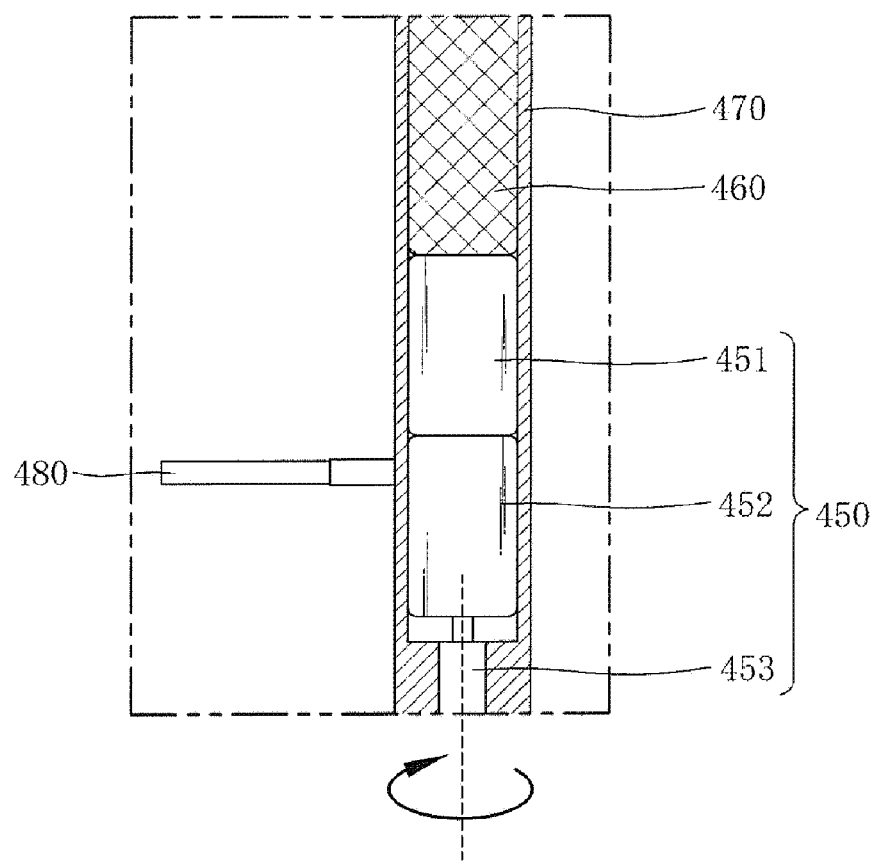
FIG. 70B illustrates another internal structure of the pole shown in FIG. 68B.

FIG. 70B illustrates another internal structure of the pole 470 shown in FIG. 68B.

FIG. 70B is distinguished from FIG. 70A in that the audio output unit 460 is provided inside of the pole 470 and the pressure member 480 is shown.

The audio output unit 460 may be disposed in a region inside of the pole 470 where the driving unit 450 is not installed. As illustrated in FIGS. 68A and 68B, the pole 470 is coupled to the top frame 491a and the bottom frame 491b and thus the pole 470 is expended in the vertical direction. Accordingly, the pole 470 may have an available space in the inside thereof except for the space where the driving unit is disposed.

When the audio output unit 460 is disposed inside of the pole 470, an inside space of the image display device 400, which is secured by moving the audio output unit 460 to the pole 470, can be used for other purposes. This advantage can enable compact design of the image display device 400 and achieve the slim image display device.

The pole 470 may include an audio output hole (not shown) formed in a region corresponding to the audio output unit 460 such that a sound output from the audio output unit 460 is emitted to the outside.

The pressure member 480 shown in FIG. 70B suggests that the height at which the driving unit 450 is installed inside of the pole 470 is not limited. Since the pole 470 may have an available space inside thereof, as described above, the driving unit 450 can be installed inside of the pole 470 without height restriction when the image display device 400 is designed and can be disposed in proximity to the pressure member 480 or separated from the pressure member 480.

A description will be given of an image display device including a flexible display unit according to another embodiment of the present invention.

Figure 71:
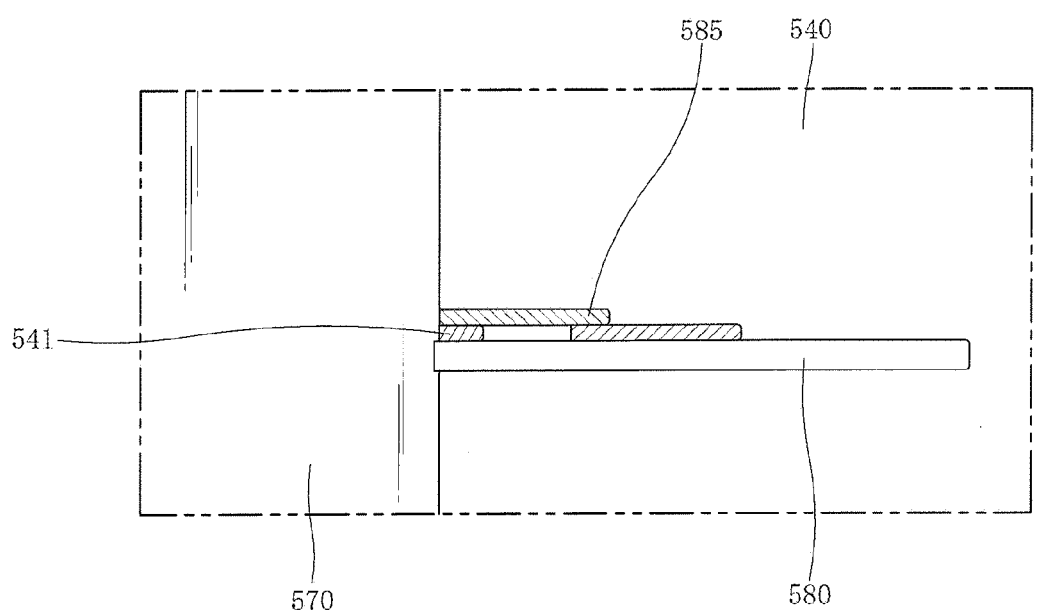
FIG. 71 is a conceptual diagram for describing a structure of restoring a flexible display unit to a previous shape in an image display device according to another embodiment of the present invention.

FIG. 71 illustrates a structure of restoring a flexible display unit 540 of an image display device according to another embodiment of the present invention to a form before being deformed.

The image display device includes a link part 585 for restoring the flexible display unit 540 to a form before being deformed when external force applied to the flexible display unit 540 by a pressure member 580 is released.

The link part 585 is coupled to the flexible display unit 540 and the pressure member 580 so as to pull the flexible display unit 540 during restoration of the flexible display unit 540 to the form before being deformed. Particularly, both ends of the link part 585 may be hinge-coupled to the flexible display unit 540 and the pressure member 580 and formed in a multi-stage structure having two or more joints. The detailed structure of the link part 585 is shown in FIGS. 72A and 72B.

Figure 72A:
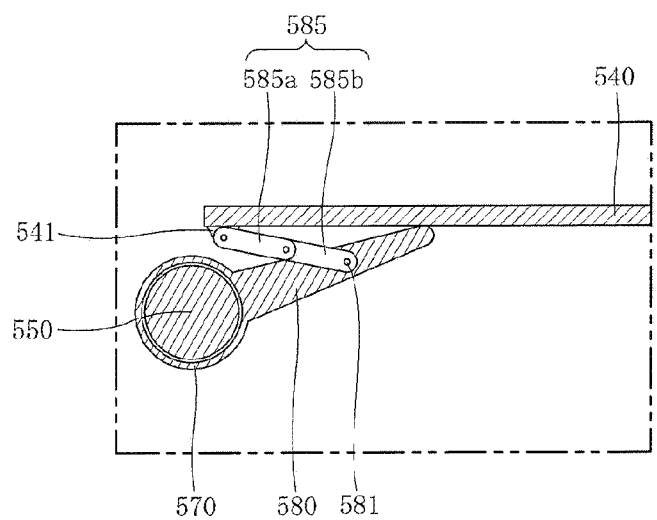
FIGS. 72A and 72B are plan views respectively illustrating the flexible display unit of the image display shown in FIG. 71 before and after the shape of the flexible display unit is changed.
Figure 72B:
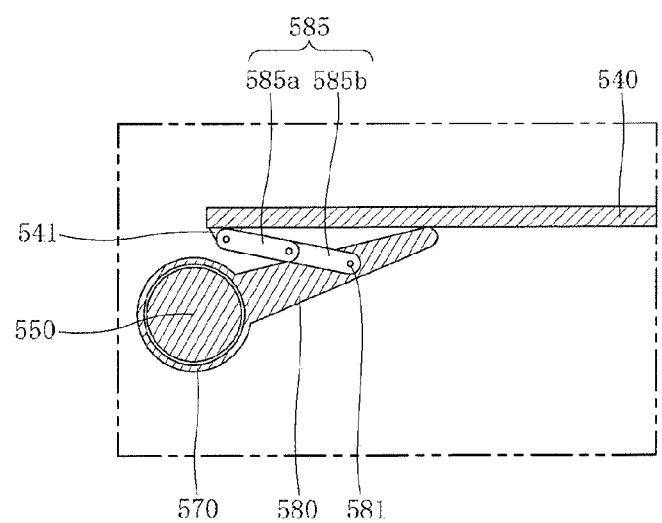

FIGS. 72A and 72B are plan views of the flexible display unit 540 of the image display device shown in FIG. 71 before and after the flexible display unit 540 is deformed.

FIG. 72A shows a state in which the flexible display device 540 is curved by external force applied to the rear side thereof by the pressure member 580 and FIG. 72B shows a state in which the flexible display unit 540 becomes flat upon release of the external force. Referring to FIGS. 72A and 72B, the restoration mechanism according to the link part 585 can be understood.

The flexible display unit 540 and the pressure member 580 respectively include a coupling parts 541 and 581 for coupling with the link part 585. The link part 585 is formed by a plurality of hinge-coupled links, and both ends of the link part 585 are respectively hinge-coupled to the coupling part 541 of the flexible display unit 540 and the coupling part 541 of the pressure member 580.

The link part 585 includes a first link 585a and a second link 585b. One end of the first link 585a is hinge-coupled to the coupling part 541 provided to the rear side of the flexible display unit 540 and the other end thereof is hinge-coupled to the second link 585b. One end of the second link 585b is hinge-coupled to the coupling part 581 of the pressure member 580 and the other end thereof is hinge-coupled to the first link 585a. In this manner, the link part 585 is formed in a multi-stage structure having two joints. The number of links forming the link part 585 may be two or more. To understand the restoration mechanism according to the link part 585, a description will be given with reference to FIGS. 72B and 72A. Referring to FIG. 72B, the pressure member 580 does not pressurize the flexible display unit 540 and the link part 585 is unfolded in a straight line before the pole 570 rotates. Referring to FIG. 72A, when the pole 570 rotates, the pressure member 580 pressurizes the flexible display unit 540, the distance between the two coupling parts 541 and 581 is reduced, and the hinge-coupled links of the link part 585 rotate such that the link part 585 is folded. Referring back to FIG. 72B, when the pole 570 rotates in a direction opposite the initial rotating direction, the flexible display unit 540 is restored to a form before being deformed. During restoration of the flexible display unit 540, the link part 585 is unfolded in a straight line so as to pull the flexible display unit 540 such that the flexible display unit 540 becomes flat.

The flexible display unit 540 can be restored to a completely flat state according to operation of the link part 585. Since the link part 585 operates with rotation of the pole 570, a driving force for restoring the flexible display unit 540 through the link part 585 is generated by the driving unit 550 and a separate component for restoring the flexible display unit 540 may not be provided.

A description will be given of an image display device according to another embodiment of the present invention.

Figure 73:
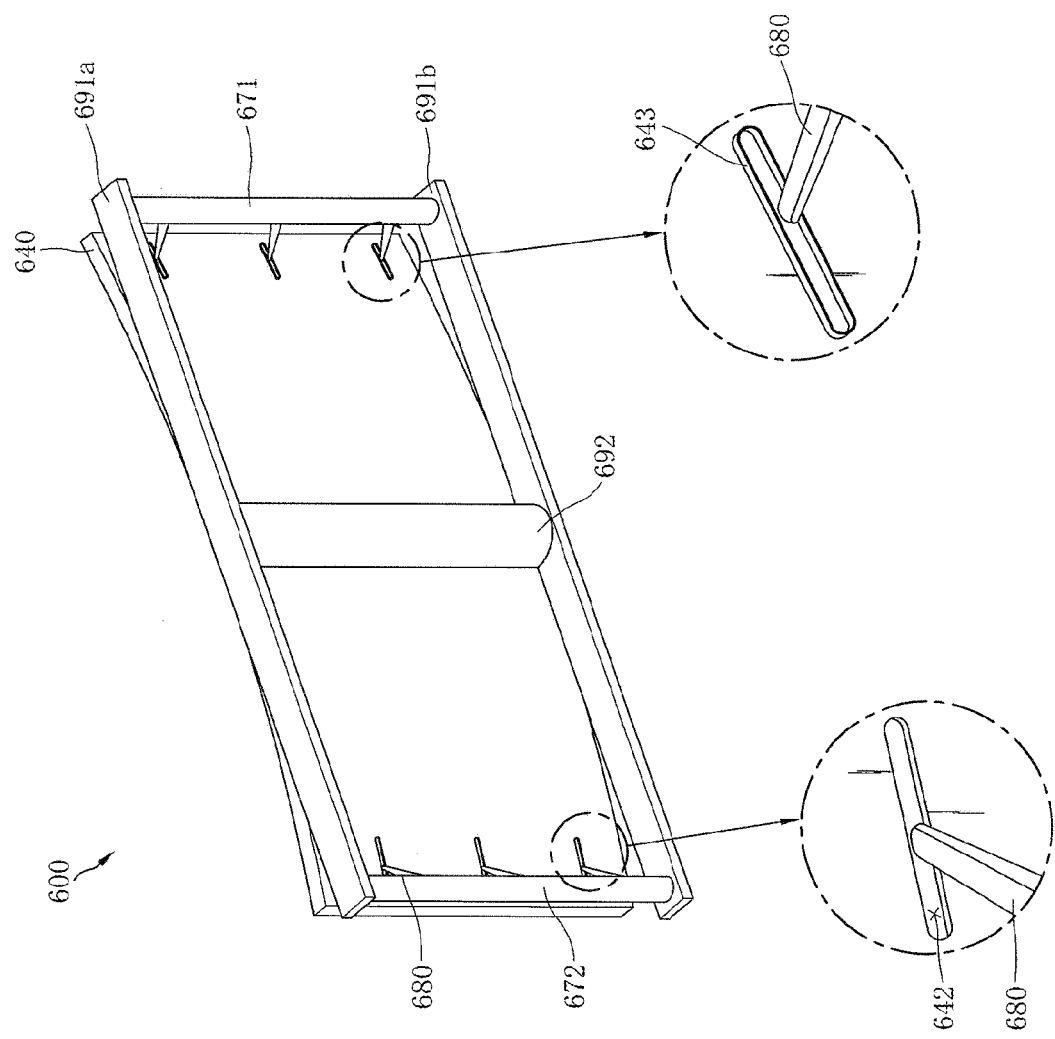
FIG. 73 is a rear perspective view and an enlarged view of an image display device according to another embodiment of the present invention.

FIG. 73 is a rear perspective view and an enlarged view of an image display device 600 according to another embodiment of the present invention.

The image display device 600 includes guide parts 642 and 643 for guiding a pressure member 680.

The guide parts 642 and 643 are formed at the rear side of the flexible display unit 640 along a contact path of the pressure member 680 so as to guide movement of the pressure member 680. The guide parts 642 and 643 guide movement of the pressure member 680 in various manners.

For example, referring to the enlarged view shown at the left side of FIG. 73, the guide part 642 can be formed at the rear side of the flexible display unit 640 and recessed into the flexible display unit 640, along the contact path of the pressure member 680. Accordingly, the pressure member 680 can be moved on the rear side of the flexible display unit 640 while being accommodated in the guide part 642 and prevented from being separated from a movement path formed by the guide part 642.

Alternatively, referring to the enlarged view shown at the right side of FIG. 73, the guide part 643 can be formed at the rear side of the flexible display unit 650 and protrude from the circumference of the contact path of the pressure member 680. According to the structure in which the guide part 643 protrudes from the rear side of the flexible display unit 640, the pressure member 680 can be moved on the rear side of the flexible display unit 640 while being accommodated in the guide part 643 and prevented from being separated from a movement path formed by the guide part 643.

A description will be given of an image display device according to another embodiment of the present invention.

Figure 74A:
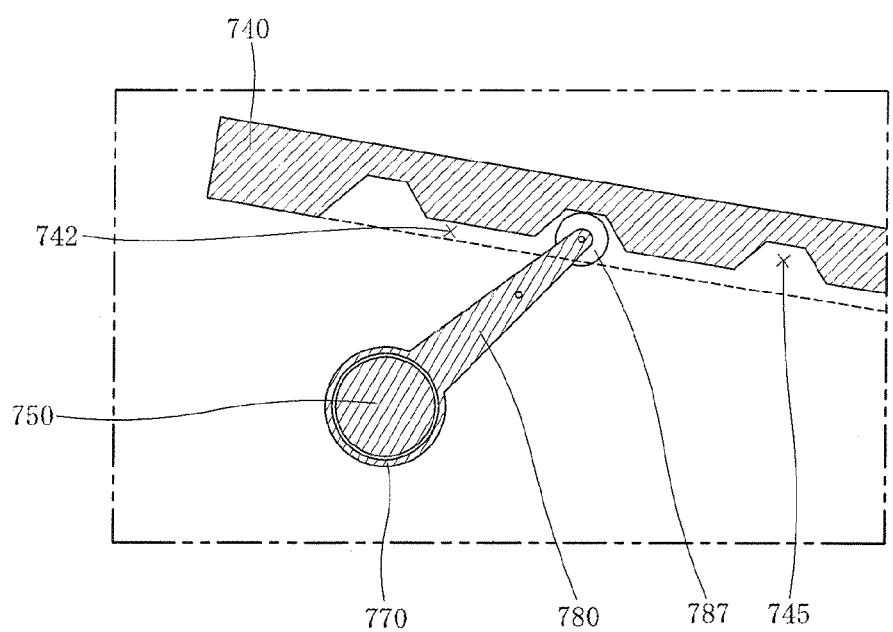
FIG. 74A is a cross-sectional view of a stopper formed on a pressure member moving path.

FIG. 74A is a cross-sectional view of stoppers 745 formed on a movement path of a pressure member 780.

A guide part 742 can be formed in such a manner that the guide part 742 is recessed into a flexible display unit 740 and may have the stoppers 745 for restricting movement of the pressure member 780. The stoppers 745 are formed at predetermined positions on a contact path of the pressure member 780 in the flexible display unit 740 at intervals so as to restrict movement of a pole 770 and the pressure member 780 at a predetermined rotation angle.

As shown in FIG. 74A, the stoppers 745 can be recessed from the guide part 742 into the flexible display unit 740 at predetermined positions. Accordingly, the pressure member 780 moving along the guide part 742 is accommodated in the stoppers 745 recessed into the flexible display unit 740. Since the pressure member 780 remains in the stoppers 745 until the pole 770 additionally rotates, the pressure member 780 can be prevented from being separated from the stoppers 745.

When the stoppers 745 are formed at the predetermined positions so as to restrict movement of the pressure member 780 at the predetermined positions, a degree to which the flexible display unit 740 is curved can be controlled in stages.

A roller 787 may be provided to the end of the pressure member 780. The roller 787 is rotatably set at the end of the pressure member 780 so as to reduce friction between the pressure member 780 and the flexible display unit 740. The pressure member 780 does not directly come into contact with the rear side of the flexible display unit 740 and the roller 787 comes into contact with the flexible display unit 740. Since the roller 787 can rotate, the pressure member 780 and the pole 770 can rotate more smoothly according to the roller 787 so as to pressurize the flexible display unit 740.

Figure 74B:
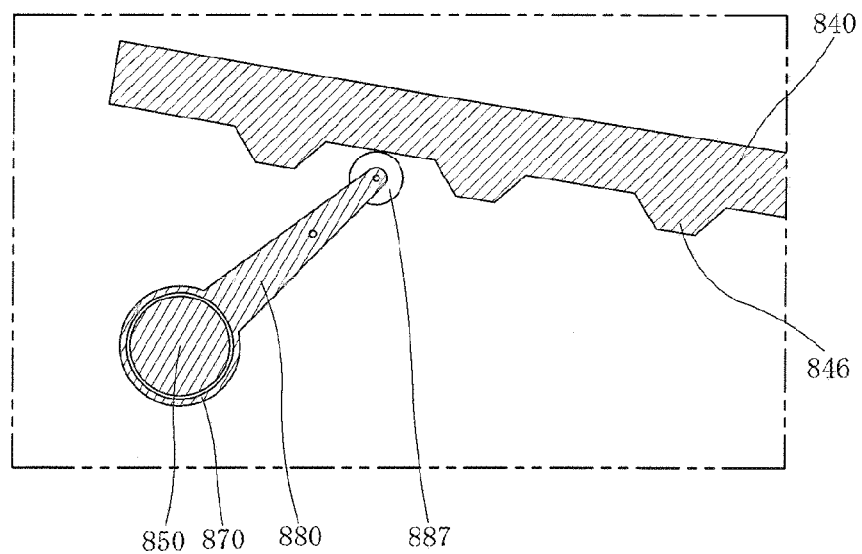
FIG. 74B is a cross-sectional view of a stopper having a structure different from the stopper shown in FIG. 74A.

FIG. 74B is a cross-sectional view of stoppers 846 having a structure different from the stoppers 745 shown in FIG. 74A.

The stoppers 846 can be formed to protrude from the rear side of the flexible display unit instead of being recessed into the flexible display unit. A pressure member 880 is stopped by the stoppers 846 and thus movement of the pressure member 880 is restricted. The pressure member 880 can move over the stoppers 846 only when a pole 870 additionally rotates. Since the stoppers 846 protrude from the flexible display unit, a region where the distance between the pole 870 and the flexible display unit becomes close may be present. However, the pressure member 880 is not damaged in the region due to a narrow space as long as a force for continuously rotating the pressure member 880 is provided according to rotation of the pole 879 since the flexible display unit is deformable in the present invention.

A description will be given of a structure for preventing the mechanism of bending the flexible display unit from being visually exposed to the outside.

Figure 75A:
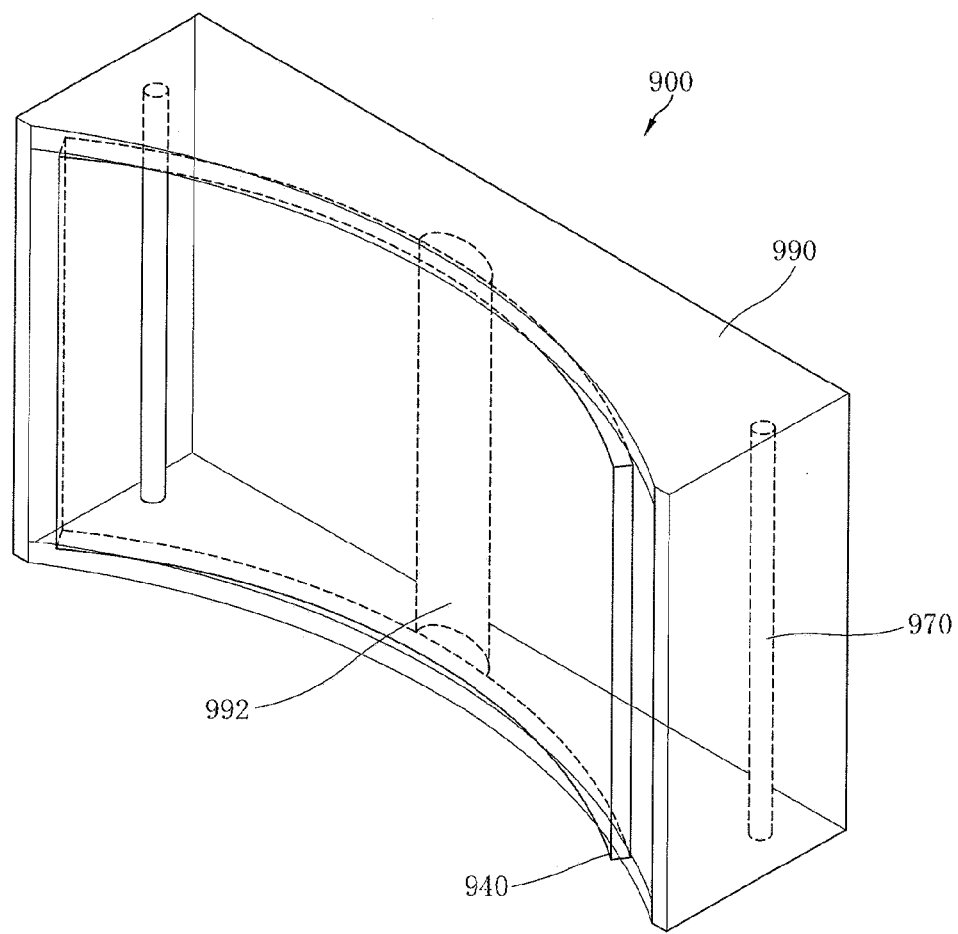
FIG. 75A is a front perspective view of an image display device according to another embodiment of the present invention.
Figure 75B:
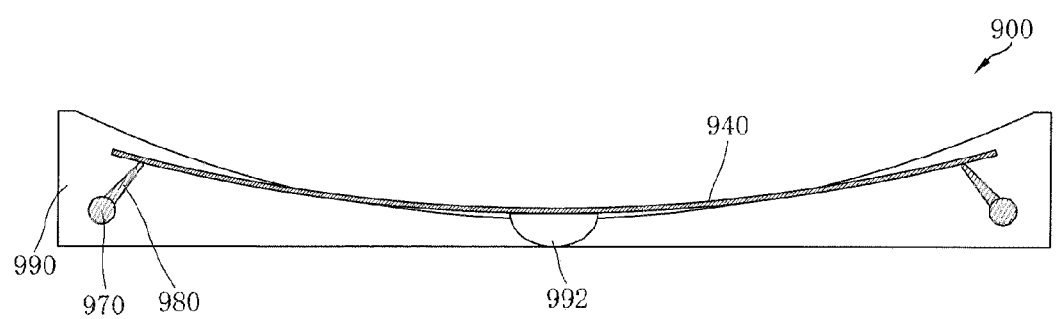
FIG. 75B is a plan view of the image display device shown in FIG. 75A.

FIG. 75A is a front perspective view of an image display device 900 according to an embodiment of the present invention and FIG. 75B is a plan view of the image display device 900.

Whether the mechanism of bending a flexible display unit 940 is visually exposed may not affect the performance of the image display device 900. However, the image display device 900 has been recently developed in such a manner that mechanical elements other than the display unit 940 are not exposed to users. For example, a bezel size is minimized or input buttons are not exposed to users who watch displayed images in front of the image display device 900 by being moved to the rear side of the image display device 900.

To achieve this, the mechanism of bending the flexible display unit 940 according to the present invention is not exposed to the user. To this end, the image display device 900 includes a read cover 990.

The rear cover 990 covers the rear side and both sides of the flexible display unit 940 so as to restrict exposure of a pressure member 980 and poles 970. The rear cover 990 may have the function of the frame 491 illustrated in FIGS. 68A and 68B. According to this structure, it is possible to prevent the mechanism of bending the flexible display unit 940 from being visually exposed not only in a state in which the flexible display unit 940 is flat but also in a state in which the flexible display unit 940 is curved.

A description will be given of another example of preventing the mechanism of bending the flexible display unit 940 from being visually exposed.

Figure 76A:
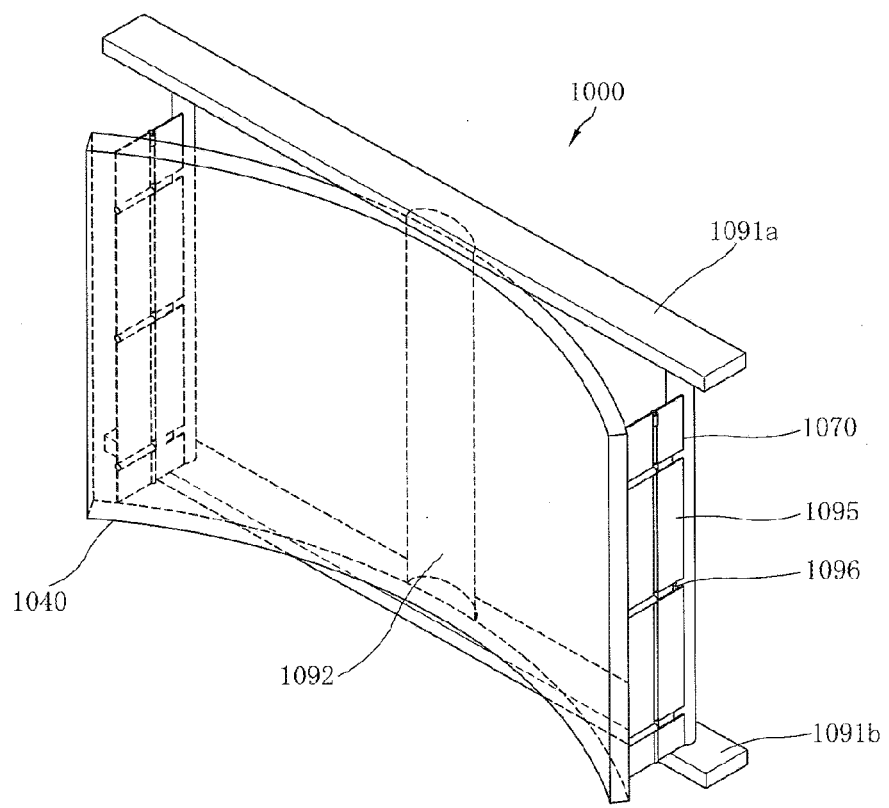
FIG. 76A is a front perspective view of an image display device according to another embodiment of the present invention.

FIG. 76A is a front perspective view of an image display device 1000 according to another embodiment of the present invention.

The image display device 1000 includes shielding screens 1095. The shielding screens 1095 are coupled to a flexible display unit 1040 and poles 1070. While a single shielding screen 1095 may be provided, a plurality of shielding screens 1095 can be formed when the link part 585 illustrated in FIGS. 71, 72A and 72B is provided to a pressure member 1080 in order to prevent interference which may be generated between the link part 585 and the shielding screens 1095. As shown in FIG. 76A, the plurality of shielding screens 1095 may be arranged at intervals. When the link part 585 is inserted between the shielding screens 1095, interference between the shielding screens 1095 and the link part 585 can be prevented. Alternatively, a single shielding screen 1095 may be formed and may have a hole 1096 through which the link part 585 is inserted.

A description will be given of the mechanism of the shielding screens 1095 with reference to FIGS. 76B and 76C.

FIGS. 7B and 7C are plan views illustrating operation of the shielding screens 1095 shown in FIG. 76A.

Figure 76B:
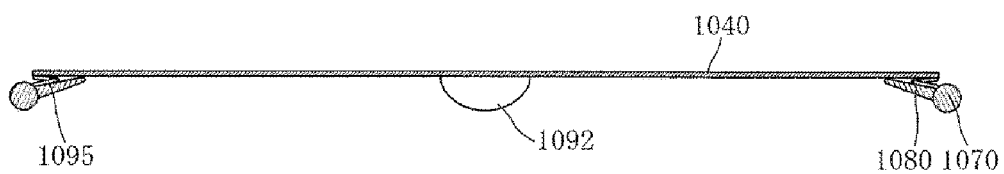
FIGS. 76B and 76C are plan views illustrating operation of a shielding screen shown in FIG. 76A.
Figure 76C:
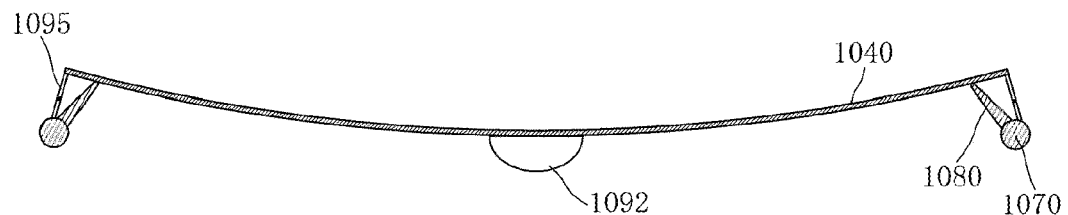

Referring to FIG. 76B, the shielding screens 1095 are folded before the flexible display unit 1040 is curved. Referring to FIG. 76C, the shielding screens 1095 are unfolded so as to cover the flexible display unit 1040 when the flexible display unit 1040 is curved. The shielding screens 1095 can prevent the mechanism of bending the flexible display unit 1040 from being visually exposed.

The mechanism of the shielding screens 1095 is similar to the mechanism of the link part 585 (shown in FIGS. 71, 72B and 72B). Accordingly, the shielding screens 1095 may be coupled to the pressure member 1080 along with the link part 5050 instead of being coupled to the poles 1070. Alternatively, the shielding screens 1095 may be integrated with the link part 585. In a structure in which the shielding screens 1095 is integrated with the link part 585, the shielding screens 1095 and the link part 585 can simultaneously execute functions thereof.

INDUSTRIAL APPLICABILITY

The present invention can improve immersion of a user who views the display device.

The invention claimed is:

1. A display device, comprising:
a display panel;
a module cover positioned behind the display panel;
a housing positioned behind the module cover, the housing including a rear surface facing the module cover;
a motor assembly positioned between the housing and the module cover and installed on the rear surface of the housing;
a body driven by the motor assembly to move linearly along the rear surface of the housing;
a link including a first side pivotally connected to the body and a second side pivotally connected to the module cover; and
a guide positioned between the link and the housing and installed on the rear surface of the housing.

2. The display device of claim 1, further including a lead screw driven by the motor assembly, wherein the body is a sum nut that moves along the lead screw.

3. The display device of claim 2, wherein he link is rotatably coupled with the screw nut and pushed up according to movement of the screw nut.

4. The display device of claim 2, wherein the link includes a protruding part protruded to the side of the link so as to limit a movement distance of the screw nut.

5. The display device of claim 1, wherein the guide includes first to fourth guides, wherein at least one of the first to fourth guides supports the link and guides movement of the link.

6. The display device of claim 5, wherein at least one of the second and third guides is provided with at least one groove supporting the link such that the link slides.

7. The display device of claim 5, wherein at least one of the second and third guides is coupled with at least one guide rail coupled with the screw nut such that the screw nut moves rectilinearly.

8. The display device of claim 1, wherein the second state includes a third state in which the left and right sides of the display panel have different curvatures.

9. The display device of claim 1, further including:
a pinion gear rotated by the Motor assembly; and
a rack gear driven by the pinion gear,
wherein the body is a connector connected to the rack gear.

10. The display device of claim 1, further comprising:
a first bar rotated by the motor assembly; and
a second bar pivotally connected to the first bar, wherein the body is a connector pivotally connected to the second bar.

11. The display device of claim 1, wherein the display panel is an organic light-emitting diode (OLED) panel.

12. The display device of claim 1, wherein the display panel comprises a first state in which the display panel is flat and a second state in which the display panel is curved.

* * * * *